United States Patent
Daniell

(10) Patent No.: US 6,587,276 B2
(45) Date of Patent: Jul. 1, 2003

(54) OPTICAL REPRODUCTION SYSTEM

(75) Inventor: Stephen Daniell, Easthampton, MA (US)

(73) Assignee: Zograph LLC, Northampton, MA (US)

( * ) Notice: Subject to any disclaimer, the term of this patent is extended or adjusted under 35 U.S.C. 154(b) by 87 days.

(21) Appl. No.: 09/811,301

(22) Filed: Mar. 17, 2001

(65) Prior Publication Data

US 2002/0018299 A1 Feb. 14, 2002

Related U.S. Application Data

(60) Provisional application No. 60/255,337, filed on Dec. 13, 2000, and provisional application No. 60/190,449, filed on Mar. 17, 2000.

(51) Int. Cl.⁷ .............................................. G02B 27/10
(52) U.S. Cl. ..................... 359/622; 359/619; 359/620; 359/621; 359/623
(58) Field of Search ................... 359/619, 196, 359/214, 622, 623, 624, 212, 629, 211, 621, 201; 235/454, 462.2, 472.2; 250/208.1, 272.2, 234, 458.1, 556; 356/3.03, 4.03, 505; 382/313, 314; 385/44; 349/148; 463/12; 355/1.67; 358/7.1, 2.1, 496, 406, 296, 494, 401, 451, 483, 474, 487, 484, 482

(56) References Cited

U.S. PATENT DOCUMENTS

| | | | |
|---|---|---|---|
| 2,313,947 A | 3/1943 | Klinkum | 359/454 |
| 3,255,665 A | 6/1966 | Weiher et al. | 359/595 |
| 3,503,315 A | 3/1970 | de Montebello | 396/330 |
| 3,530,779 A | 9/1970 | Alofs | 396/330 |
| 3,544,190 A | 12/1970 | Moorhusen et al. | 359/210 |
| 3,675,553 A | 7/1972 | Dudley | 396/330 |
| 3,683,773 A | 8/1972 | Dudley | 396/330 |
| 3,706,486 A | 12/1972 | de Montebello | 359/619 |
| 3,853,395 A | 12/1974 | Yevick | 353/27 |
| 3,978,500 A | 8/1976 | Brachet | 396/338 |
| 4,094,585 A | 6/1978 | Betensky | 359/708 |
| 4,114,983 A | 9/1978 | Maffitt et al. | 359/580 |

(List continued on next page.)

FOREIGN PATENT DOCUMENTS

| | | |
|---|---|---|
| JP | 2000113489 | 4/2000 |
| WO | 94/11781 | 5/1994 |
| WO | 99/38046 | 7/1999 |

OTHER PUBLICATIONS

Halle, Michael, *Autostereoscopic Displays and Computer Graphics*, Surgical Planning Laboratory, Department of Radiology, Brigham and Women's Hospital, 1997.

(List continued on next page.)

*Primary Examiner*—Jordan M Schwartz
*Assistant Examiner*—Jessica Stultz
(74) *Attorney, Agent, or Firm*—Testa, Hurwitz & Thibeault, LLP

(57) ABSTRACT

A lens system which has a first optical boundary with a radius of curvature R, a second optical boundary located substantially a distance R from the first boundary, and a third optical boundary nearer to the second optical boundary than R. Secondly, a lens system providing optical field limitation using total internal reflection. Also, an array of lenses for reproduction, capture and display of three dimensional images discussed.

19 Claims, 27 Drawing Sheets

U.S. PATENT DOCUMENTS

| | | | |
|---|---|---|---|
| 4,128,324 A | | 12/1978 | Seeger ........................ 396/330 |
| 4,140,370 A | | 2/1979 | Snaper et al. ................ 359/458 |
| 4,168,900 A | * | 9/1979 | Adachi ........................... 355/1 |
| RE30,804 E | | 11/1981 | Lindemann et al. ......... 359/667 |
| 4,425,501 A | | 1/1984 | Stauffer ....................... 250/216 |
| 4,632,522 A | | 12/1986 | Ishitani ........................ 359/432 |
| 4,668,063 A | | 5/1987 | Street ........................... 396/330 |
| 4,708,920 A | | 11/1987 | Orensteen et al. ............ 430/11 |
| 4,732,453 A | | 3/1988 | de Montebello et al. .... 359/619 |
| 4,747,667 A | | 5/1988 | Tanaka et al. ............... 359/621 |
| 4,862,511 A | * | 8/1989 | Peppers et al. ............... 382/32 |
| 4,882,262 A | | 11/1989 | Wilwerding ................. 430/321 |
| 4,955,060 A | * | 9/1990 | Katsuki et al. ................ 382/32 |
| 5,083,199 A | | 1/1992 | Börner ......................... 348/59 |
| 5,166,830 A | | 11/1992 | Ishibai et al. ................ 359/717 |
| 5,278,608 A | | 1/1994 | Taylor et al. .................. 355/22 |
| 5,279,912 A | | 1/1994 | Telfer et al. .................. 430/17 |
| 5,281,301 A | | 1/1994 | Basavanhally ............... 216/24 |
| 5,300,263 A | | 4/1994 | Hoopman et al. ........... 264/2.5 |
| 5,310,623 A | | 5/1994 | Gal ............................. 430/321 |
| 5,333,077 A | * | 7/1994 | Legar et al. ................. 359/619 |
| 5,349,471 A | | 9/1994 | Morris et al. ................ 359/565 |
| 5,373,335 A | | 12/1994 | Street .......................... 396/155 |
| 5,475,536 A | | 12/1995 | Kikutani ..................... 359/794 |
| 5,536,455 A | | 7/1996 | Aoyama et al. ............. 264/1.7 |
| 5,543,966 A | | 8/1996 | Meyers ....................... 359/565 |
| 5,579,164 A | | 11/1996 | Chapnik ...................... 359/618 |
| 5,680,252 A | | 10/1997 | Sitter, Jr. et al. ........... 359/566 |
| 5,717,453 A | | 2/1998 | Wohlstadter ................. 348/46 |
| 5,757,545 A | | 5/1998 | Wu et al. .................... 359/463 |
| 5,933,276 A | | 8/1999 | Magee ........................ 359/455 |
| 5,969,863 A | | 10/1999 | Staub et al. ................. 359/567 |
| 5,978,159 A | | 11/1999 | Kamo ......................... 359/793 |
| 5,995,304 A | | 11/1999 | Nomura et al. ............. 359/726 |
| 6,118,597 A | | 9/2000 | Maruyama ................... 359/743 |
| 6,288,842 B1 | | 9/2001 | Florczak et al. ............ 359/619 |
| 6,324,010 B1 | * | 11/2001 | Bowen et al. ............... 359/622 |

OTHER PUBLICATIONS

Halle, Michael, *Multiple Viewpoint Rendering*, Brigham And Women's Hospital, 1998.

Levoy, M. and Hanrahan, P., *Light Field Rendering*, Stanford University, Proc. ACM SIGGRAPH 1996.

Isaksen, A., McMillan, L., and Gortler, S., *Dynamically Reparameterized Light Fields*, MIT/Harvard University, ACM SIGGRAPH Jan. 2001.

Nakajima, S., Nakamura K., Masamune K., Sakuma I., and Dohi T., *Three–dimensional medical imaging display with computer–generated integral photography*, Computerized Medical Imaging Graphics, 2001; 25(3):235–41.

Naemura, T., and Harashima, H., *Ray–based Approach to Integrated 3–D Visual Communication*, SPIE Critical Reviews CR76, pp. 282–303.

Naemura, T., Yoshida, T., and Harashima, H., *3–D computer graphics based on integral photography*, journal of the Optical Society of America, vol. 8 No. 2, Feb. 2001.

Okano, F., Hoshino H., Arai J., Misuho Y., and Yuyama I., *Integral three–dimensional video system*, SPIE Critical Review CR76, pp. 90–116.

Okano, F., Hoshino H., Arai J., and Yuyama I., *Real–time pickup method for three–dimensional image based on integral photography*, SPIE Critical Review CR76, pp. 90–116.

Min, S., Jung S., Park J., and Lee, B., *Three–dimensional display system based on computer–generated integral photography*, Proceeding of SPIE vol. 4297, pp. 187–195.

Van Nuland, Eric, *Solid State Volumetric Display Projecting 3D Objects in Space*, Proceeding of SPIE vol. 4297, pp. 236–250.

* cited by examiner

TRANSMITTANCE VS. Θ

RELATIVE IRRADIANCE OF FIELD

FIELD OVERLAP PLOT

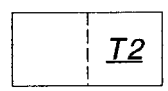 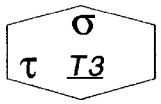 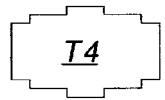 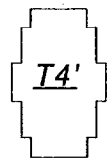
fig. 29A     fig. 29B     fig. 29C     fig. 29D
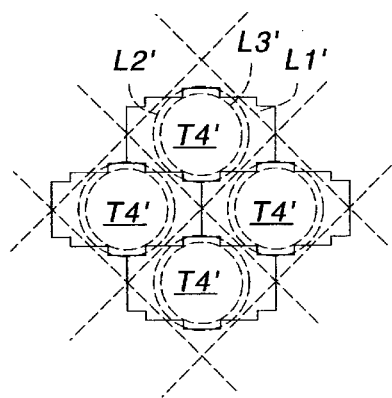 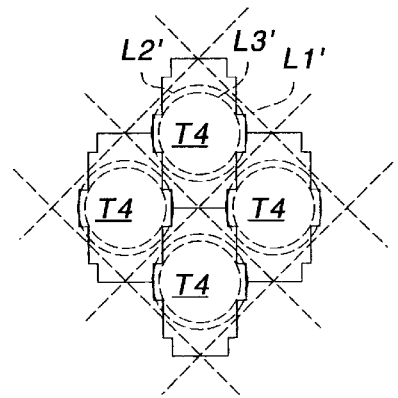 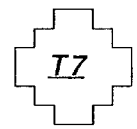
fig. 30A     fig. 30B     fig. 31
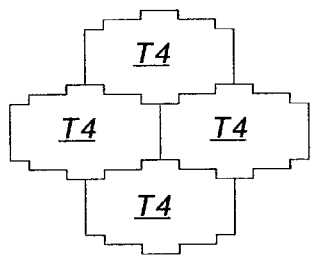 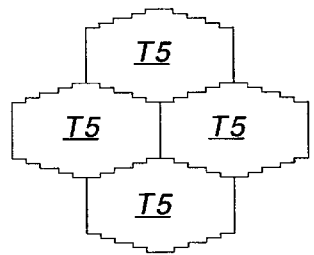 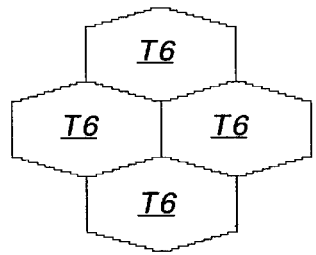
fig. 32A     fig. 32B     fig. 32C

OPTICAL REPRODUCTION SYSTEM

RELATED APPLICATIONS

This application claims priority under 35 U.S.C. §119(e) to U.S. provisional application serial No. 60/190,449 filed Mar. 17, 2000, which is incorporated herein by reference in its entirety, and U.S. provisional patent application serial No. 60/255,337, filed Dec. 13, 2000.

BACKGROUND OF THE INVENTION

Description of the Related Art

Stereoscopic systems provide a viewer with a three-dimensional representation of a scene (or an object), using two or more, two-dimensional representations of the scene. The two-dimensional representations of the scene are taken from slightly different angles. The goal of stereoscopic systems is to produce one or more binocular views of a scene to the viewer. A full-parallax view accurately simulates depth perception irrespective of the viewer's motion, as it would exist when the viewer observes a real scene.

Stereoscopic systems include autostereoscopic systems and non-autosterescoic systems. Non-autostereoscopic systems require a viewer to use a device, such as viewing glasses, to observe the three-dimensional view, while the three-dimensional effect of autostereoscopic systems may be observed by viewing the system directly.

Early stereoscopic devices used prismatic, total internal reflection (TIR) to simultaneously present two views of a scene, such as the Swan Cube. Prismatic TIR allowed the views to be presented to the viewer such that each of the viewer's eyes was presented one of the two images, thus creating a perception of depth. Prismatic devices simulate depth perception for only a single viewing angle.

After the introduction of transparent plastic optics, autostereoscopic devices using one-dimensional arrays of cylindrical lenses (known as lenticular lenses) were created. A lenticular lens array has an associated array of composite strip images. Each lenticular lens presents the viewer a selected portion of its strip image such that the combined presentation of all of the lenticular lenses presents a three-dimensional view of the scene.

Devices using lenticular lenses have several shortcomings. First, because the lenticular lenses are cylindrical (i.e., they have optical power in a single dimension), they produce parallax only on a horizontal viewing axis. If the viewer's viewing angle departs from the horizontal viewing axis, the three-dimensional representation ceases to exist. Second, the lenticular lenses are highly astigmatic, and therefore, the viewer cannot bring the three-dimensional representation fully into focus. Third, if the two-dimensional images require illumination through the lenticular arrays (i.e., the images are not self-radiant, or the images are not printed on a transparent or translucent material that is capable of backlighting), the three-dimensional presentation will have uneven radiance resulting from uneven distribution within the array.

Another autostereoscopic system uses an array of spherical (or aspherical) lenses. Spherical lens array systems have an associated two-dimensional array of microimages. Each microimage is a two-dimensional view of a scene, captured from a slightly different angle. Unlike lenticular lenses, spherical lenses have optical power in two dimensions, thus allowing the viewer to maintain a three-dimensional representation of a scene despite departing from the horizontal viewing axis.

Each spherical lens presents the viewer a selected portion of a corresponding microimage such that the combined presentation of all of the spherical lenses presents a three-dimensional view of a scene. An advantage of spherical (or aspherical) arrays of lenses is their ability to capture arrays of microimages for use with three-dimensional viewing systems. The process of capturing arrays of microimages is known as integral imaging. An image captured by a spherical lens array is initially pseudoscopic, but may be made orthoscopic by reproduction of a captured image using a second array.

The shortcomings of spherical arrays have included that lenses in a lens arrays have excessive aberrations and a tendency to transmit light from multiple microimages. Both of these shortcomings have resulted in reduced image quality.

A difficulty encountered in capturing and reproducing images is optical crosstalk between lens systems of the array. Crosstalk causes overlap of adjacent images, resulting in degradation of the microimages. Solutions to crosstalk have ranged from modifications of the scene when creating the microimages, to optomechanical modifications of the lens arrays. Optomechanical modifications of the lens arrays have included baffles that limit the field of the lens systems comprising a lens array. The baffled lens systems are said to be field-limited. And a field-limited system whose field does not overlap the field of adjacent lens systems is said to be "isolated." Solutions to crosstalk have been costly to implement.

SUMMARY OF THE INVENTION

In general, it has been found that the above recited optical goals may be achieved by the use of two arrays, the two arrays typically including three active optical boundaries and a planar surface disposed at the focal length of the array. In the invention, a first boundary is convex and substantially spherical, a second boundary is concave and usually oblate, and a third boundary is prolate and predominantly convex. The internal surfaces of the second and third optical boundaries may, in some embodiments, also be employed as efficient angle-selective reflectors. In preferred embodiments of the invention, the two array layers are joined using bonding agents of specific optical characteristics. The two preferred compositions are 1) a light-absorbing bonding agent, and 2) a low-index UV-curing fluoropolymer. Two embodiments of the microlens may be conceived of as roughly analogous to, in the first case, an aspheric doublet with an internal aperture, and in the second case, an aspheric cemented triplet.

The invention includes arrays in which the outer spherical lens surfaces are imbricated, i.e. having a polygonal aspect when viewed on-axis, as well as embodiments in which the convex outer lens surfaces are formed as independent features on a continuous planar background, as suits their application. Other specific embodiments will be understood by way of the following figures and description.

The improvement of the array optics generally relies on a low-index region of highly aspheric geometry located within an array of higher-index optical material, such as acrylic, polycarbonate or polyetherimide. The region is typically created by permanently bonding two discrete arrays such that the low-index material is entrapped between the bonded arrays. Each microlens cell therefore has three significant optical boundaries, and a continuous planar rear surface. The general family of geometries illustrated in this document have been found to greatly reduce spherical aberration, while also eliminating the preponderance of field curvature. Because the performance of these arrays is not implicitly degraded at short focal lengths, a continuous, full-parallax image field of 60° or more can be attained.

The arrays generally fall into two categories. The first type of array uses air as the low-index material. The distinctive equiangular geometry of these arrays allows the optical pathway to be confined to a central angular zone; because of this ability to restrict light, these arrays will be referred to as field-limited arrays. This type of array may be used, for example, in illuminated displays electronic image detection, machine vision, and real-time 3D video capture. A second type of array uses a fluoropolymer as the low-index material, and conveys a great preponderance all incident light to the image plane. These arrays are referred to as open-field arrays, and may be used to produce high-brightness images for viewing under arbitrary ambient illumination, or for imaging lenses with increased optical gain or reduced lens flare.

By exploiting TIR, the field-limited arrays can be fashioned to eliminate image overlap and confine the converged real microimages to the region of the focal plane immediately associated with their respective microlenses. This light restriction on acceptance allows a set of coplanar microimages to be captured without significant overlap. The array may be used to eliminate the formation of parasitic latent images in an emulsion system, or to prevent analogous optoelectronic noise in photoelectric capture devices.

Additionally, during the transmission of light from a the graphic surface of a field-limited master image to a duplicate, TIR can again be exploited to restrict light production from the master to the same angular range. This light restriction on emission from the array allows printed, developed, or electronically produced images to be optically conveyed through a second array for electronic, electrostatic, or photographic reproduction.

Because both the ingress and egress of light is restricted by the originating field-limited array, an open-field array can be used as the recipient material. The recipient material therefore needs no intrinsic light-restricting processes of its own, which would inevitably tend to reduce the brightness of a passively lit image. Pseudoscopy is inherently rectified by this reproduction process. Bright, highly realistic duplicate images may therefore be reproduced by face-to-face contact printing, ideally with the microlenses in alignment. By logical extension, it may be understood that a preexisting spherical-lens image, of either the field-limited or open-field type, may be reimaged or recorded by a properly arranged field-limited capture device.

An advantage of the invention is that a superior effect can be obtained using readily available optical materials and existing graphic media. The designs shown are based on the use of thermoplastic polycarbonate ($\eta=1.586$) for the two component arrays, and either air or a low-index ($\eta=1.360$) UV-curing fluoropolymer for the enclosed low-index zones. A modified hexagonal microimage layout which reconciles the hexagonal geometry with digital processes. Following is an outline of general issues that may influence microlens designs formed according to the invention.

Full-parallax Imaging: Although the basic sectional optical geometry may be applied equally to cylindrical-lens arrays, the invention is particularly suited to "global" imaging, i.e., systems using radially symmetrical microlenses; a distinguishing characteristic of global imaging systems is that they can reproduce parallax on all axes, rather than on the horizontal axis only. Radially-symmetrical elements would also avoid certain aberrations intrinsic to the asymmetrical geometry of cylindrical arrays. Radially-symmetrical systems can more directly capture and reproduce three-dimensional image data. Full-parallax images can include an animation on the vertical axis without introducing binocular error. Wireframe geometries are also more readily and accurately extracted from and reproduced to full-parallax image sets.

Aperture Stops: The ideal aperture-stop location in field-limited arrays is informed by the scale of the microlenses, the mode of their use, and the simulated distance of objects in the scene. In directly-viewed displays, the second refractive surface is generally stopped. In arrays used as masters, the first surface will generally be stopped if the goal is a 1:1 mapping of every graphic element. This ensures that there will be no information shared by adjoining lens cells. When an inner stop is used in a mastering process, information from each master lens will be shared by more than one cell in the duplicate array. Prior to assembly of the field-limited arrays, light-blocking material can be applied to raised areas of the internal surfaces, without risking contamination of the optical surfaces. Total internal reflection and light-absorbing material at the lens interstices than act cooperatively as a comprehensive field-stop.

Total Internal Reflection: TIR is a prominent consideration in diverse processes in the system. The convergent and field-flattening requirements of the design leave few further degrees of freedom in the configuration of the core optics. However, in field-limited arrays, where the entrapped low-index material is air, an important coincident effect arises due to the novel concave geometries of the internal boundaries: each of the two internal optical surfaces is, independently, in a highly equiangular relationship with significant ray sets at critical locations. The arrays therefore restrict light arriving on or emerging from the array to substantially the same central angular field; light beyond that field is deflected by TIR. The nearly equiangular relationship causes the optical pathway to be abruptly cut off at a predetermined angle of incidence, with the normally transparent optical boundary itself essentially acting as a field-stop.

Because total reflection occurs almost simultaneously across the surfaces, an intensity plot taken across a test microimage converged from an image field contrived to have a continuous luminosity will closely conform to standard transmittance curves. Accordingly, a plotting of the irradiance of microimages captured in this manner is therefore substantially flat over about 65% of the absolute diameter of the converged image, dropping off abruptly thereafter.

The restriction of light entering the array largely prevents the overlap of microimages, permitting a continuous detector field to be employed without internal barriers between the individual lens cells. The restriction of light exiting the array to a closely matched angular field creates a reciprocal optical pipeline of virtually identical operational characteristics. In field-limited arrays, extraneous light bypassing the core optics and falling into the lens interstices would typically be blocked by light-absorbing cement at the arrays' internal contact surfaces.

Some light emanating from the image field is recaptured and returned, via TIR, to the rear surface. Other effects that may exploit partial or total reflection include internal diffusion via prismatic surface reflection, and, in backlit, field-limited displays, the veiling of the image beyond the central viewing zone.

Vergence Angles: The eye adapts to focus objects at various distances. The small angle formed by a vertex on the subject and points on the rim of the pupil is the vergence angle. The lenses may be designed to conform to this geometry so that the pupil is filled at he target viewing distance. This geometry varies according to light conditions as well as distance. Two solutions can generally be found that accurately fill the eye at a given distance from the image, one ahead of the image plane and one behind.

Transmission of Internal Illumination: In images intended to be viewed in under ambient illumination, it is desirable to minimize internal reflection and maximize transmission at the second surface, since an acceptable brightness level in the observed image depends on the very stray light which is reflected away in field-limited arrays. The open-field arrays, which use fluoropolymer as a low-index material, have a geometry that is analogous to that of field-limited arrays, and which provides a similar corrective effect. In contrast, however, the open-field arrays designs permit a great preponderance of incident ambient light to be transmitted to the image plane. Surface reflections at air/polymer boundaries can cause haziness in the viewed image, especially when the image is lit by ambient light. The reduced effective refractive index at the air/fluoropolymer boundaries greatly diminishes any such haziness.

Diffusion of Internal Illumination: Interstitial regions are the zones between between the active lens surfaces. Because the active area of the internal lens surfaces is considerably less than the hemispheric diameter of the outer lenses, the extent of internal lens interstices can be considerable, even when the fill rate of the outer array approaches 100%.

Images viewed in reflection, i.e., like conventional printed images and photographs, depend on a wash of ambient light over the surface of the graphic material for even illumination. The refractive nature of arrays therefore significantly alters the illumination characteristics of the graphic plane. The convergent nature of refractive arrays of course persists, even when the array is only used for viewing; the core optics of the array converges incident light, arriving from the ambient scene in which the viewer is located, into inverted real microimages that superimpose themselves on the upright graphic microimages.

Light arriving this central zone is therefore of diminished utility, since the observers sight-lines will by definition be aligned with the inverted image his or her own eyes, and not therefore with any bright ambient-scene light source imaged by the microlens. An emulation of the wash of light experienced in a conventional image can only be provided by light passing through lens interstices from coordinates in the ambient field outside the the highly focal central angular zone.

The design goals of the core optics and of the interstitial optics are therefore substantially opposite: ideally, light that traverses the array via the core optics should be perfectly convergent at the image plane, and light that passes through the interstices should be perfectly diffused.

Hybrid Achromatization: Another incidental benefit of the corrected designs is that, within each of the arrays described, a surface is located with its vertex in the vicinity of the center of curvature of the outer optical boundary. This allows the effective use of diffractive achromatization, which is traditionally precluded in such wide-angle arrays, due to decentration of the corrective effect. The inclusion of a corrective hybrid surface would improve the focal acuity of the array, reduce its thickness, and would slightly enhance the angular restriction outlined above. Knife-edge features would be carried internally and would thus be protected from degradation.

Antireflective Microstructures: Performance would be further optimized and economized by the use of hybrid refractive/diffractive surfaces and anti-reflective "moth-eye" microstructures. In production, AR relief structures would typically be more cost-effective than coating, and would improve the saturation and contrast of the observed image. The enclosed internal optical surfaces could use high aspect-ratio subwavelength AR microstructures which might be subject to degradation if formed on an external surface. The outer array surface might be formed with a similar but more robust AR microstructure topology.

Techniques for producing an index gradient in polymers are well-known, and graded internal boundaries would increase transmission of ambient light to the graphic image plane in open-field arrays. Because most display applications require cost-effective replication in high volumes, however, AR microstructures would commonly provide a cost-effective emulation.

Image Reproduction: Conventional direct reproduction processes would commonly be employed. However, the improved optics suggests the potential of alternate methods.

The field-limited array possesses the optical characteristics necessary for capturing or reproducing an image with a restricted angular field; the fluoropolymer-filled array provides an array with excellent viewing qualities. An implication of this pairing is that, given two arrays of sufficient acuity, light may be passed from a pseudoscopic master to a duplicate, intrinsically rectifying the pseudoscopic spatial inversion in the process. This technique may provide new opportunities for image correction and for high-volume, high resolution image reproduction. Photographic 3D images can, by this process, be reproduced at industrial rates in a manner analogous to conventional contact prints. Registration requirements can be relaxed due to the intrinsic angular identity of the graphic elements.

Although the lower limit of the lens size is practically limited by diffraction, this process could also, on a certain scale, be used to directly capture and seamlessly reproduce the 3D attributes of a real scene. More commonly, images would be digitally processed and mastered using microlens arrays which would be so fine as to be impractical for direct capture.

Array Assembly: In addition to the diffusers, the interstitial zones normally include mating relief features to promote alignment and adhesion. The draft angle of the contact surfaces would cause the two arrays to self-align. The mating features would also ensure that the microlenses were accurately aligned and seated, and could eliminate the need to monitor calibration of the arrays during continuous production. Volumes defined by surface features may be used to precisely meter adhesives and other fluid materials, such as the fluoropolymer used in open-field arrays.

Microimage Layout: A hexagonal lens layout allows microimages of various proportions to be efficiently tiled (i.e. with interfitting contours); on the focal plane. The horizontal range can be extended using an irregular microimage profile so that a bias is given to the horizontal axis. The bias is sufficient to accommodate the added dimension demanded by binocular vision, without reduction of the vertical range. A hexagon is used which, having been derived from a square, rectifies a hexagonal layout with orthogonal digital rasterizations.

Image Processing: Images mastered by a film recorder can computationally compensate for angular reflection losses at the image perimeter. The white-point of the microimages may be set lower at the center of the microimage than it is at its perimeter, so that during reproduction to a second array the relative irradiation distribution of the illuminated images varies in a radial manner and in inverse proportion to the calculated total system losses between the master microimage plane and the eventual viewer. Compensated losses could be due to reflection, absorption, vignetting, or to inconsistency of source illumination; all these effects would generally tend to be expressed at more oblique angles of incidence, so computational or physical filters would reduce transmission in the axial zones of the microimages in a continuous gradient from the center point of the microimage.

Image processing can be integrated on-board a CMOS detector before digital image data is written to a storage device, or may be implemented after recording. Pseudoscopy might electively be corrected on-the-fly during image capture. Digital filtering can also equalize image intensity, contrast, and color attributes and can detect and eliminate artifacts from remaining microimage overlap. These processes can increase the useful area of a detector, whether emulsion-based or electronic.

The invention therefore includes diverse embodiments derived from the structures and processes generally noted above.

A first embodiment of the invention therefore results from an understanding that, in a positive lens having a convex spherical front surface, in which the thickness of the lens approaches or surpasses the radius of curvature of the lens, a second surface may be devised so that, for each ray converged by the first surface from a collimated incident ray set, and for a particular predetermined incident angle of light impinging on the first surface, the convergent cone of rays can be made to arrive on the second surface so that the critical angle is encountered virtually simultaneously by all rays in the convergent set. Light transmitted and converged by the first convex spherical surface from beyond a certain incident angle, typically near the critical angle of the optical material, is wholly prevented from passing through the second surface, and instead reflected away by total internal reflection. In contrast, rays convergent about the optic axis are nearly normal to the second surface, and therefore pass with only a small percentage of their light reflected. As a result, the image field is confined to a radius on the image plane directly associated with the refractive index of the material, and the light distribution across the image field closely parallels the transmittance curves for the refractive medium. In general, radially symmetrical surfaces for the second surface that approximate the ideal equiangular state will be negative in curvature, oblate, and located in the vicinity of the center of curvature of the primary convex spherical surface. Solutions for the third surface are all predominantly positive in curvature, but the curves specified are idiosyncratic according to the problem. This surface may therefore be oblate, spherical, or prolate, or reflexed according to the demands of the individual system.

A second embodiment of the invention is derived from an understanding that the surface curvature implied by the first embodiment may be coincidentally employed to correct spherical aberration.

A third embodiment of the invention stems from an understanding that the absolute perimeter of the image field can be further reduced by including a third refractive surface which is predominantly positive in refractive power, A fourth embodiment of the invention stems from an understanding that if that third refractive surface is located at a specific distance from the second refractive surface, a substantially flat focal field will result.

A fifth embodiment of the invention stems from an understanding that if that third refractive surface is additionally substantially prolate in geometry, spherical aberration may also be effectively corrected across the image field.

A sixth embodiment of the invention stems from an understanding that if the region between the second and third optical surfaces contains a material having a refractive index near 1, that light both received by and reproduced from the array may be confined to substantially the same central angular range.

A seventh embodiment of the invention depends on a recognition that in microlens images viewed in reflection, e.g. a print or photograph, apparent image brightness depends in large part on the angular composition of the light arriving on each microimage plane from adjacent cells, rather than via the lens cell associated with the immediate region of the graphic surface. Therefore, internal interstices may be expressly made transparent and diffuisive in reflective devices to optimize internal distribution available illumination.

An eighth embodiment of the invention stems from an understanding that if the region between the second and third optical boundaries contains an optically transparent material having a refractive index greater than 1, but substantially less than that of the primary array material, and especially if the second refractive surface is located with its vertex in the vicinity of the center-of-curvature of the primary spherical lens, that the system may be provided with a correction for field curvature and spherical aberration, while at the same time maximizing the transmission of ambient light to the image plane by deterring losses by partial or total reflection at the second refractive surface.

A ninth embodiment includes a positive power diffractive element on one of the internal surfaces, so that the system may be achromatized, so that the system's converging power and viewing range may be increased, and so that the diameter of the systems image fields may be electively minimized.

A tenth embodiment of the invention includes mating relief elements which assist in the alignment and spacing of the optical surfaces.

An eleventh embodiment is directed at the optical reproduction of an original planar image to a second planar image surface, and generally relies on the conjoint operation of two of the bonded arrays, i.e. four arrays total, of similar pitch, having their lenticulated sides facing and in registration. It is understood that this may be implemented as a linear scanning device or as a flatbed reimaging device for conventional two-dimensional media. It is also understood that the one of the bonded arrays may be permanently affixed to the two-dimensional graphic material of the original planar image, whereby an illusionistic three-dimensional image may also be provided with a means by which it may be electronically reimaged for storage, manipulation, or duplication.

A twelfth embodiment describes a microlens devised for use as a surface-mount imaging lens wherein the optics may be entirely composed of transparent material, and wherein a wide-angle, high-acuity image-forming and mounting system may be provided with as few as two individual parts.

A reproduction system in accordance with the invention comprises a first array of lenses comprising a first plurality of lens systems, the first array of lenses having a object plane, each of the first plurality of lens systems having an optical axis, and a second array of lenses comprising a second plurality of lenses, the second array of lenses having an image plane, each of the second plurality of lenses having an optical axis, the second array of lenses optically coupled to one lens system of the first array of lenses. The at least one lens system of the lens systems of the first plurality of lenses, or one lens systems of the second plurality of lenses, is an optically field-limited surface for one of the image plane and the object plane.

A microimage capture system in accordance with the invention for capturing a plurality of microimages of an object comprises a photosensitive medium, and a lens array optically coupled to the photosensitive medium. The lens system comprises a first convex surface having a radius of curvature R, and a first concave surface optically coupled to the first convex surface via a first material, the first concave surface positioned a distance substantially equal to R from the first convex surface. The microimage system further comprises a second convex surface optically coupled to the first concave surface via a material having a lower index of refraction than the first material, the second convex surface positioned at least a distance equal to 0.05R from the first concave surface.

A three-dimensional viewing system for producing a three dimensional representation, comprising a plurality of microimages and a lens array, optically coupled to the plurality of microimages. The lens array comprising a first convex surface having a radius of curvature R, a first concave surface optically coupled to the first convex surface via a first material, the first concave surface positioned a distance substantially equal to R from the first convex surface, and a second convex surface optically coupled to the first concave surface via a material having a lower index of refraction than the first material, the second convex surface positioned at least a distance equal to 0.05R from the first concave surface.

An optical system in accordance with the invention comprises a lens system, and a photic element optically coupled to the lens system. The photic element comprises a first area symmetric about a first axis, having a dimension X along the first axis, and a dimension Y along a second axis, and a second area contiguous with the first area and symmetric about the second axis having a dimension A along the first axis and a dimension B along the second axis. The dimension A is smaller than dimension X.

BRIEF DESCRIPTION OF THE DRAWINGS

Preferred, non-limiting embodiments of the present invention will be described by way of example with reference to the accompanying drawings, in which:

FIG. 29A shows an rectangular microimage tiling for an array having a canted square first-surface imbrication, having a 2:1 aspect ratio;

FIG. 29B shows a hexagonal tiling derived from the 2:1 rectangle of FIG. 29A;

FIG. 29C is a plan view of a first orientation of a stepped rectangular microimage;

FIG. 29D is a plan view of a second orientation of a stepped rectangular microimage;

FIG. 30A is schematic top view of a first orientation of a stepped rectangular microimage and canted square lens array, showing how the tiling of FIG. 29A may be arranged in a vertical orientation without altering the orientation of the diagonal array;

FIG. 30B is schematic top view of a second orientation of a stepped rectangular microimage and canted square lens array, showing how the tiling of FIG. 29B may be arranged in a horizontal orientation without altering the orientation of the diagonal array;

FIG. 31 is a plan view of a stepped cruciform tiling having a biaxial bias which will tile in an equal manner in either orientation;

FIG. 32A is a plan view of a coarsely stepped rectangular tiling of microimages having a horizontal axial bias;

FIG. 32B is a plan view of a moderately stepped rectangular tiling of microimages having a horizontal axial bias;

FIG. 32C is a plan view of a finely stepped rectangular tiling of microimages having a horizontal axial bias;

DETAILED DESCRIPTION OF THE INVENTION

Throughout the description below, features having common numbers have common function.

Figure 1A:
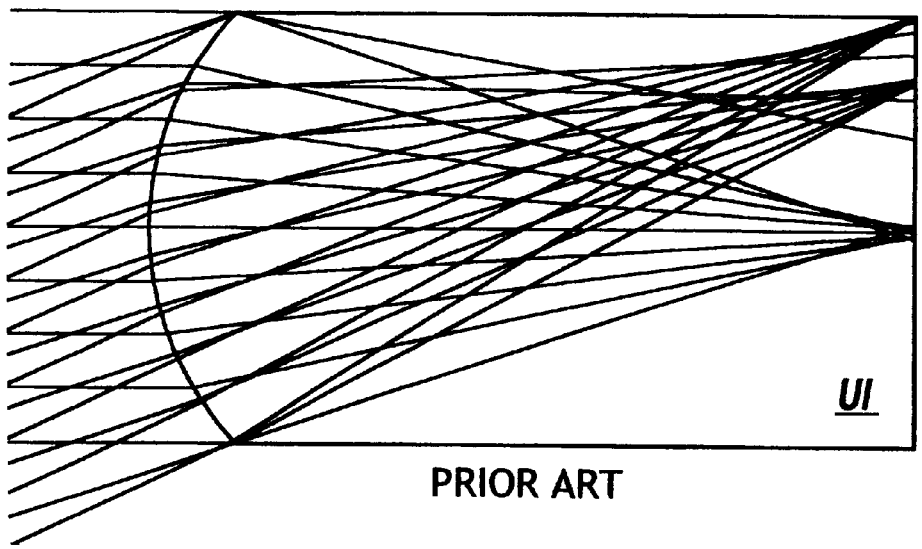
FIG. 1A illustrates aberration in uncorrected arrays.
Figure 1B:
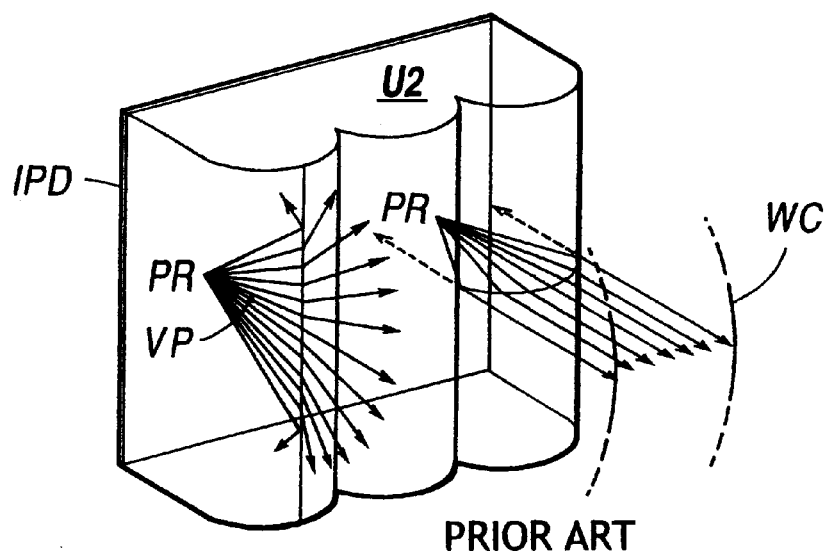
FIG. 1B illustrates aberration in a lenticular array.

The invention includes features that can reduce aberrations in lens arrays. FIGS. 1A and 1B are cross sectional side views of a lens element that illustrate aberration in uncorrected lens systems. In uncorrected element U1 in FIG. 1A, the defect of focus is predominantly due to spherical aberration. Marginal rays converge at a shorter focus than rays entering near the axis of the lens. In uncorrected element U2 in FIG. 1B, it may be seen that, in cylindrical lens elements, the defect of focus is further compounded by astigmatism. A graphic element on display image plane IPD of U2 may be imagined as radiating point PR emitting in all directions. A ray trace on the longitudinal axis of a cylindrical lens, as shown at the left of FIG. 1B produces a different geometry from that on the transverse axis, shown on the right. The combined geometries produce astigmatic cylindrical wavefront CW. Systems within the invention propose the use of rotationally-symmetrical microlens arrays, which are inherently free of astigmatism, and which include aspheric surfaces that can significantly reduce the remaining defects of focus.

A lens system according to the present invention can be designed to operate as a focal or an afocal system depending on the application of the system. Afocal systems include both infinite and virtual object planes. FIG. 2A–FIG. 2D are schematic drawings of various focal situations appropriate for use with the present invention.

Figure 2A:
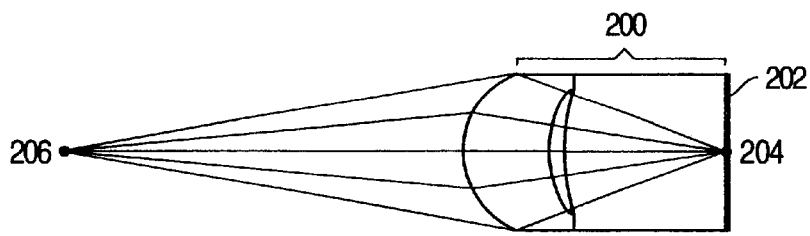
FIG. 2A–FIG. 2D are schematic diagrams of embodiments of a lens systems illustrating focal situations appropriate for use with the present invention.

FIG. 2A is a cross sectional view of a lens system 200 according to the present invention. Lens system 200 has an image plane 202. Image point 204 is located on image plane 202. Lens system 200 is a focal system and converges light from image point 204 to a finite object point 206. Field limited lens systems having a finite object point 206 are useful in devices such as telecommunication devices, or reproduction systems as described below.

Figure 2B:
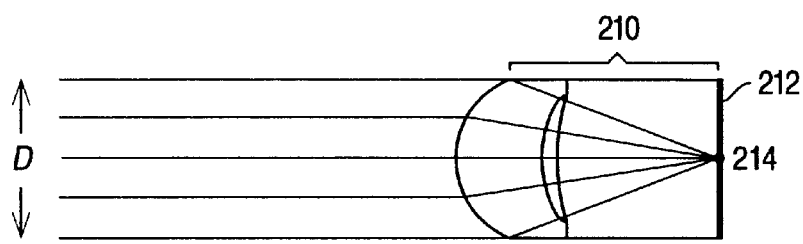

FIG. 2B is a cross sectional view of a lens system 210 according to the present system. Lens system 210 has an image plane 212. Image point 214 is located on image plane 212. Lens system 210 is an afocal system and focuses light from image point 214 to an infinite object plane. A lens system having an infinite object plane can be useful in devices to be viewed by a human being, or in optical communications. However, when viewing an array of collimating lens systems having an outer surface dimension smaller than the viewer's pupil diameter D, the viewer's pupil may be underfilled allowing surrounding sources of light such as adjacent collimated lens systems to degrade the viewer's ability to focus the output of lens 210. Diameter D is referred to as the pupillary diameter.

Figure 2C:
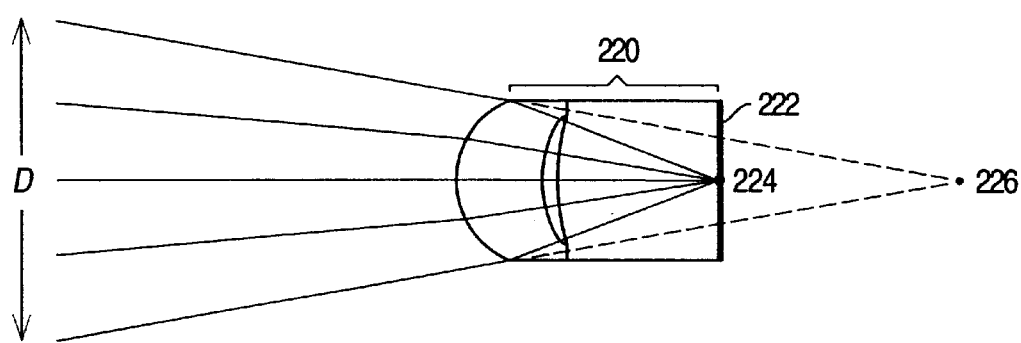

FIG. 2C is a cross sectional view of a lens system 220 according to the present invention. Lens system 220 has an image plane 222. Image point 224 is located on image plane 222. Lens system 220 is an afocal system, which diverges light from image point 224 to form a virtual image point 226. A viewer receiving light from lens system 220 would observe a point appearing to originate behind lens system 220.

Lens systems having a virtual object point are useful in devices designed for viewing by a human being. In particular, in lens systems having an outer surface dimension smaller than the pupillary diameter D, the lens system can be designed to fill a viewer's pupil. In a system to be viewed by a human being, pupillary diameter D is preferably approximately equal to the diameter of the pupil of the human eye, at an anticipated viewing distance S.

Figure 2D:
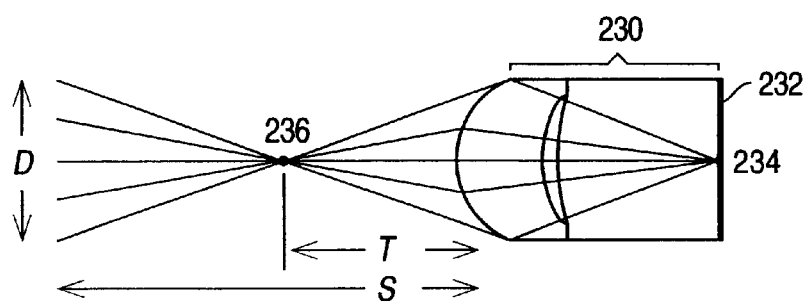

FIG. 2D is a cross sectional view of a lens system 230 according to the present invention. Lens system 230 has an image plane 232. Image point 234 is located on image plane 232. Lens system 230 is a focal system and converges light from image point 234 to form a finite object point 236. A viewer receiving light from lens system 230 would observe a point appearing to originate in front of lens system 220.

Object point 236 is located a distance T from lens system 230. Lens system 230 is designed to be viewed by an viewer at a distance S from lens system 230, where S is greater than T, such that the light would fill the viewer's pupil at distance S. A viewer observing lens system 230 would receive a image appearing to originate in front of lens system 230.

Features described with reference to FIG. 2D-FIG 2D will be applied to array systems of the present invention to improve the quality of systems to be viewed by a human being.

Throughout the specification the following definitions will apply. The phrases "object plane" and "image plane" refer to conjugate planes of a lens system or an array of lens systems. However, the terms "object" and "image" are non-limiting, and image planes and object planes can be photo-emitting, photo-detective, both, or neither, depending on the specific application of a lens system. The phrase "object point" refers to points on either a finite or infinite object plane of a lens system. The phrase "image point" refers to a point on an image plane of a lens system.

Figure 3A:
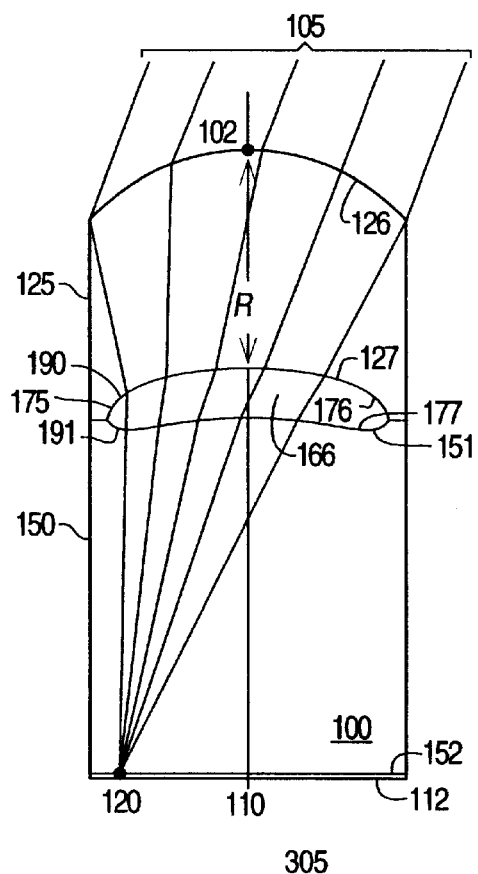
FIG. 3A is a cross sectional side view of one example of an embodiment of a three-element lens system according to the present invention.

FIG. 3A is a cross sectional side view of one example of an embodiment of a high acuity three-element lens system 100 according to the present invention. Lens system 100 has an optical axis 110, and an image plane 112. Rays of light 105 correspond to an object point and an image point 120. Lens 100 includes a first lens 125, a second lens 150, and a region 166 between lens 125 and lens 150.

Lens system 100 is any multielement optical system, which includes a first lens 125, a second lens 150, and a region 166 between lens 125 and lens 150, wherein region 166 is a low index material, other than air. Region 166 forms a third lens 175 between first lens 125 and second lens 150. A first surface 176 and a second surface 177 of the third lens 175 are defined by the first lens 125 and second lens 150.

First lens 125 has a first surface 126, a second surface 127, and is constructed of a material having a relatively high index of refraction. Second lens 150 has a first surface 151, a second surface 152 and is constructed of any material having a relatively high index of refraction.

First lens 125 and second lens 150 can be constructed of any material having a relatively high index of refraction, is optically transparent (at optical or infrared wavelengths), and is configurable into an optical lens element. The index of refraction is approximately equal to 1.6. Polycarbonate, styrene, polyamides, polysulfones, optical glasses, or infrared-transmitting materials such as germanium are examples of materials appropriate for constructing lenses 125 and 150. It is understood that other materials having a relatively high index of refraction can be used.

Third lens 175 occupying region 166 can be constructed of any material having an index of refraction lower than first lens 125 and second lens 150, e.g., between 1.29 and 1.42. Examples of materials appropriate for constructing third lens 175 are low-index fluouropolymers, optical fluids, gels, ceramics, optical foams, slurries, and compounds. One specific example of an optical foam is Sol-Gel. It is understood that other materials having a relatively low index of refraction can be used.

Three-element lens system 100 has three optical boundaries that have non-zero optical power, first surface 126, second boundary 190, and third boundary 191. First surface 126 has a first vertex 102 and a radius of curvature R. First surface 126 is any optical boundary having positive power and a convex surface.

Second boundary 190 is at the interface of second surface 127 of first lens 125 and the first surface 176 of the third optical lens 175. Second boundary 190 is any optical boundary having a negative power such that second surface 127 of first lens 125 has a concave curvature. Second surface 127 of first lens 125 has an oblate, concave curvature. Second boundary 190 is located substantially a distance R from first surface 126. Second boundary 190 can be located between 0.7 R and 1.4 R away from first vertex 102.

Third boundary 191 is the interface of first surface 151 of second lens 150, and the second surface 177 of the third lens 175. Third boundary 191 is any optical boundary having a positive power such that first surface 151 of second lens 150 is a prolate or reflexed, convex surface. For purposes of this disclosure the term "reflexed" shall mean a boundary having regions of locally convex curvature and regions of locally concave curvature. Second boundary 191 is located at least 0.05 R from first boundary 190 at optical axis 110.

Fourth surface 152 is an optical boundary. Fourth surface 152 is any optical boundary having a continuous surface and zero optical power. Preferably, fourth surface 152 is a continuous surface, having zero optical power disposed at the image plane 112 of lens system 100.

Optionally, lens system 100 may include one or more surfaces having coatings for antireflection, antiabrasion or heat resistance purposes. As an alternative or a complement to antireflection coatings, a sub-wavelength microstructure may be used to reduce reflections. Sub-wavelength microstructures may be produced during the molding process if lenses are produced using a molding process. Additionally, any lens surface may be a hybrid refractive/diffractive surface, for reasons such as to reduce chromatic aberrations.

Figure 3B:
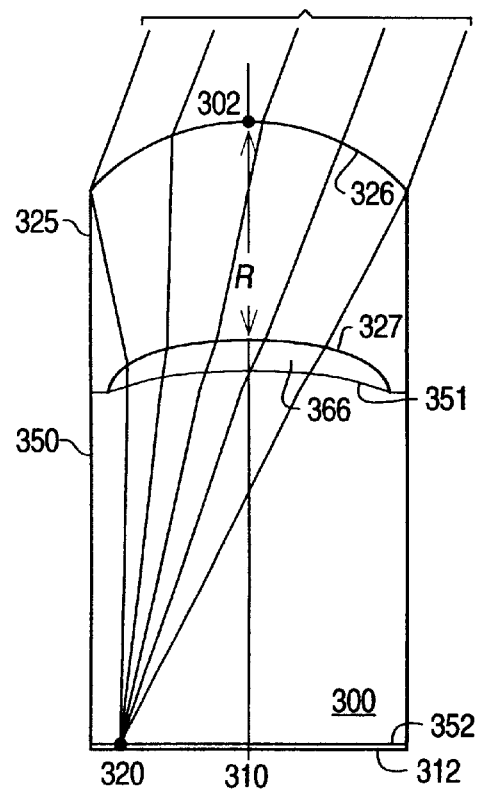
FIG. 3B is a cross sectional side view of one example of an embodiment of a two-element lens system according to the present invention.

FIG. 3B is a cross sectional side view of one example of an embodiment of a two-element lens system 300 according to the present invention. In a two-element system, such as lens system 300, the low index material of region 366 between lens 325 and lens 350 is void. One of ordinary skill in the art would understand the term "void" to include vacuum, or a gas, such as air, wherein region 366 is an "air gap."

Lens system 300 is any multielement optical system, which includes a first lens 325, a second lens 350, and a region 366 between lens 325 and lens 350. Lens system 300 has an optical axis 310, and an image plane 312. Rays of light 305 originate from an object point 320.

First lens 325 has a first surface 326, and a second surface 327. Second lens 350 has a first surface 351, and a second surface 352. First lens 325 and second lens 350 can be constructed of any material that is optically transparent (at optical or infrared wavelengths) and is configurable into an optical lens element. The index of refraction is approximately equal to 1.5–1.8. Polycarbonate, acrylic, styrene, polyamides, polysulfones, optical glasses, or infrared-transmitting materials such as germanium are examples of materials appropriate for constructing lenses 325 and 350. It is understood that other materials having a similar index of refraction can be used.

Lens system 300 has three optical boundaries that have non-zero optical power, first surface 326, second surface 327, and third surface 351. First surface 326 is any optical boundary having positive power and a convex surface. First surface 326 has a first vertex 302 and radius of curvature R. Second surface 327 is an optical boundary having a negative power, e.g., any oblate, concave optical boundary having negative power. Second surface 327 can be located substantially a distance R from first surface 323. Second surface 327 can be located between 0.7 R and 1.4 R away from first vertex 302. Third surface 351 is an optical boundary having positive power, e.g., any convex, spherical optical boundary having positive power. Alternatively third surface 351 can be oblate, or prolate, or a higher order asphere. Third surface 351 is located at least 0.05 R from second surface 327 at optical axis 310. Fourth surface 352 is any optical boundary having a continuous surface and zero optical power. Preferably, fourth surface 352 is a continuous surface, having zero optical power disposed at the image plane 312 of lens system 300.

Optionally, lens system 300 may include one or more surfaces having coatings for antireflection, antiabrasion or heat resistance purposes. As an alternative or a complement to an antireflection coatings a sub-wavelength microstructure may be used to reduce reflections. Sub-wavelength microstructures may be produced during the molding process if lenses are produced using molding a molding process. Additionally, any lens surface may be a hybrid refractive/diffractive surface, for reasons such as to reduce chromatic aberrations.

As stated above, throughout the specification the following definitions will apply. The phrases "object plane" and "image plane" refer to conjugate planes of a lens system or an array of lens systems. However, the terms "object" and "image" are non-limiting, and image planes and object planes can be photo-emitting, photo-detective, both, or neither, depending on the specific application of a lens system.

The phrase "object point" refers to points on either a finite or infinite object plane of a lens system. The phrase "object-side field angle" refers to the angle, as measured on the object side of a lens system, formed between the optical axis of a lens system and the ray of light from an object point that is transmitted through the center of the aperture stop of the lens system. The phrase "edge of the object-side field" refers to the field angle at the closest angular distance from optical axis for which the lens system transmission is reduced to substantially zero. In one embodiment, at the edge of the object-side field, the lens system transmits no more than 1% of the light incident on a lens system to the image plane. It is understood that the lens systems discussed below have a single edge of the object-side field that is rotationally symmetric about the optical axis. Accordingly, in a cross sectional view, which includes the optical axis, the lens systems will have two edges of the object-side field, each edge a part of the single edge of the object-side field. The phrase "object-side field" refers to all points within the edges of the object-side field. Object points having an object-side field angle greater than the edge of the object-side field are said to be "beyond the edge of the field."

The phrase "image point" refers to points on either a finite or infinite image plane of a lens system. The phrase "image-side field angle" refers to the angle, as measured on the image side of a lens system, formed between the optical axis of a lens system and the ray of light from an image point that is transmitted through the center of the aperture stop of the lens system. The phrase "edge of the image-side field" refers to the field angle at the closest angular distance from optical axis for which the lens system transmission is reduced to substantially zero. In one embodiment, at the edge of the image-side field, the lens system transmits no more than 1% of the light incident on a lens system to the object plane. It is understood that the lens systems discussed below have a single edge of the image-side field that is rotationally symmetric about the optical axis. Accordingly, in a cross sectional view, which includes the optical axis, the lens systems will have two edges of the image-side field, each edge a part of the single edge of the image-side field. The phrase "image-side field" refers to all points within the edges of the image-side field. Object points having an image-side field angle greater than the edge of the image-side field are said to be "beyond the edge of the field."

Figure 4A:
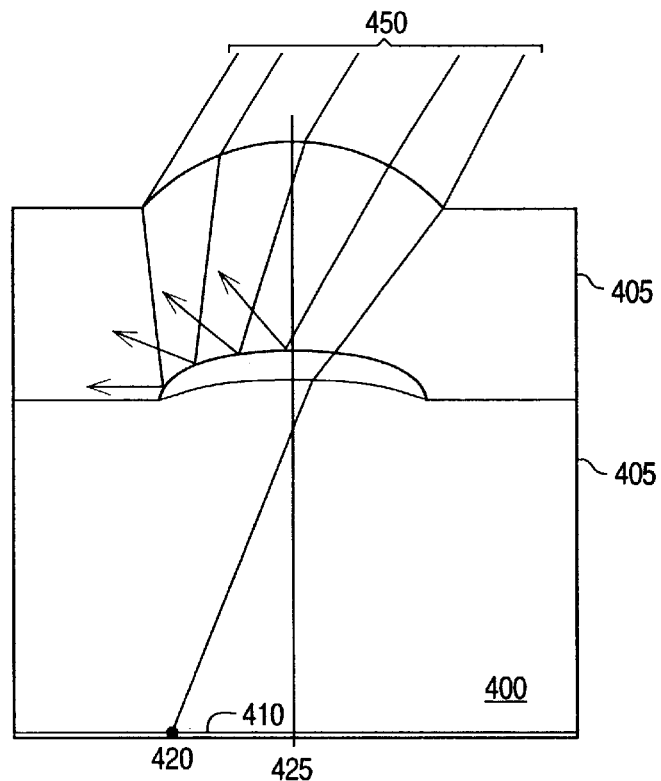
FIG. 4A is a cross sectional side view of one example of a discrete lens system that is object-side optically field-limited.

FIG. 4A is a cross sectional side view of one example of an embodiment of a discrete lens system 400 that is object-side optically field limited. Lens system 400 is a generic multielement lens system having one or more lens elements 405, and having an effective focal length F (not shown). Lens system 400 has an image plane 410, and an optical axis 425.

Light rays 450 form an image point 420 on image plane 410. Light rays 450 originate from an object point at the edge of the object-side field.

An object-side optically field-limited system is any system where the object-side edges of the field of the system are determined by the optical properties of lens material of the system. The object-side edge of the field is substantially determined by total internal reflection, and the transmission of light from object points in proximity to the object-side edge of the field as a function of field angle is substantially in the shape of the transmission curve of internal reflection as a function of angle of incidence. Cases 5–9 below are examples of lens systems that are object-side field-limited.

Figure 4B:
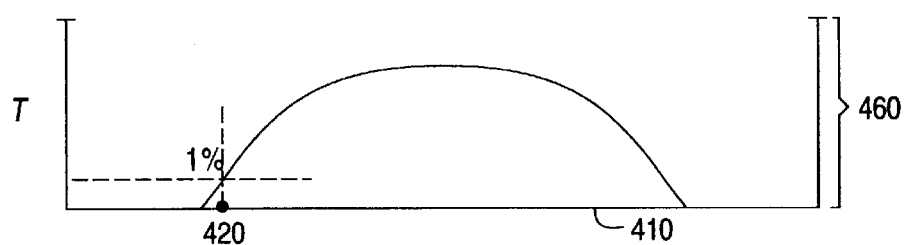
FIG. 4B is transmission curve of an object-side optically field-limited lens system, as a function of location in an image plane.

FIG. 4B is a transmission curve 460 illustrating transmission T of an object-side, optically field limited lens system 400, as a function of location in image plane 410. Because point 420 corresponds to the edge of the object field, the transmission of light to point 420 is no more than 1%.

Figure 5A:
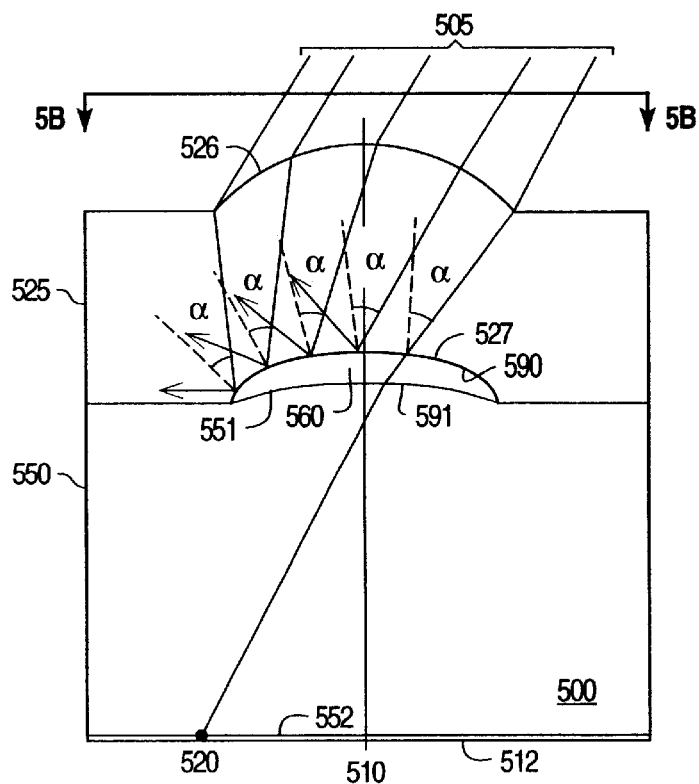
FIG. 5A is a cross sectional side view of one example of an embodiment of a lens system that is object-side optically field-limited.

FIG. 5A is a cross sectional side view of one example of an embodiment of a lens system 500 that is object-side optically field limited. Lens system 500 is any multielement optical system, which includes a first lens 525, a second lens 550, and a region 560 between lens 525 and lens 550. Lens system 500 has a focal length F, an optical axis 510, and an image plane 512. Light rays 505 originate from an object point at the edge of the object-side field. Light rays 505 form an image point 520.

First lens 525 has a first surface 526, a second surface 527. Second lens 550 has a first surface 551, a second surface 552. First lens 525 and second lens 550 can be constructed of any material that is optically transparent (at optical or infrared wavelengths) and is configurable into an optical lens element. Polycarbonate, styrene, polyamides, polysulfones, optical glasses, or infrared-transmitting materials such as germanium, are examples of materials appropriate for constructing lenses 525 and 550. It is understood that other materials having a relatively high index of refraction can be used.

Region 560 can be void or constructed of any material having a lower index than the material of lens 525 and lens 550 that-is optically transparent (to optical or infrared wavelengths of light) and is configurable into an optical lens element.

Lens system 500 has three optical boundaries that have non-zero optical power, first surface 526, second boundary 590 at second surface 527, and third boundary 591 at third surface 551. First surface 526 is an optical boundary having a positive power. First surface 526 is any optical boundary having a positive power and convex curvature. Second boundary 590 is an optical boundary having a negative power and a concave curvature. The relative index at second boundary 590 is approximately 1.5 or greater. Third boundary 591 is an optical boundary having a positive power, wherein the third surface 551 has a convex curvature. Fourth surface 552 is an optical boundary. Fourth surface 552 is any optical boundary having a continuous surface and zero optical power. Preferably, fourth surface 552 is a continuous surface, having zero optical power disposed at the image plane 512 of lens system 500 so that surface 552 is index matched to image plane 512.

Lens system 500 is configured to be object-side field limited by constructing second surface 527 as an equiangular surface. An equiangular surface is any surface for which each ray originating from a specified point on an plane (such as the object plane) impinges the surface at a single pre-selected angle. Because each ray of light from the specified point impinges the equiangular surface at a specified angle, light from points on the object plane proximate the specified point is transmitted by the equiangular surface such that the transmission as a function of position on the object plane is substantially in the shape of the transmission curve of internal reflection. If the specified angle is the critical angle of the surface, substantially all of the light incident on the equiangular surface from the specified point will be reflected by total internal reflection.

Surface 527 is any equiangular surface for which each ray originating from a specified object point impinges the surface at a single pre-selected angle α. At the critical angle of the equiangular surface, light originating from beyond the edge of the field is reflected away from image plane 512 by total internal reflection.

A substantially equiangular surface is a surface for which each ray originating from a specified object point impinges the surface at substantially a single pre-selected angle. A substantially equiangular surface exhibits many of the qualities of an equiangular surface.

Figure 5B:
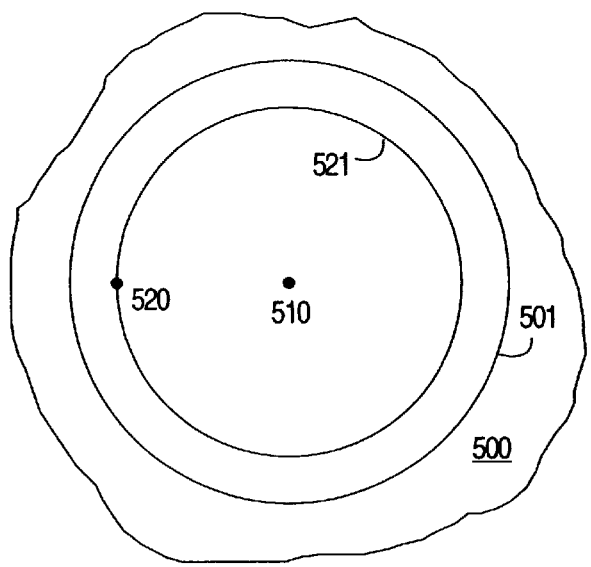
FIG. 5B is a top view of a lens system that is object-side optically field-limited.

FIG. 5B is a top view of lens system 500 taken along line 5B—5B in FIG. 5A. Perimeter 501 is the perimeter of first surface 526. The image points comprising circle 521 correspond to image points for light originating from points on the edge of the object-side field. In preferred embodiments, lens system 500 focuses light originating from points on the edge of the object-side field a distance equal to 0.375F–0.399F from optical axis 510, thus limiting the field of the lens systems. F is the effective focal length of the lens system. Cases 5–9 below are example of lens systems having substantially equiangular second surfaces.

Figure 5C:
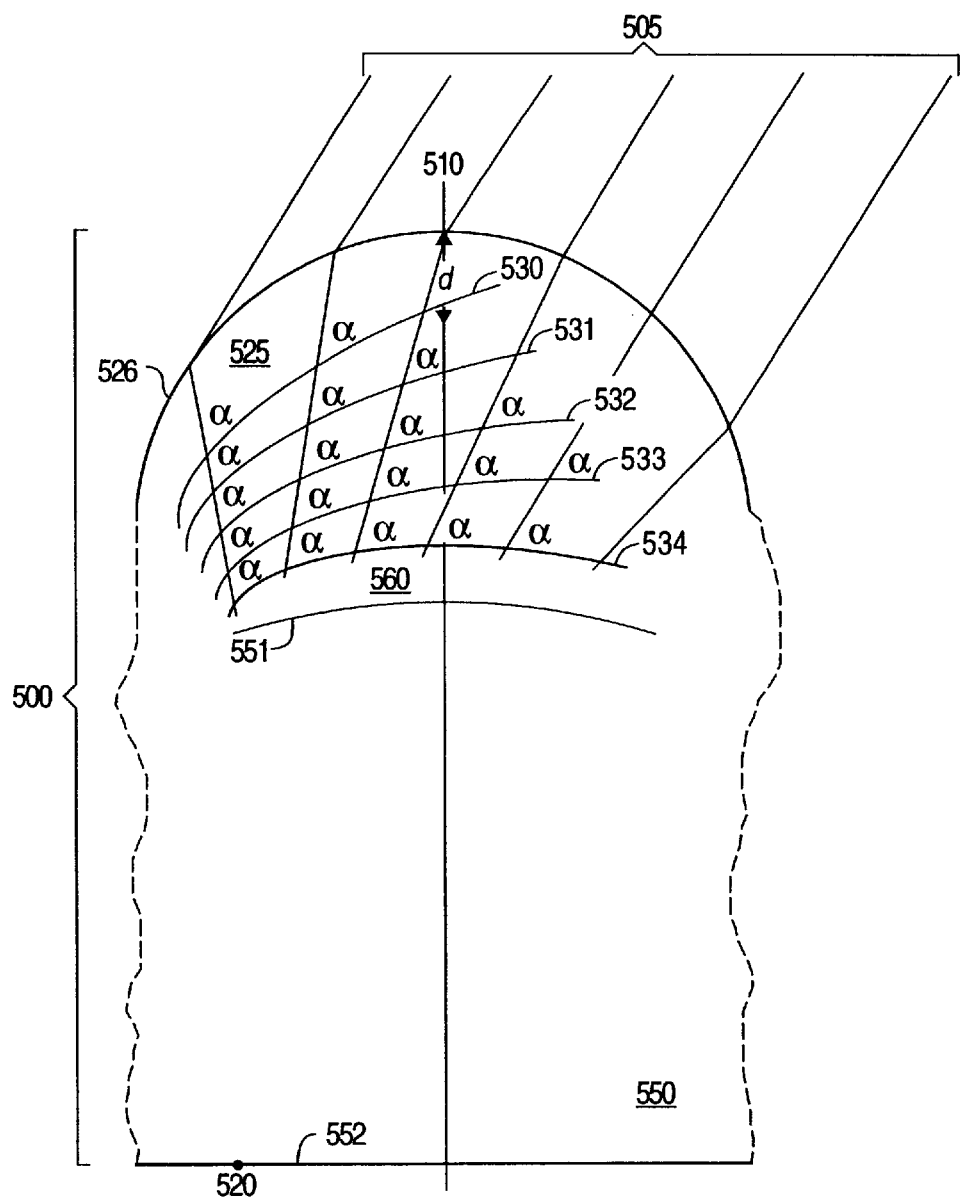
FIG. 5C is an example of cross sectional side view of a lens having an equiangular surface.
Figure 5D:
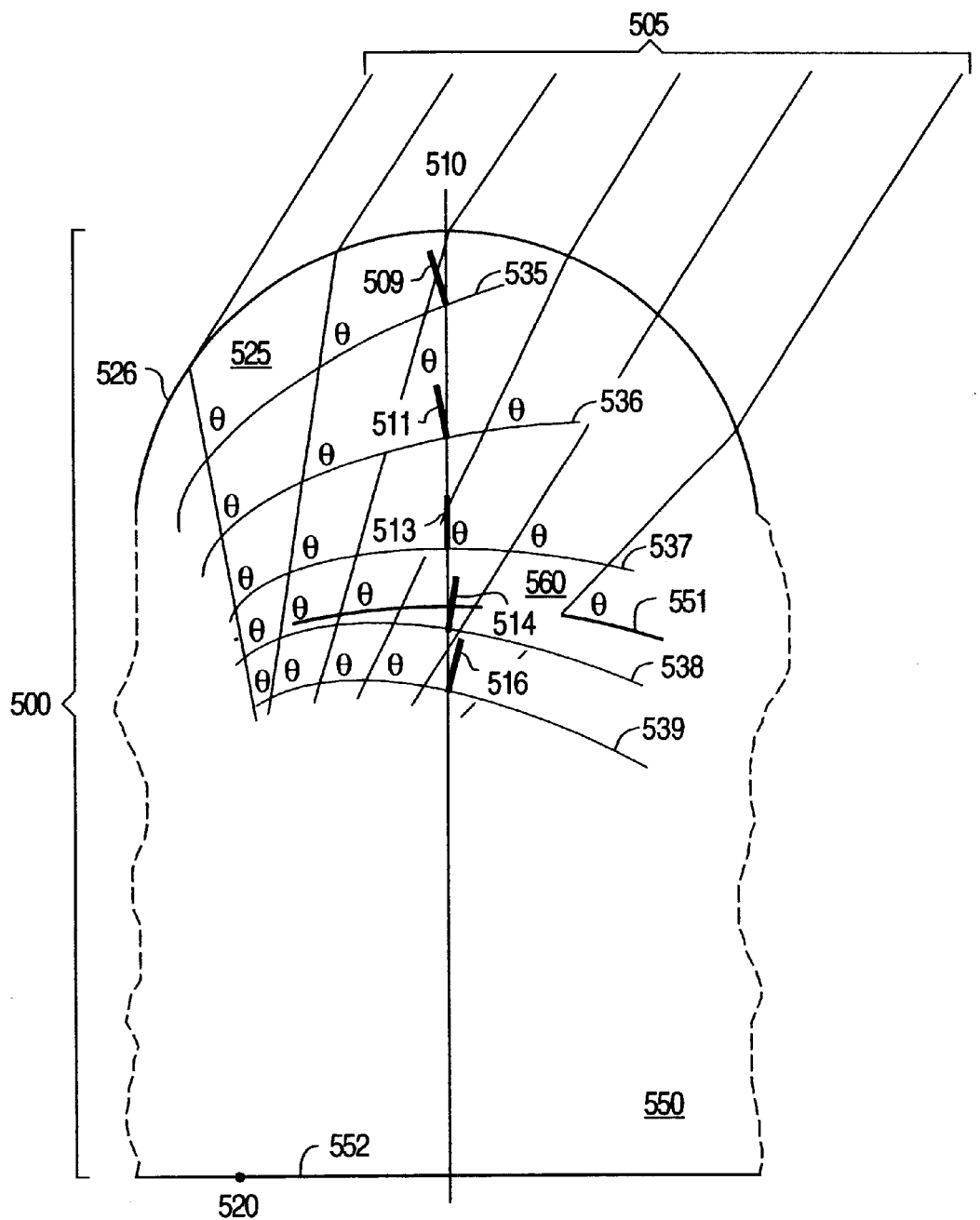
FIG. 5D is an example of cross sectional side view of a lens having an equiangular surface that is equiangular at the critical angle.
Figure 5E:
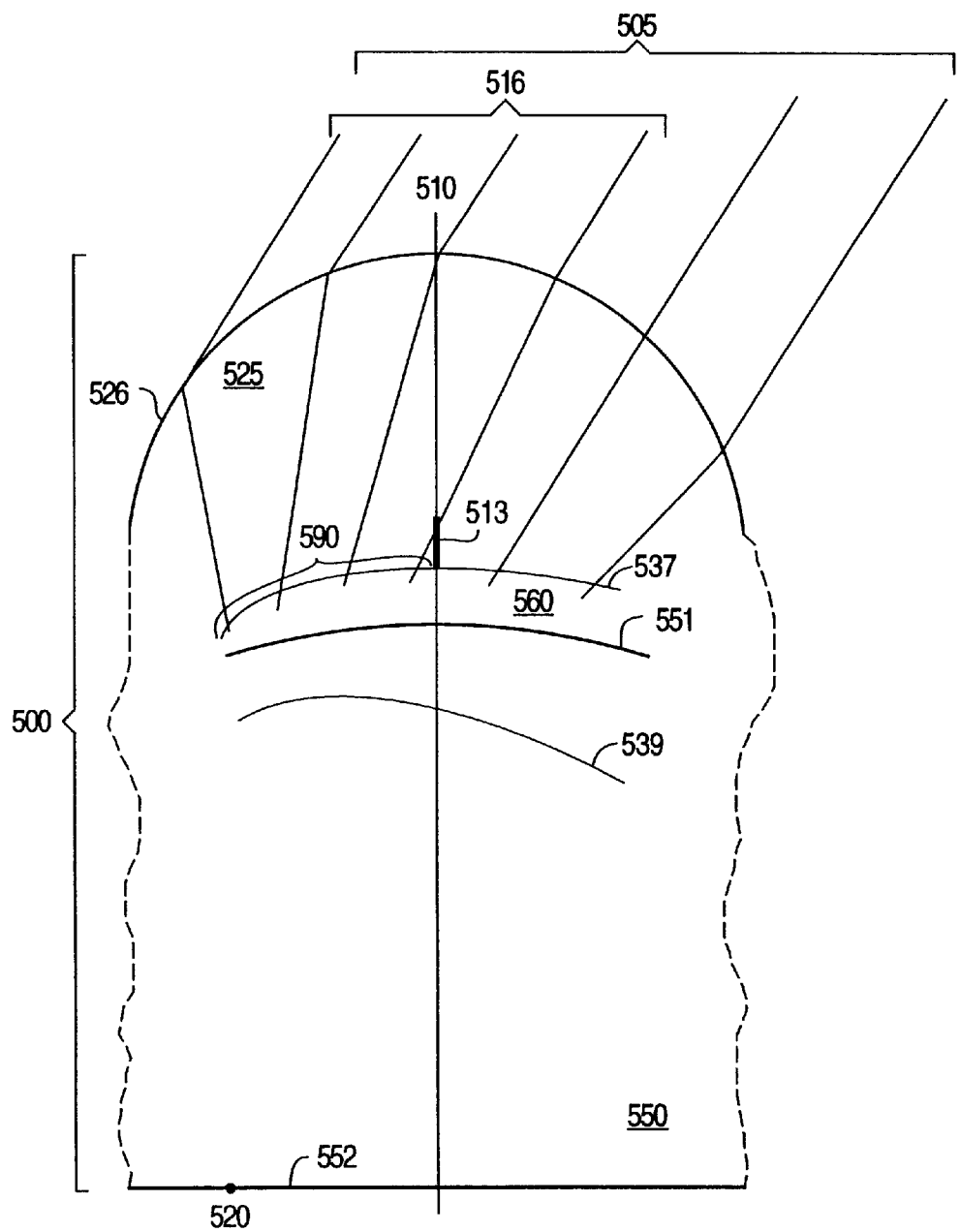
FIG. 5E is an example of cross sectional side view of a lens having an equiangular surface that is equiangular at the critical angle.

The following discussion with reference to FIG. 5C–FIG. 5E is meant to be illustrative of the design and function of an equiangular surface, such as equiangular surface 527 illustrated in FIG. 5A. The discussion is not meant to limit how an equiangular surface is designed, and all equiangular surfaces and all optical systems, which include an equiangular surface, are within the scope of this invention regardless of how the equiangular surface was designed.

FIG. 5C is a cross sectional side view of lens system 500. Light rays SOS are exemplary light rays corresponding to all rays originating from a single object point. Light rays 505 encountering lens 500 first impinge lens system 500 at first surface 526 of first lens element 525 before impinging third surface 551, region 560, and fourth surface 552.

Curves 530–534 are an exemplary subset of equiangular curves, wherein each of the curves 530–534 is an equiangular curve for rays 505. Curves 530–534 are curves for which each of a series of rays SOS impinge the curve at a pre-selected angle α. Each of the equiangular curves 530–534 is a two-dimension construct entirely in the plane including image point 520 and optical axis 510. As described below, second surface of the first lens element 525 is constructed to correspond to a selected equiangular curve for rays 505.

Each curve 530–534 is equiangular to rays 505, but is located a different distance from first surface 526 as measured along optical axis 510. For example, the distance from first surface 526 to curve 530 as measured along optical axis 510 is represented by d. It is understood that, for any object point and any chosen pre-selected angle α, an infinite number of equiangular curves exist, each curve at a different distance from first surface 526 as measured along optical axis 510.

FIG. 5D is a cross sectional side view of lens 500. Equiangular curves 535–539 are a subset of equiangular curves, wherein the curves are selected such that rays 505 impinge the equiangular curves 535–539 at the critical angle θ. As one of ordinary skill in the art would understand, the critical angle θ is defined by the index of refraction of the material of first lens 525 and the material of enclosed region 560.

Normals 509, 511, 513, 514, 516 are the normals of equiangular curves 535–539, respectively, as determined at the point at which each of the curves 535-539 crosses the optical axis 510. Normal 513 of equiangular curve 537 is parallel to optical axis 510 at the point at which curve 537 crosses the optical axis 510. Normal 513 crosses the optical axis 510 approximately at the center of curvature of surface 526.

FIG. 5E is a cross sectional side view of lens 500. Subset of rays 516 is the subset of rays 505 that crosses optical axis 510 prior to impinging equiangular curve 537. Accordingly, all rays 516 impinge equiangular curve 537 on a single side of optical axis 510.

Portion 590 is the portion of curve 537 upon which rays 516 impinge curve 537. Portion 590 is a two-dimension construct entirely in the plane including optical axis 510 and point 520.

Second surface 527 of first lens 525 can be constructed to be an equiangular surface by rotating a portion of any equiangular curve about optical axis 510, wherein the equiangular curve is a curve for which a series of rays from a single object point impinge the equiangular curve at a single pre-selected angle α. Second surface 527 of first lens 525 can be constructed to be an equiangular surface by rotating a portion of an equiangular curve about optical axis 510, wherein the equiangular curve is a curve for which a series of rays from a single object point impinge the equiangular curve at a single pre-selected angle for an object point, and wherein the pre-selected angle is the critical angle. Second surface 527 of first lens 525 is constructed to be an equiangular surface by rotating a portion 590 of equiangular curve 537 about optical axis 510, wherein the equiangular curve is a curve for which a series of rays from a single object field point impinge the equiangular curve at a single pre-selected angle for an object point, and wherein the pre-selected angle is the critical angle and the normal of the equiangular curve at the point at which for each of the curve crosses the optical axis 510 is parallel to optical axis 510.

Second surface 527 of first lens 525 may be substantially equiangular surface, such that the angle a at which rays impinge second surface of first lens 525 are not equiangular, but are substantially equiangular thus exhibiting many of the beneficial characteristics of an equiangular surface. A substantially equiangular surface is a surface such as a spherical or aspherical approximation of an equiangular surface that would result from optimizing optical system 500 using a lens design program, to optimize the performance according to a merit function, wherein the merit of particular lens system is a weighted average of object-side optical field limitation and other lens characteristics.

Embodiments in which rays 517 and 518 cross are within the scope of this invention. Embodiments in which rays 517 and 518 cross are useful provided the image quality of lens system 500 is not degraded such that the lens is not useful for a particular purpose.

Figure 6A:
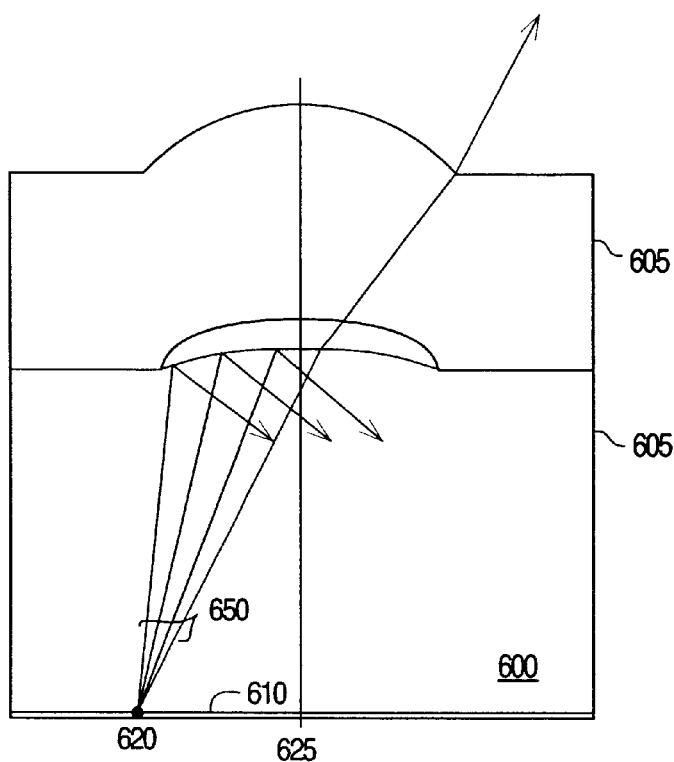
FIG. 6A is a cross sectional side view of one example of an embodiment of a discrete lens system that is image-side optically field-limited.

FIG. 6A is a cross sectional side view of one example of an embodiment of a discrete lens system 600 that is image-side optically field limited. Lens system 600 is a generic multielement lens system having one or more lens elements 605, and having a focal length F. Lens system 600 has an image plane 610, and an optical axis 625.

Light rays 650 originate from an image point 620 on image plane 610 at the edge of the image-side field. Light rays 650 are transmitted by lens system 600 to the object side of lens system 600. An image-side optically field-limited system is any system where the image-side edges of the field of the system are determined by the optical properties of lens material of the system. The image-side edge of the field is substantially determined by total internal reflection, and the transmission of light from image points in proximity to the image-side edge of the field as a function of field angle is substantially in the shape of the transmission curve of internal reflection as a function of angle of incidence. Cases 5–9 below are examples of lens systems having an lens systems that are image-side field-limited.

Figure 6B:
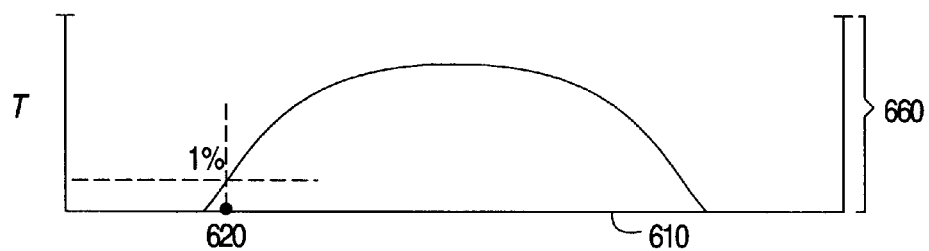
FIG. 6B is transmission curve of a image-side optically field limited lens system, as a function of location in an object plane.

FIG. 6B is a transmission curve 660 illustrating transmission T of an object-side, optically field limited lens system 600, as a function of location in image plane 610. Because point 620 corresponds to the edge of the object field, the transmission of light to point 620 is no more than 1%.

Figure 7A:
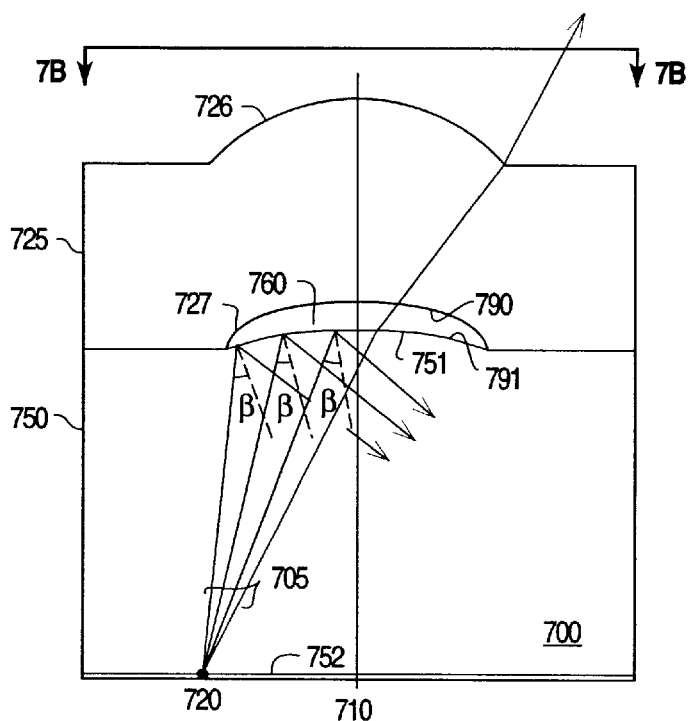
FIG. 7A is a cross sectional side view of one example of an embodiment of a lens system that is image-side optically field-limited.

FIG. 7A is a cross sectional side view of one example of an embodiment of a lens system 700 that is image-side optically field limited. Lens system 700 is any multielement optical system, which includes a first lens 725, a second lens 750, and a region 760 between lens 725 and lens 750. Lens system 700 has a focal length F, an optical axis 710, and an image plane 712. Rays of light 705 originate from an image point 720 at the edge of the image-side field.

First lens 725 has a first surface 726, a second surface 727, and is constructed of a material having a relatively high index of refraction. Second lens 750 has a first surface 751, a second surface 752 and is constructed of any material having a relatively high index of refraction, and which is optically transparent (at optical or infrared wavelengths) and configurable into an optical lens element. Polycarbonate, styrene, polyamides, polysulfones, optical glasses, or infrared-transmitting materials such as are examples of materials appropriate for constructing lenses 725 and 750. It is understood that other materials having a relatively high index of refraction can be used. Region 760 can be void or constructed of any material having a lower index than the material of lens 725 and lens 750 that is optically transparent (to optical or infrared wavelengths of light) and is configurable into an optical lens element. Optical fluoropolymers are examples of appropriate low-index materials.

Lens system 700 has three optical boundaries that have non-zero optical power, first surface 726, second boundary 790 at second surface 727, and third boundary 791 at third surface 751. First surface 726 is any optical boundary having a positive power. First surface 726 is any optical boundary having a positive power and convex curvature. Second boundary 790 is an optical boundary having a negative power. Second boundary 790 is any optical boundary having a negative power, wherein second surface 727 has a concave curvature. Third boundary 791 is any optical boundary having a positive power. Third boundary 791 is any optical boundary having a positive power, wherein the third surface 751 has a convex curvature.

Fourth surface 752 is an optical boundary. Fourth surface 752 is any optical boundary having a continuous surface. Optical surface 752 is any optical boundary having a continuous surface and zero optical power. Preferably, fourth surface 752 is a continuous surface, having zero optical power disposed at the image plane 712 of lens system 700 so that fourth surface 752 is index matched to image plane 712.

Lens system 700 is configured to be image-side field limited by constructing second surface 751 as an equiangular surface for a specified point on the image plane. Because each ray of light from the specified point impinges an equiangular surface at a specified angle, light from points on the object plane proximate the specified point is transmitted by the equiangular surface such that the transmission as a function of position on the object plane is substantially in the shape of the transmission curve of internal reflection. If the specified angle is the critical angle of the surface, substantially all of the light incident on the equiangular surface from the specified point will be reflected by total internal reflection.

Surface 751 is any surface 751 for which each ray originating from an image point at the image-side edge of the field impinges the surface at a single pre-selected angle θ, e.g., the critical angle of the equiangular surface, such that light originating from beyond the edge of the field is reflected by total internal reflection.

Figure 7B:
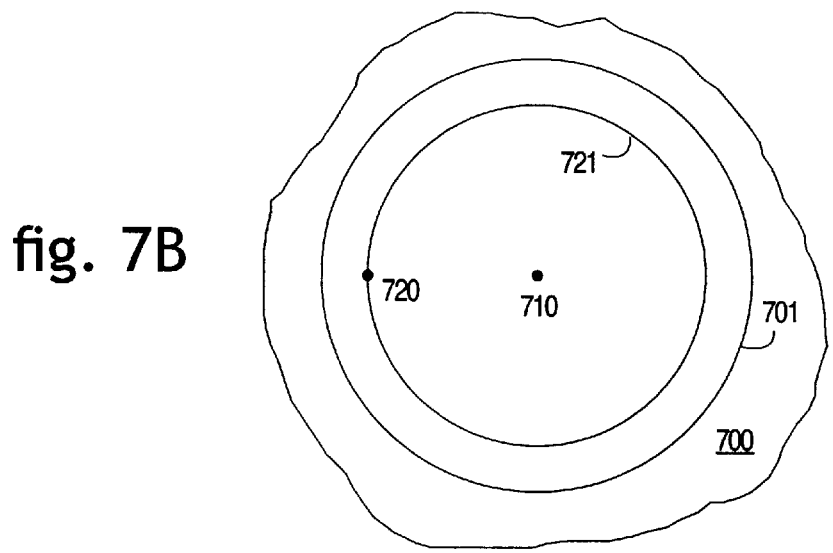
FIG. 7B is a top view of lens system that is image-side optically field-limited.

FIG. 7B is a top view of lens system 700 along line 7B—7B in FIG. 7A. Perimeter 701 is the perimeter of first surface 726 of lens system 700. The image points comprising circle 721 correspond to the edge of the image-side field, such as point 720. In preferred embodiments of lens system 700, the image-side edge of the field is located a distance equal to 0.375F–0.399F from optical axis 510, thus limiting the field of the lens systems. F is the effective focal length of the lens system. Cases 5–9 below are example of lens systems having substantially equiangular third surfaces.

Figure 7C:
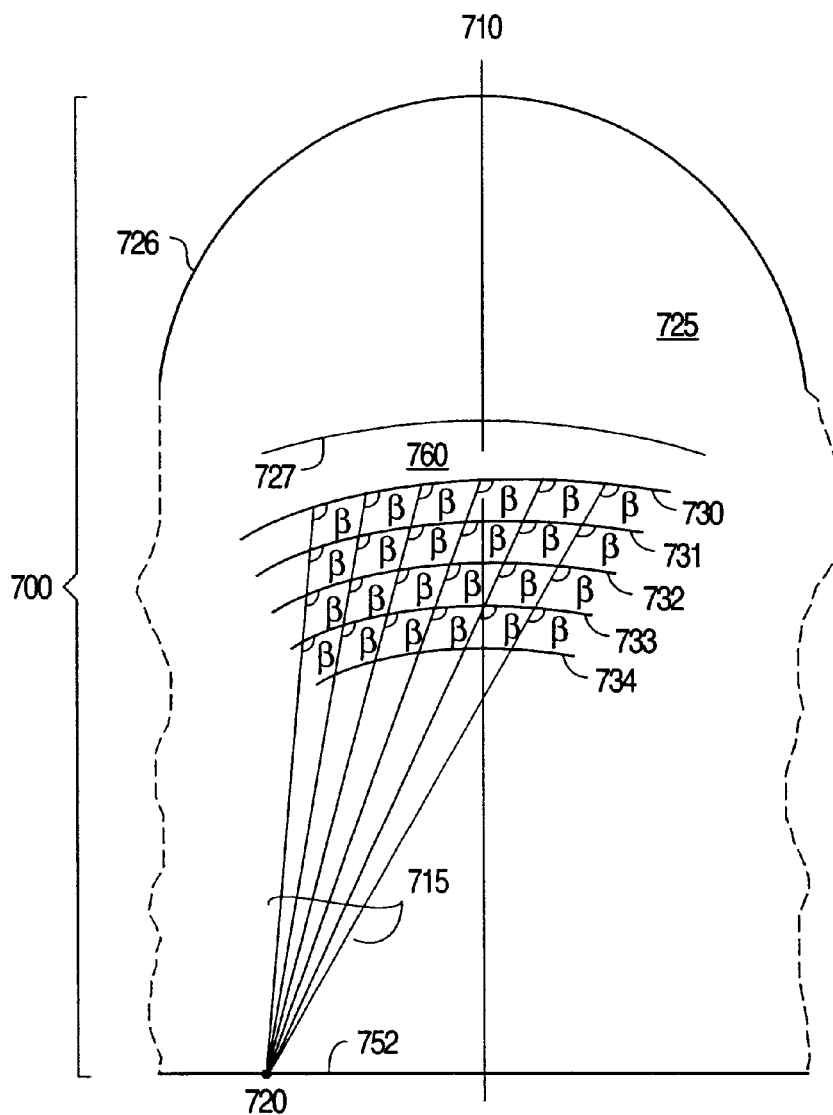
FIG. 7C is a cross sectional view of a lens system having an equiangular surface.
Figure 7D:
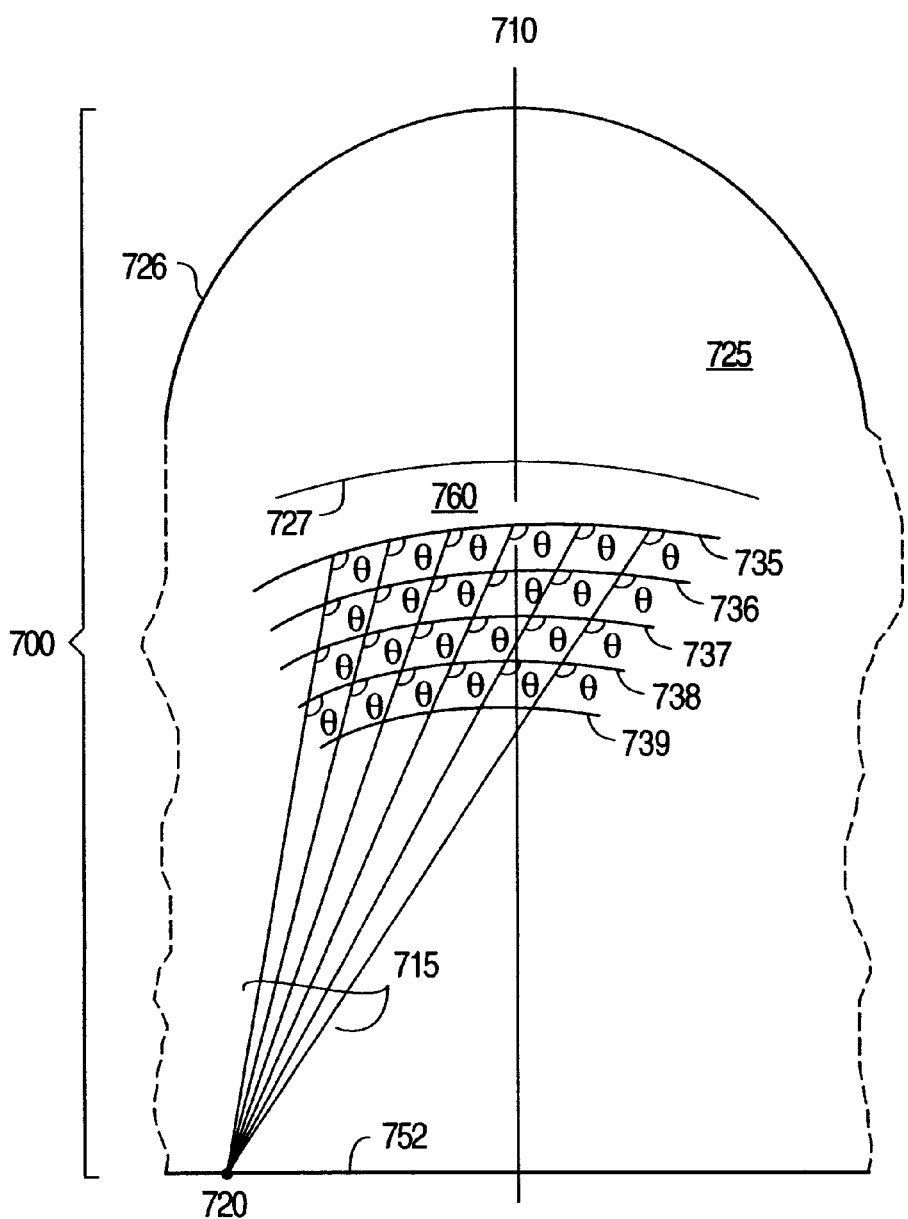
FIG. 7D is a cross sectional view of a lens system having an equiangular surface that is equiangular at the critical angle.

The following discussion with reference to FIG. 7C–FIG. 7D is meant to be illustrative of the design and function of equiangular surface 751 of FIG. 7A. The discussion is not meant to limit how an equiangular surface is designed, and all equiangular surfaces and all optical systems, which include an equiangular surface, are within the scope of this invention regardless of how the equiangular surface was designed.

FIG. 7C is a cross sectional side view of lens system 700. Light rays 715 are exemplary light rays corresponding to all rays originating from a single image point 720. Light rays 715 encountering lens 700 first impinge lens system 700 at surface 752. For illustrative purposes, fourth surface 752 is a planar surface having zero optical power, disposed at the image plane 712 of lens system 700, and index matched to image plane 712.

Curves 730–734 are an exemplary subset of equiangular curves, wherein each of the curves 730–734 is an equiangular curve for rays 715. Curves 730–734 are curves for which each of a series of rays 715 impinge the curve at a pre-selected angle β. Each of the equiangular curves 730–734 is a two-dimension construct entirely in the plane including line point 720 and optical axis 710. As described below, second surface 727 is constructed to correspond to a specific equiangular curve for rays 715.

Each curve 730–734 is equiangular to rays 715, but is located a different distance from second surface 727 as measured along optical axis 710. For example, the distance from first surface 726 to curve 730 as measured along optical axis 710 is represented by d. It is understood that, for any object point and any chosen pre-selected angle β, an infinite number of equiangular curves exist, each curve at a different distance from first surface 726 as measured along optical axis 710.

FIG. 7D is a cross sectional side view of lens 700. Lens system 700 has a first lens 725 having a first surface 726 and a second surface 727. Second lens 750 has a second surface 752. Equiangular curves 735–739 is a subset of equiangular curves, wherein the curves are selected such that rays 715 impinge the equiangular curves 735–739 at the critical angle β. As one of ordinary skill in the art would understand, the critical angle θ is defined by the index of refraction of the material of second lens 750 and the material of enclosed region 760.

A first surface of second lens 750 can be constructed to be a substantially equiangular surface by selecting a surface that is rotationally symmetric about optical axis 710, which approximates the curvature of any of the equiangular curve 735–739, wherein the first surface of the second lens 750 is a surface for which a series of rays 715 from a single object point impinge the first surface of second lens 750 at substantially a preselected angle. A first surface of second lens 750 can be constructed to be a substantially equiangular surface by selecting a surface approximating the curvature of any of the equiangular curve 735–739, and having its vertex coincide with optical axis 710, wherein the first surface of the second lens 750 is a surface for which a series of rays 715 from a single object point impinge the first surface of second lens 750 at approximately a preselected angle, and wherein the pre-selected angle is the critical angle θ.

Cases 1–4 below are examples of three-element high acuity lens system 100, as discussed with reference to FIG. 3A above. Any of the aspherical surfaces are appropriately constructed of conic or higher order aspheric polynomials:

$$Z = \frac{(V)Y^2}{\sqrt{1+(1-(1+K)(V)^2 Y^2}} + (A)Y^4 + (B)Y^6 + (C)Y^8 + (D)Y^{10}$$

where V is curvature.

Case 1
Materials: polycarbonate/fluoropolymer/polycarbonate  Indices: 1.586/1.370/1.586
f/#: 1.16  Object distance: −25 mm (afocal)  Distortion: −3.6%

| # | Type | Radius | Thickness | Aperture | Field | CC | AD/e | AE/e | AF/e | AE/e |
|---|------|--------|-----------|----------|-------|-----|------|------|------|------|
| L1 | Sphere | 0.165 | 0.165 | 0.125 | | — | — | — | — | — |
| L2 | Asphere | 0.220 | 0.023 | 0.091 | | −20.000000 | 80.000000 | 4.9341e4 | 6.0263e5 | −2.8e8 |
| L3 | Sphere | 0.240 | 0.243 | 0.091 | | −14.096864 | −139.955324 | 1.7441e4 | 1.7476e6 | −4.5e8 |
| IP | Plane | — | — | 0.125 | 50° | | | | | |

Case 2
Materials: polycarbonate/fluoropolymer/polycarbonate  Indices: 1.586/1.360/1.586
f/#: 1.5  Object distance: infinite  Distortion: <1%

| # | Type | Radius | Thickness | Aperture | Field | CC | AD/e | AE/e | AF/e | AG/e |
|---|------|--------|-----------|----------|-------|-----|------|------|------|------|
| L1 | Sphere | 0.105 | 0.105 | 0.080 | | — | — | — | — | — |
| L2 | Asphere | 0.133 | 0.021 | 0.037 | (stop) | +5.5 | — | — | — | — |
| L3 | Asphere | 0.112 | 0.150 | 0.045 | | −4.3 | — | — | — | — |
| IP | Plane | — | — | 0.075 | 48° | | | | | |

-continued

Case 3
Materials: polycarbonate/fluoropolymer/polycarbonate  Indices: 1.586/1.360/1.586
f/#: 1.9  Object distance: infinite  Distortion: −5%

| # | Type | Radius | Thickness | Aperture | Field | V | K | A | B | C | D |
|---|------|--------|-----------|----------|-------|---|---|---|---|---|---|
| L1 | Sphere | 0.1040 | 0.1040 | 0.0896 | | — | — | — | — | — | — |
| L2 | Asphere | (V) | 0.0215 | 0.1320 | (stop) | 6.00467387 | −1.025853 | −4.63382e2 | 4.93597e5 | −2.66712e7 | 0 |
| L3 | Asphere | (V) | 1.5882 | 2.0000 | | 8.32798928 | −14.096864 | −5.54914e2 | 1.34159e5 | 7.37554e6 | 0 |
| IP | Plane | — | — | 0.1936 | 60° | | | | | | |

Case 4
Materials: polycarbonate/fluoropolymer/polycarbonate  Indices: 1.586/1.370/1.586
f/#: 2.8  Object distance: 1000 mm  Distortion: −0.4%

| # | Type | Radius | Thickness | Aperture | Field | CC | AD/e | AE/e | AF/e | AE/e |
|---|------|--------|-----------|----------|-------|----|------|------|------|------|
| L1 | sphere | 2.900 | 2.970 | 1.000 | | — | — | — | — | — |
| L2 | asphere | 2.970 | 0.107 | 0.910 | | — | −0.044859 | 0.089832 | 0.011457 | −0.052 |
| L3 | sphere | 6.600 | 5.440 | 0.910 | | −11.000000 | −0.052175 | 0.049907 | 0.004105 | −0.030 |
| IP | plane | — | — | 1.000 | 20° | | | | | |

Cases 5–9 are examples of two-element high acuity lens systems 200 as discussed with reference to FIG. 3B above.

Any of the aspherical surfaces are appropriately constructed of conic or higher order aspheric polynomials.

Case 5
Materials: polycarbonate/air/polycarbonate  Indices: 1.586/1.000/1.586
f/#: 1.13  Object distance: −25 mm (afocal)  Distortion: −3.3%

| # | Type | Radius | Thickness | Aperture | Field | CC | AD/e | AE/e | AF/e | AE/e |
|---|------|--------|-----------|----------|-------|----|------|------|------|------|
| L1 | sphere | 0.165 | 0.165 | 0.125 | | — | — | — | — | — |
| L2 | asphere | 0.23 | 0.013 | 0.098 | | +2.95 | 30.088684 | — | 1.3174e5 | 6.0e7 |
| L3 | sphere | 0.22 | 0.257 | 0.098 | | −1.00 | — | — | — | 2.0e7 |
| IP | plane | — | — | −0.125 | 50° | | | | | |

Case 6
Materials: polycarbonate/air/polycarbonate  Indices: 1.586/1.000/1.586
f/#: 1.5  Object distance: infinite  Distortion: −4%

| # | Type | Radius | Thickness | Aperture | Field | CC | AD/e | AE/e | AF/e | AG/e |
|---|------|--------|-----------|----------|-------|----|------|------|------|------|
| L1 | sphere | 0.080 | 0.080 | 0.070 | | — | — | — | — | — |
| L2 | asphere | 0.097 | 0.012 | 0.031 | (stop) | +3.37 | — | — | — | — |
| L3 | sphere | 0.103 | 0.130 | 0.044 | | — | — | — | — | — |
| IP | plane | — | — | 0.065 | 51.2° | | | | | |

Case 7
Materials: polycarbonate/air/polycarbonate  Indices: 1.586/1.000/1.586
f/#: 2.0  Object distance: infinite  Distortion: −3%

| # | Type | Radius | Thickness | Aperture | Field | CC | AD/e | AE/e | AF/e | AG/e |
|---|------|--------|-----------|----------|-------|----|------|------|------|------|
| L1 | sphere | 0.920 | 1.000 | 0.750 | | — | — | — | — | — |
| L2 | asphere | 0.980 | 0.190 | 0.290 | (stop) | +3.8 | — | — | — | — |
| L3 | asphere | 1.310 | 1.620 | 0.430 | | +2.9 | — | — | — | — |
| IP | plane | — | — | 0.670 | 43° | | | | | |

-continued

Case 8
Materials: polycarbonate/air/polycarbonate    Indices: 1.586/1.000/1.586
f/#: 1.5    Object distance: infinite    Distortion: −5%

| | | Surface Data: | | | | | Aspheric terms: | | | |
|---|---|---|---|---|---|---|---|---|---|---|
| # | Type | Radius | Thickness | Aperture | Field | V | K | A | B | C | D |
| L1 | sphere | 0.0800 | 0.0800 | 0.0960 | | — | — | — | — | — | — |
| L2 | asphere | (V) | 0.0106 | 0.0867 | (stop) | 9.032 | +3.958 | — | — | — | — |
| L3 | asphere | (V) | 0.1293 | 0.1600 | | 8.923 | −2.897 | — | — | — | — |
| IP | plane | — | — | 0.2043 | 61° | | | | | | |

Case 9
Materials: polycarbonate/air/polycarbonate    Indices: 1.586/1.000/1.586
f/#: 1.4    Object distance: infinite    Distortion: −4%

| | | Surface Data: | | | | | Aspheric terms: | | | |
|---|---|---|---|---|---|---|---|---|---|---|
| # | Type | Radius | Thickness | Aperture | Field | V | K | A | B | C | D |
| L1 | Sphere | 1.0162 | 1.0162 | 1.200 | (stop) | — | — | — | — | — | — |
| L2 | Asphere | (V) | 0.1162 | 1.2100 | (stop) | 0.60331747 | +6.376347 | — | — | — | — |
| L3 | Asphere | (V) | 1.5882 | 2.0000 | | 0.65757840 | −5.545224 | — | — | — | — |
| IP | Plane | — | — | 1.6279 | 48.0° | | | | | | |

Figure 8:
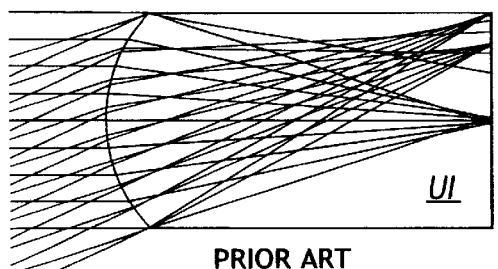
FIG. 8 is a ray trace of an uncorrected lens system.
Figure 9:
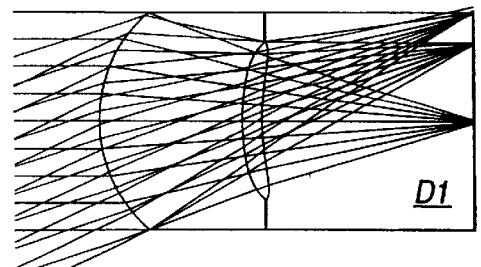
FIG. 9 is a ray trace one example of a three-element lens system according to the present invention.
Figure 10A:
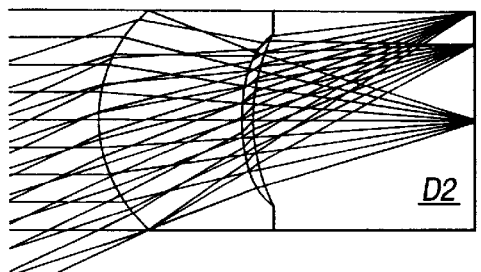
FIG. 10a is a ray trace of one example of a two element lens system according to the present invention.
Figure 11:
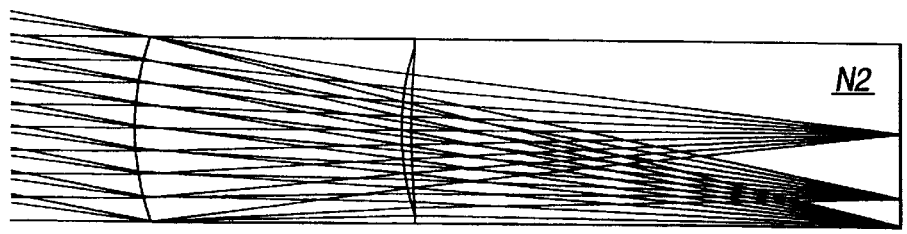
FIG. 11 is lens system according to the present invention having finite conjugates.

FIG. 8 is a cross sectional side view of an uncorrected lens system that illustrates aberration in uncorrected arrays as described in FIG. 1A. FIG. 9 is a cross sectional side view of the three-element lens system described in Case 1 that illustrates correction of aberration present in the uncorrected lens system illustrated in FIG. 8. FIG. 10A is a cross sectional side view of the two-element lens system described in Case 5 that illustrates correction of aberration present in the uncorrected lens system illustrated in FIG. 8. FIG. 11 is a cross sectional side view of the three-element lens system described in Case 4 that illustrates correction of aberration present in the uncorrected lens system illustrated in FIG. 8.

Figure 10B:
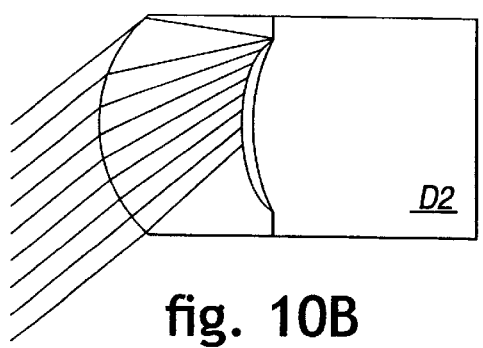
FIG. 10B is a ray trace illustrating field limitation.

Cases 1, 4, and 5 represent a special condition in which the L2 and L3 geometries (see FIG. 17) meet at a common perimeter, and in which that common perimeter encompasses all rays in the field. Points 1001 in FIG. 10B illustrate points along the common perimeter. It may be understood that optical surface L3 contacts surface L2 such that surface L2 and L3 self align.

Figure 12:
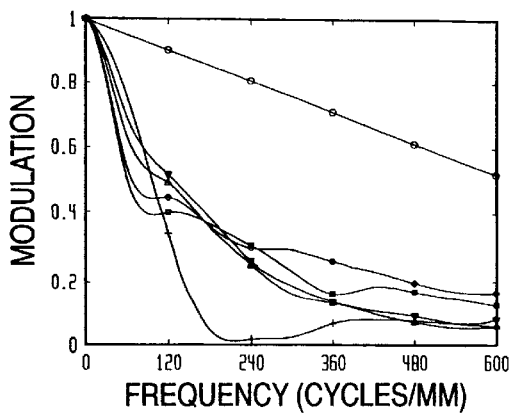
FIG. 12 is a modulation transfer function (MTF) of an uncorrected lens system.
Figure 13:
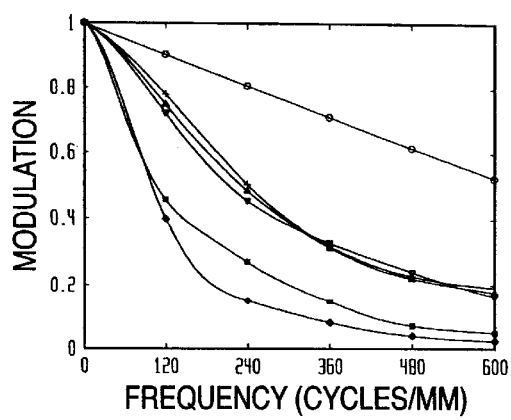
FIG. 13 is an MTF of one example three-element lens system according to the present invention
Figure 14:
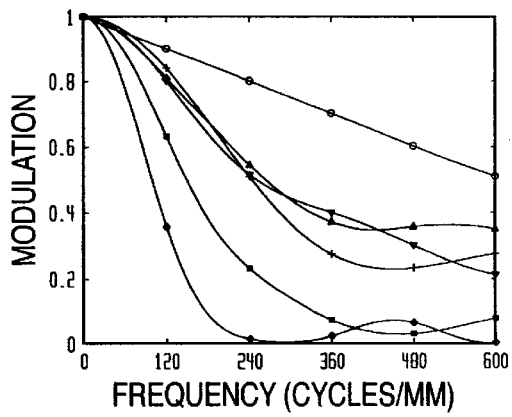
FIG. 14 is an MTF of one example of a two-element lens system according to the present invention.
Figure 15:
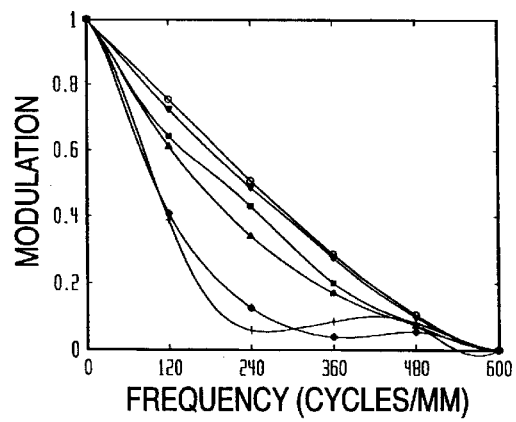
FIG. 15 is an MTF of one example of a finite conjugate lens system according to the present invention.

Relative performance may be quantified by comparison of the MTF of the uncorrected lens systems to that for lens systems formed according to the invention. FIG. 12 represents the MTF for the monolithic array, while FIG. 13 and FIG. 14 show the MTF output for Case 7 and Case 8, respectively. Each MTF analysis shown includes five separate plots: on-axis(0), and saggital and tangential plots at 70% (0.7r) and 100% (1.0r) of the targeted image fields. The location of the sampled radii on the image plane may be understood by reference to the unevenly broken lines in FIG. 25. FIG. 12 indicates that array U1 will have a modulated contrast of 50% at approximately 100 cycles/mm. At the extremity of their fields, it may be seen that D1 and D2 arrays offer only a marginal improvement over the uncorrected array. However, FIG. 13 indicates that, within the central 70% field radius of fluoropolymer-filled D1 array of Case 7, a 50% modulation occurs at a spatial frequency of no less than 230 cycles/mm. FIG. 14 shows that in the air-filled D2 array of Case 8, a 50% modulation occurs at a frequency of 240 cycles/mm. In both the D1 and D2 arrays, acuity peaks at approximately the mid-field (0.5) location, where the spatial frequency at 50% modulation reaches 300 cycles/mm.

Figure 16A:
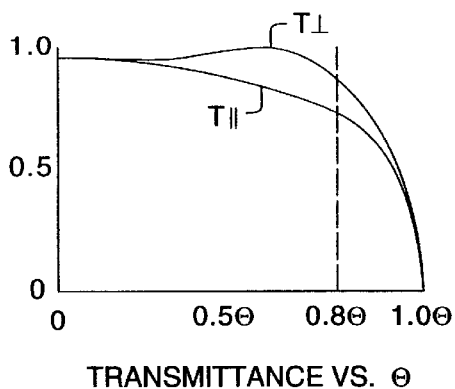
FIG. 16A is transmittance curve as a function of the critical angle.
Figure 16B:
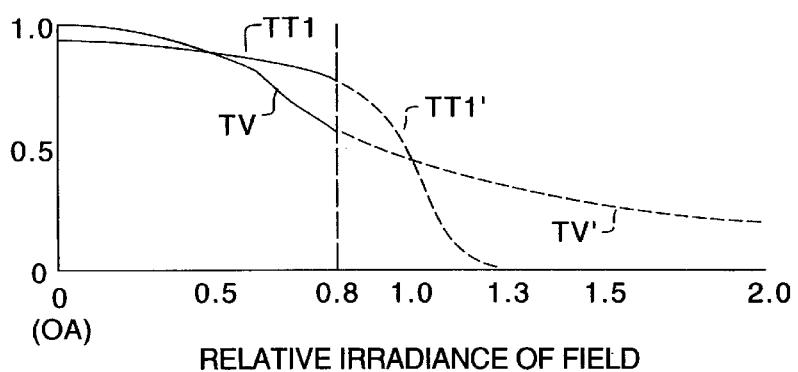
FIG. 16B is a curve illustrating transmittance through an optically field-limited system and a vignetted lens system.
Figure 16C:
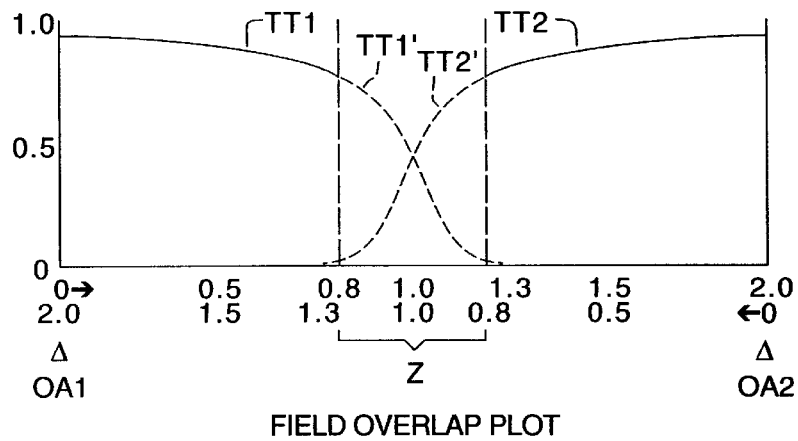
FIG. 16C is a plot of two overlapping image fields in a lens array according to the present invention.
Figure 22:
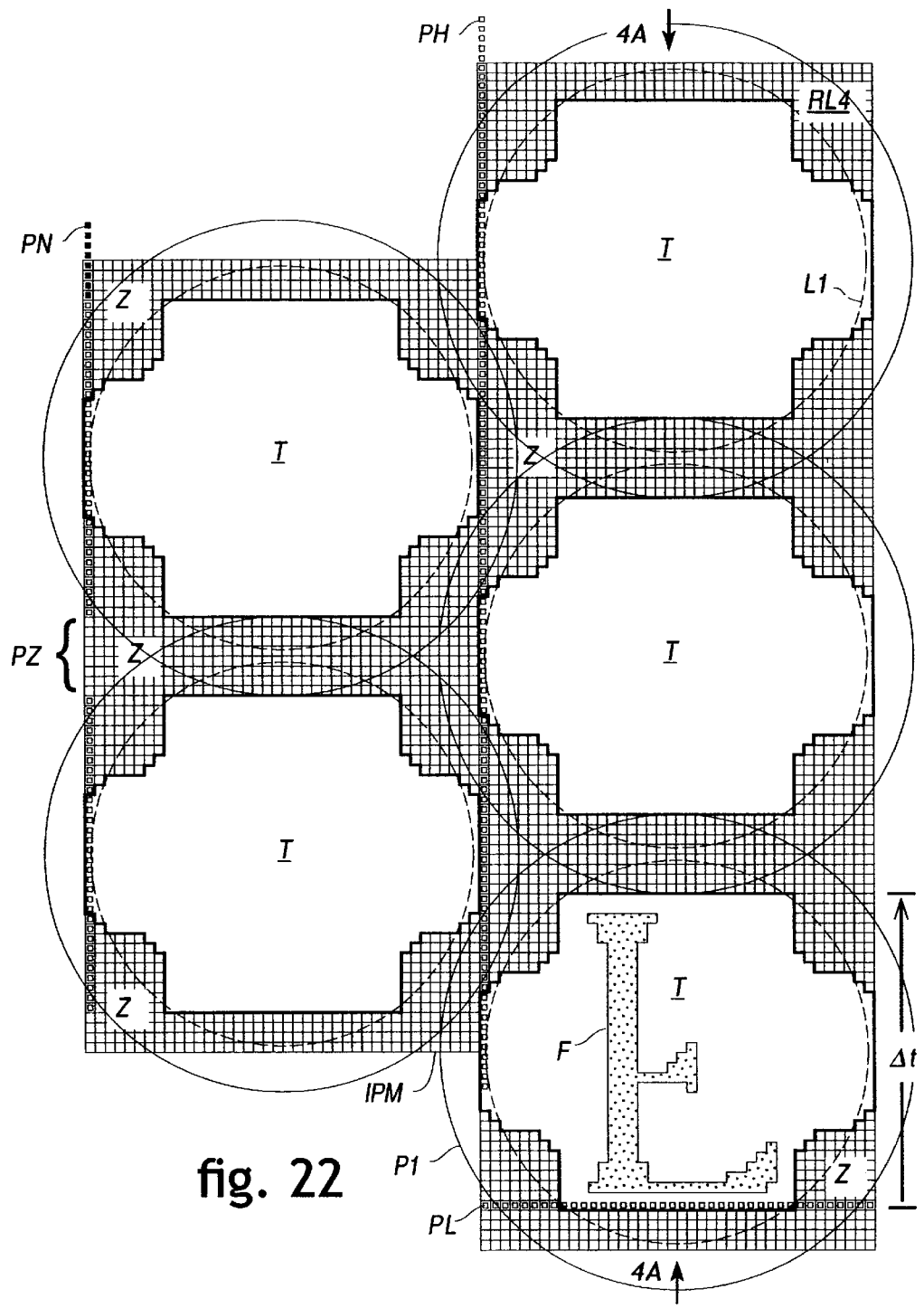
FIG. 22 is a a schematic layout of five cells in a master array, showing the optically accessible image fields and the microimage tiling.

FIG. 10B is a cross sectional side view of the two-element lens system described in Case 5 that illustrates optical field limitation. FIG. 10B shows the computational confirmation of TIR at L3, here occurring at a half-field angle of 38.5°. FIG. 16A illustrates transmittance as of the critical angle θ for parallel and perpendicularly polarized light. FIG. 16A illustrates that transmittance drops of abruptly beyond 80% of the critical angle. FIG. 16B illustrates that irradiance of the field to be electively masked at 80% of a predetermined field angle. In FIG. 16B line TV illustrates the irradiance of the field through a vignetted aperture according to the prior art. Line TV' indicates the extension of line TV beyond the masked field. Line TT1 indicates the irradiance of the field as described in FIG. 10A and FIG. 10B. Line TT1' indicates the continuation of lens TT1 beyond the field that has been electively masked at 80% of the field. FIG. 16B further illustrates that the irradiation of the image field self terminates abruptly when a lens system is formed according to the present invention. Furthermore, by comparing line TT1 and extension TT1' it is apparent that the irradiance of the field in a lens system according to the present invention closely conforms to the transmittance curves in FIG. 16A. FIG. 16C is a plot of two overlapping image fields in a lens array according to the present invention. A plurality of such rasterized microimage tiles are shown in FIG. 22. The tiled image blocks form a pattern which creates a continuous null region Z surrounding the image tiles T on the master image plane IPM. Line TT2 indicates the irradiance of the second field.

The principles described above may be applied to lens arrays and discrete lens systems. Although the lens array in the figures below are illustrated as arrays of lens systems having a selected, finite number of lens systems, it is to be understood that any lens arrays comprising an association of two or more lenses systems, wherein the lens systems process light in parallel, are within the scope of the invention.

In specific embodiments of the invention described the principle of optical field limitation and aberration correction will be applied. A specific embodiment described below relates to the capture, reproduction, and display of three-dimensional images. The invention provides a unique geometrical condition in which real images formed by the microlenses are each confined within an absolute perimeter, and in furthermore in which the efficiency of the TIR-induced falloff rate at the image perimeters approaches its theoretical maximum. Furthermore, total internal reflection may be used to restrict the angular emission during reproduction of microimages from a first lens array system to a second lens array system. In the following discussion it will be demonstrated that optical crosstalk can be effectively eliminated.

In the systems shown, any portion of any internal surface that is not accessed by rays in the active optical pathways is truncated. Regions not part of the optical corridor are generally assigned a secondary use, such as light absorption or diffusion. A useful construct in the present invention is therefore the geometrical oculus. In the invention, the caustic surface enclosing all rays converged by the aperture provided by first refractive surface geometrically intersects the second refractive surface. When this intersection is expressed throughout the system's full elected angular range, it sweeps out a perimeter on the second surface that defines a specific conformal contour. In extrusion geometries, the oculus will typically be delimited by two straight parallel boundaries on each successive surface. In simple geometries of revolution, the oculus is defined by a circle. In microlens arrays using geometries of revolution and imbricated tilings, the oculus is typically defined by a rounded polygon having a slight three-dimensional elevation. Normally, such an irregular oculus would be emulated in the actual array by a corresponding circular approximation. In some manufacturing processes where nonrotational surfaces are allowed, this more ideal but irregular geometry may electively be implemented.

An analogous contour may be similarly traced on the subsequent third surface. The iteration of successive oculi for a given first-surface aperture identifies the target dimensions of apertures within the optical corridor. In general, the active optical aperture in the invention is restricted as closely as possible to the geometrical oculi. In the illustrated embodiments of the invention, the oculus of the second surface is considerably smaller in dimension than the aperture of the first surface, due to the highly convergent optics of the convex first surface. However, because of the transverse shifting of oblique rays at the second boundary, the third oculus is typically slightly greater in dimension than the second, and the lens aperture at that location conformed accordingly.

In the invention, minimizing the apertures to conform with the geometrical oculi maximizes the interstitial area without degrading the primary focal function of the core optics. The interstices may then be exploited for light-controlling functions such as absorption and diffusion, which can improve brightness and contrast in the viewed image. A significant attribute of the geometry of the invention is that the oculi of the corrective second and third surfaces are each less than $D1/\sqrt{2}$, where D1 is the diameter of L1. This permits the corrective optics to be included in imbricated arrays having a square layout without clipping of the optical corridor. Such clipping would intrinsically introduce unwanted noise into the optical pathway. This geometry also allows structurally robust designs to be implemented, even when air is used as the low-index material, since each air space may be fully encompassed by an annular polymeric structural shell.

A minor exception to this recommendation is found in the case of images designed for viewing in reflection, as in the case of the fluoroploymer-filled array used to illustrate the invention. In this case, in order to minimize losses due to reflection at the second refractive surface, the second and third optical boundaries are slightly displaced from their ideal focal geometries in the direction of the focal plane. A subjective compromise between image brightness and array acuity is achieved. A collateral effect of this compromise is that a few extreme marginal rays bypass the aperture of the second surface at the most extreme incident angles. In this situation, the aperture of the second refractive surface is necessarily slightly less than that of the abstract geometrical oculus.

The low-index region may be located closer to the outer surface, and higher acuity obtained, when output luminosity is less critical, e.g. in a self-luminous display or in an image capture device. In the practice of the invention, it will be found that the distance between L2 and L3 generally increases with the refractive index of the primary array material; the average rate of curvature of the L2 and L3 surfaces also tends to increase with the refractive index. The distance between the L2 and L3 surfaces also increases as the index of the low-index region is raised above unity.

The function of the core optics is to precisely converge or collimate the light which allow images to be detected, recorded, or viewed. The currently envisioned applications involve three discrete classes of designs:

Field-limited Arrays: Field-limited arrays can use equiangular TIR at an internal air gap and light absorbent materials at the internal lens interstices to confine light to a central angular zone.

Open-field Arrays: Open-field arrays minimize internal and external reflections at the inner optical boundaries by replacing the air gap with a low-index polymer; interstices direct diffused light to the image plane by refraction, TIR, or diffraction.

Discrete Devices: Discrete devices using the same core optics may be used as a robust surface-mount image-capture lens for cameras or other electronic appliances; lens walls can include fresnel surfaces to deflect stray light from the sensitive areas of the capture device.

Assuming a microlens fill-rate approaching 100% and a near-hemispheric primary lens, the array may be considered fully field-limited at an index of ≈1.7, as this index would allow no cross-talk between microimage fields. In practice, transmittance, acuity, and cost factors would commonly militate in favor of more commonly available materials of somewhat lower optical density. The illustrations therefore presume the use polycarbonate ($\eta$=1.586) as the array material.

A diffractively achromatized array formed of a high-index polymer such as polyetherimide might capture or reproduce a field of up to 75°; polycarbonate arrays have a maximum field of about 65°. In the system shown, the microimage field identified with each lens will have an angular field of about 62° horizontal by 50° vertical. In practice, this would yield a nominal 60×48° image field. The intentional horizontal bias provides an accommodation of the interpupillary distance and of normal human perceptual behavior.

The structure and operation of the devices may be best understood by the following description and in concurrent reference to the figures. Micron measures cited below indicate the relative dimensions of arrays in the comprehensive system being described, whereas the absolute dimensions are provided to describe the each array self-referentially and respectively. The following geometries represent generalized cases based on a plane of rays produced on the meridional plane. Consideration of the saggital focus in a full grid of rays or with restricted aperures will cause the system to optimized somewhat differently. Some exemplary iterations of traces for rotationally-symmetrical lenses are provided in a supplimentary section at the end of this document.

In a Field-limited Array

Figure 17:
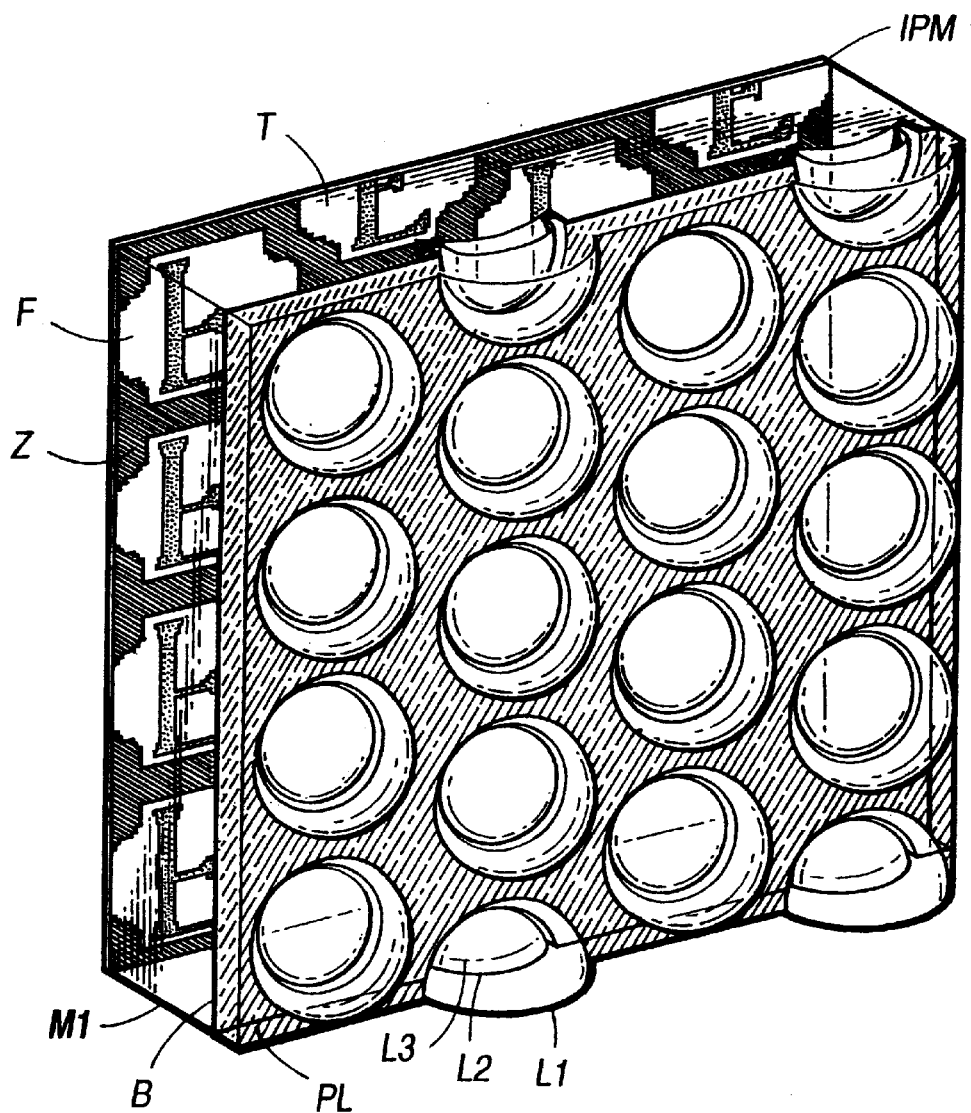
FIG. 17 is a perspective view of a a portion of an optically field-limited spherical lens array.
Figure 19A:
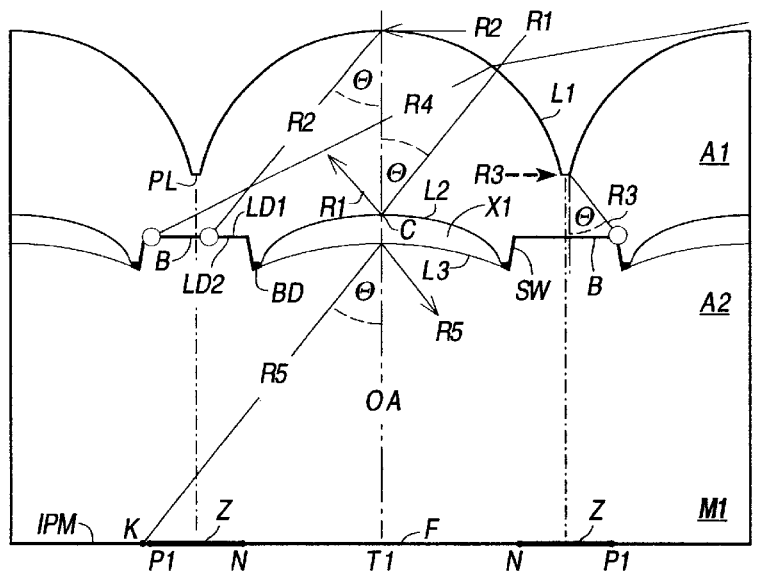
FIG. 19A is a schematic sectional view of a field-limited spherical-lens array formed according to the invention having effectively unrestricted apertures, indicating the relevance of certain key rays in the field-limited array.

FIG. 17 shows a perspective view of field-limited array M1 formed according to he invention. In the figure, refractive effects are ignored in order to reveal the structural features of the array. FIG. 19A generally illustrates the array geometry of open-field array M1. The sectional view shown in FIG. 19A is taken along the axis of nearest approach of the perimeters of the discrete microlenses; this sectional axis is indicated in FIG. 22. Dimensions of the illustrated versions of a field-limited array are given as a function of the L1 radius of curvature ($r_c$) of the spherical external microlens surface; $r_c$ is given herein as 120μ. The optics for both arrays will be in the following example assume a lens pitch of 240μ; on one axis, typically the vertical, the rows of lenses are offset from one another by half of the pitch. Micron measures based on $r_c$ will be given parenthetically. CL1 and CL2 represent the abstract limits of a lens cell on the image plane EPM of M1; distance CL1–CL2 is also (240μ). The following numbers are given as a generalized model to provide points of departure for a system design and to outline structural dimensions, and are not intended to limit the design to a specific scale or set of polynomial solutions. Dimensions would be expected to be modified by computational optimization of the design for a cylindrical or spherical application, or for a diffractively achromatized system.

The total length of the version of the field-limited array illustrated is given as $2.774r_c$ (332.9μ). Optical elements include:

1) in the outer lens array, an outer microlens surface (L1) of convex spherical geometry having a radius $r_c$ and being nearly hemispherical, having in the example shown an L1 sag height of $0.790r_c$ (94.8μ), a L1 lens diameter of $1.953r_c$ (234.4μ) and an associated sectional arc of about 156μ; lenses are arranged monolithically on a planar substrate PL, having in the case shown a minimum spacing between lenses of $0.047r_c$ (5.6μ).
2) in the outer lens array, an inner microlens surface (L2) of concave oblate aspherical geometry, generally having a rate of change of curvature equal to or greater than that of an ellipsoid (ellipsoidal or if necessary, hyperellipsoidal), and having a rate of curvature less than that of L1 in axial region but greater than that of L1 at the periphery, and furthermore having its vertex at center-of-curvature C of L1. The initial iteration of this surface is a surface of an oblate ellipsoid having its vertex at C1 and whose defining ellipsoid has a major axis of $1.286r_c$ (154.3μ), and a minor axis of $0.560r_c$ (67.2μ). If it is necessary to modulate the curve so that its rate of curvature is hyperellipsoidal, various added higher-order terms or exponential modifications of polynomial formulas might be used to arrive at workable solutions. The L2 sag height as shown is $0.266r_c$ (31.9μ), and the L2 lens diameter is $1.282r_c$ (153.8μ). The election of the L1 center-of-curvature for the vertex of L1 is a compromise; locating the vertex closer to L1 may generate better acuity, while locating L1 closer to the image plane may generate edge dropoff that more closely approximates the transmittance curve. The refractive acuity must also be evaluated in consideration of any diffractive achromatization at L2. Geometrically similar lands LD1 and LD2 have a minimum spacing of $0.555r_c$ (66.6μ), a depth of $0.148r_c$ (17.8μ) in outer array A1, a height of $0.180r_c$ (21.6μ) from the perimeter of L3 on inner array A2 and land side-walls SW have a slope
3) in the inner array, a convex microlens surface (L3), interactively designed with the L2 geometry. The L3 surface can under some conditions be approximated by spherical geometry, but will normally exhibit a prolate asphericity. L3 will thus typically possess a higher rate of curvature at the center than at the periphery; i.e, the L3 surface will generally be convex in effect but may be nearly flat at the perimeter. The maximum acuity at image plane IPM is expected to be produced when L3 is defined by a shallow hyperboloid, although a paraboloid or an ellipse can also approximate the surface. The sphere which most closely approximates the ideal surface is defined by center C, which has a radius of $1.782r_c$ (213.8μ). The approximating ellipsoid has a major (vertical) axis of $3.640r_c$ (436.8μ) and a minor (horizontal)axis of $3.804r_c$ (456.5μ). The vertex of L3 is separated from the vertex of L2 (at C1) by a distance of $0.156r_c$ (18.7μ). The L3 sag height as shown is $0.281r_c$ (33.7μ), and the L3 lens diameter is $1.374r_c$ (164.9μ).
4) in the inner array, a planar rear image surface IPM disposed at the focal length of the joined arrays. The location of the focal plane would be adjusted for any increase in converging power due to the addition of an achromatizing diffractive relief element to the L2 surface.

The proportioning of the low-index zone (X1) between the L2 and L3 surfaces is critical to the flattening of the image field. L2 and L3 will commonly encompass the center-of-curvature of the L1 surface. If the low-index material is air, then, at the optic axis, the region X1 separates L2 and L3 by a distance of approximately 0.16rc, where rc, is defined as the radius of the L1 spherical optical surface. The separation, i.e. the thickness, between the two L1 and L2 surfaces reaches a maximum at the optic axis. The proportioning of the low-index region (X1) between the L2 and L3 surfaces is critical to the flattening of the image field.

Prior to the assembly of the A1 and A2 into field-limited array M1, light-blocking cement B is applied to raised lands LD2 on A2. On assembly, LD2 meets recessed land LD1, forcing cement onto sidewalls SW, and leaving cement overflow BD in non-critical areas. Lens interstices are thus made substantially opaque.

Figure 19B:
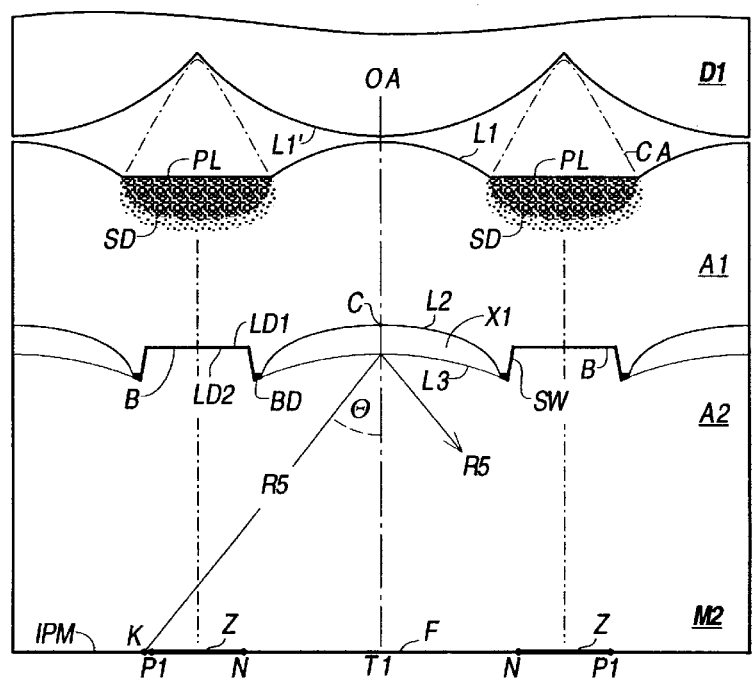
FIG. 19B is a schematic sectional view of a field-limited spherical-lens array formed according to the invention, having a external aperture stop at the first opitcal boundary.
Figure 19C:
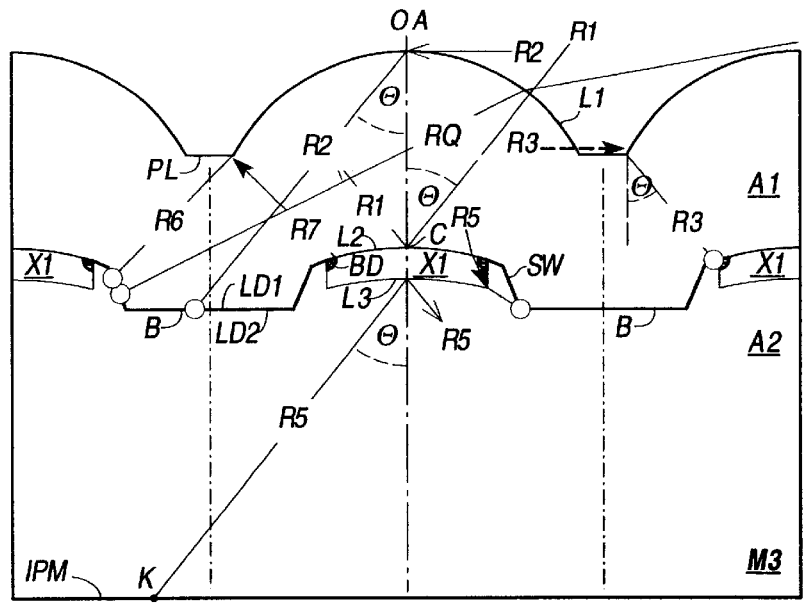
FIG. 19C is a schematic sectional view of a field-limited spherical-lens array formed according to the invention, having a internal aperture stop at the second optical boundary.
Figure 19D:
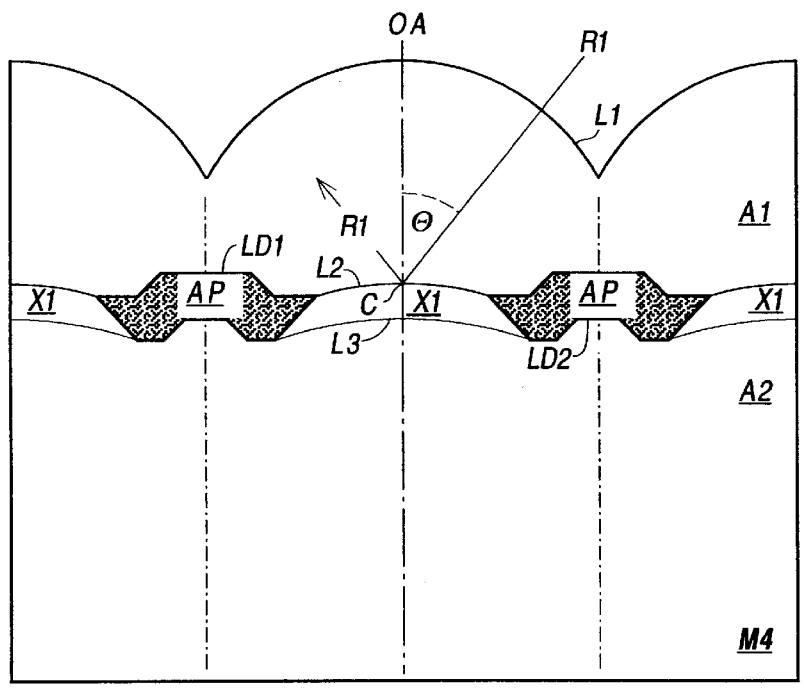
FIG. 19D is a schematic sectional view of a field-limited spherical-lens array formed according to the invention, having an integral grid of beveled aperture stops at the second optical boundary.

FIG. 19A shows the full geometry of the optical boundaries. Subsequent figures show variations of the field-limited design. FIGS. 19B, 19C, and 19D were derived from optical data for a 160° lens pitch, and all are substantially diffraction limited at that scale. This performance is equated with reducing one aperture to approximately 60% of its full diameter. FIG. 19B shows an array with an internal geometry similar to that shown in FIG. 19A, but with dye sublimation aperture stop SD at L1. The array of FIG. 19B would typically be used to convey a master image to a duplicate. Dye sublimation stop SD is created by printing a perforated lattice on a flat polycarbonate substrate and the thermoforming the L1 lens relief in the material. At the glass transition temperature is obtained, the dye sublimates into the polymer. The interstitial area PL can be flat as shown. Alternately, conic alignment features CA can be included in the forming mold to ensure registration with D1.

FIG. 19C shows simple diffraction-limited array M3, which may be used for high-resolution viewing. Stray ray R5 is deflected by the transparent inner sidewall but is trapped by light-blocking material B at outer sidewall SW. Ray R6 is reflected by TIR at PL and he absorbed at SW.

Land PL will therefore have a black appearance at all viewing angles. AL indicates the theoretical focal spot size in the design, given a 160μ pitch. The image can be extended nearly to point K, at which TIR at L2 totally occludes the image. The viewer sees a maximum 75° field that fades, due to defocus and diffuse reflection, as it approaches the limit of the field. In FIG. 19C, the evenly dashed lines indicate the continuation of ideal lens geometries.

FIG. 19D shows tripartate array design M4. The design three layers are devised to self-align. Futhermore, at 160μ, no part has a sag height of more than 7μ. The molds for all three parts are therefore readily devised by photoresist-base processes. The imbricated packing of the L1 lenses provides a brighter image, but a reduced angular field, typically 60°.

The enclosed region X1 and the surface geometry of the L2 and L3 surfaces allow much of the spherical and field-curvature aberration to be corrected. The reduction in these prominent aberrations brings chromatic aberration to the foreground, where it in turn may be adjusted by the use of a hybrid microlens in the L2 (or L3) location. Corrective aspheric terms may be optionally introduced in diffractive component AC.

In an Open-field Array

Figure 18:
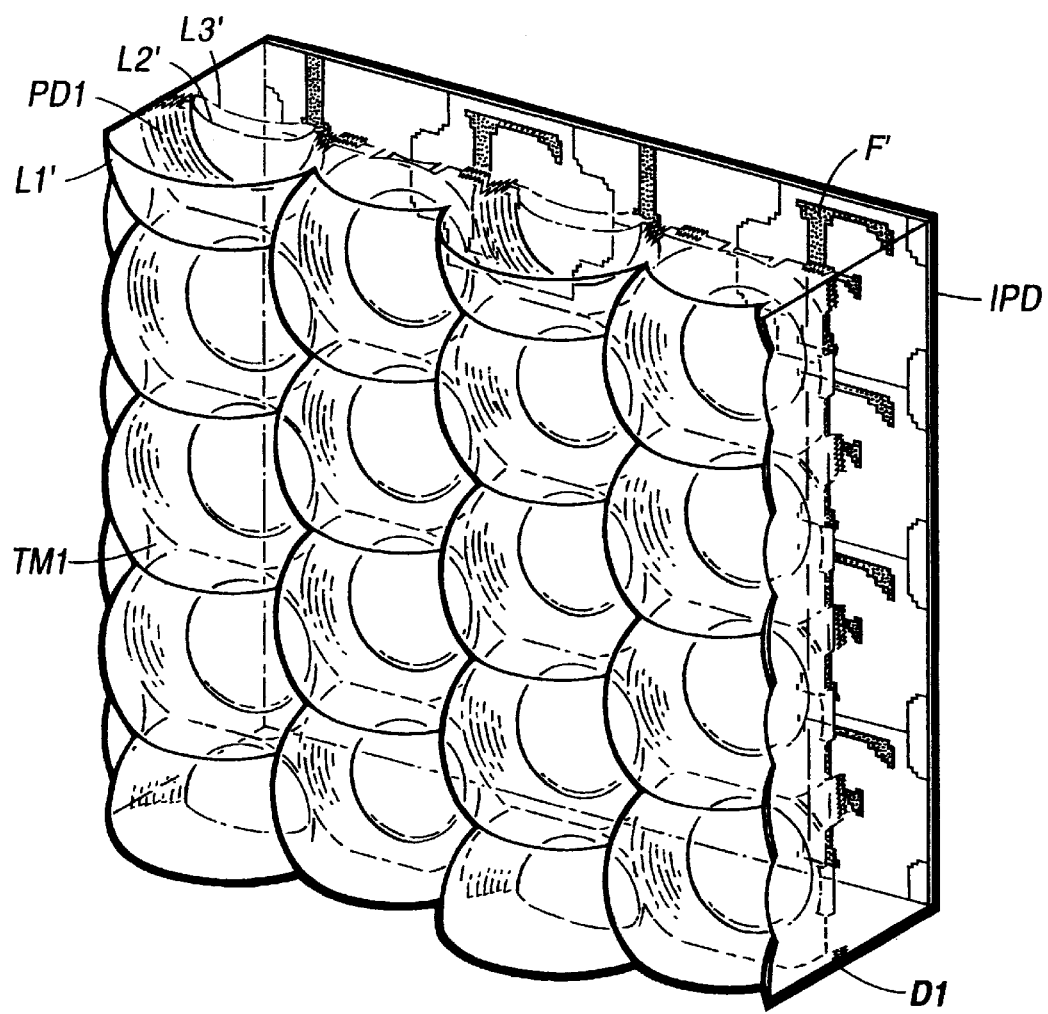
FIG. 18 is a perspective view of an open-field, three-element spherical lens array.
Figure 20A:
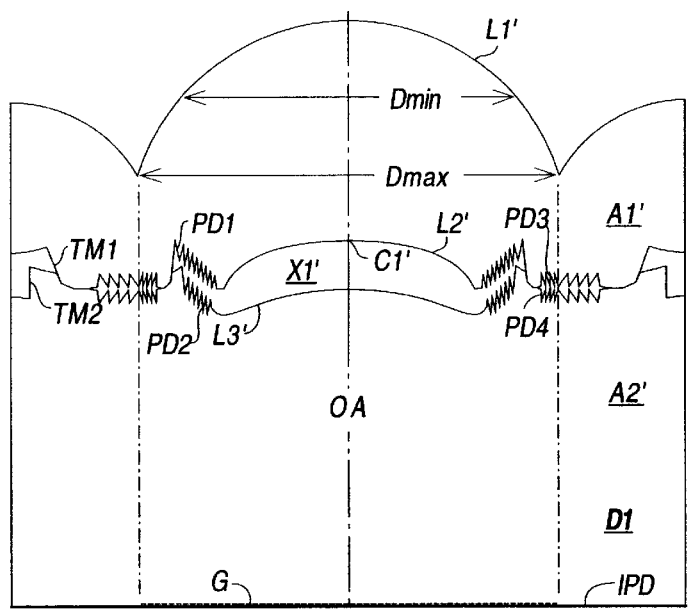
FIG. 20A is a schematic sectional view of a open-field spherical-lens array formed according to the invention.
Figure 20B:
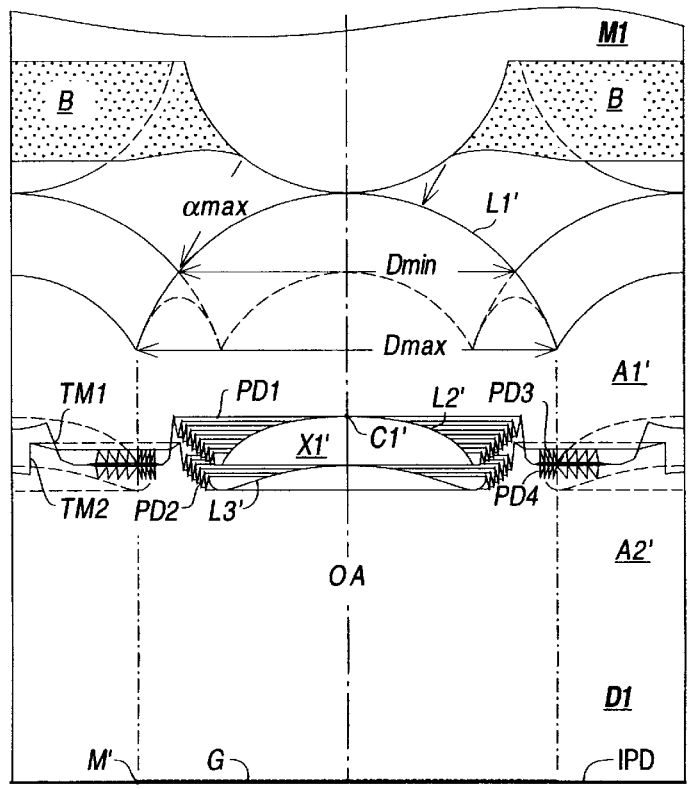
FIG. 20B shows a cutaway view of the open-field array of FIGS. 18 and 20A showing the imbricated first-surface lenses and the annular prismatic diffusers, and also partially showing a coaxially aligned field-limited array.

FIG. 18 shows a perspective view of an open-field array commensurate with the area of the field-limited array shown in FIG. 17. FIG. 20A shows a schematic section of the an unconstrained array. The most descriptive sectional axis was selected for the figures relating to each array. Prime marks (') indicate features analogous to those in the field-limited array. FIG. 20B shows how an L1 aperture stop in master array M1, here shown with light-blocking material B applied, allows light to be conveyed to D1 without engaging neighboring cells.

When air is the low-index material as in open-field array D1, the relative refractive index is in the vicinity of that of the array material. However, when a fluoropolymer is used, as for images viewed in reflection, the relative refractive index at the high-index polymer/low index polymer boundaries is in the range of 1.10–1.28.

The refractive index of the polycarbonate A1' and A2' component arrays are given as 1.586, while the η of the low-index fluoropolymer enclosed in region X1' is given at 1.360, yielding a relative index of 1.166. Therefore, in order to obtain the desired corrective effect, geometries are required generally having greater rates of change of curvature than those, like M1, in which the aberration correction is addressed by air/polymer boundaries.

In fluoropolymer-filled arrays designed for direct viewing, where no angular light control is needed, the equiangular reflective condition is moot, and the description of these surfaces can effectively ignore that issue in favor of aberration correction. However, because of the internal boundaries, open-field arrays nevertheless contain TIR mirrors, although TIR commences at a much less acute critical angle than at air/polymer interfaces (59° vs. 39°). When the vertex of the L2' surface is located significantly above the L1' center point, both reflection and refraction of ambient light out of the array increase, and light transmitted to the graphic surface is compromised. This deflection can perceptibly diminish the brightness an image viewed in reflection under ambient light. For this reason, the designs will usually not maximize the difference between the indices of the polymers, but will instead elect to employ the lowest relative η capable of providing acceptable aberration correction. Solutions will therefore generally be sought in the approximate form shown, which allows the passage of a preponderance of the light that enters via the L1' boundaries.

In order to approach a 100% fill-rate, lens perimeters are geometrically truncated so as to a have a nominally hexagonal perimeter in order to conform to a periodic array layout; actual intersections are arcuate and are carried on in six discrete planes parallel to the optic axis. The hexagon has two longer sides of equal length, and and four shorter equal sides. Sides of the hexagon are parallel with respect to their opposites.

Because the two arrays may be employed jointly in a replication process, some special descriptions interrelating the two arrays are required. Again, generalized dimensions of the illustrated versions of a field-limited array are given as a function of their L1' radius of curvature (in this case designated $r_u$); however, while $r_u$ is given as unitary value in reference to absolute proportions, in this specific application, $r_u$ is roughly ¾ of the radius of rc. The illustrated open-field design furthermore has a converging power about 5% greater than that of the field-limited array shown. These two factors together compose a system that provides a 5:4 mapping of the original microimage in the field-limited master to the open-field duplicate, which may be used, for example, to eliminate the dim peripheries of directly-recorded images.

In the reproduction process, it is desirable that the lenses align; the lens pitch of the field-limited array is also, like the field-limited array previously described, given as 240μ; however, the L1' lens radius (ru) is given as 157.51μ versus 120μ for $r_c$ of the field-limited array. Therefore, the generalized dimensions are internally consistent for each array, but because $r_u$ differs from $r_c$, the micron dimensions reflect the proportions of the difference between the L2 and L2' radii. Micron measures based on $r_u$ will again be given parenthetically. Dimensions other than the pitch and the L1' radius are again expected to be modified by the diffractive achromatization and computational optimization of the design.

The front focal length (f1) of the version of the open-field array illustrated is tentatively given as $2.648r_c$ (417.1μ). Optical elements include:

1) in the outer lens array, an outer microlens surface (L1') of polygonal perimeter and of convex spherical geometry having a radius $r_u$ and being nearly hemispherical, having in the example shown a maximum L1' sag height of ≈$0.70r_u$ (110.2μ) and a minimum sag of ≈$0.35r_u$ (55.1μ), a maximum L1' lens dimension ($D_{max}$) of $1.905r_u$ (300μ) and a maximum associated sectional arc of about 144°. Since the lenses are polygonal and arranged in offset rows, the $D_{max}$ (300μ) exceeds the lens pitch. The minimum dimension ($D_{min}$) on the same axis is $0.6*(D_{max})$. The minimum lens width is $0.8*(D_{max})$.

2) in the outer lens array, an inner microlens surface (L2') of concave oblate aspherical geometry, generally having a rate of change of curvature equal to or greater than that of an ellipsoid (i.e., hyperellipsoidal), and having a rate of curvature less than that of L1' in axial region but greater than that of L1' at the periphery, and furthermore having its vertex at in the vicinity of center-of-curvature C1' of L1'. The initial iteration of this surface is a surface of an oblate hyperellipsoid having its vertex at C1' and whose defining dimensions are given by the values below. Polynomials might be derived by modification of the root powers of an elliptical equation.

Approximate sag heights are provided as a function of the L1' radius (157.5μ):

where $r_u$ is the radius of curvature of L1' in the open-field array, where d is the distance from the optic axis, as a function of $r_u$, where $S_{L2}$ is the external sag height at that location as a function of $r_u$.

| d | OA | 0.05 | 0.10 | 0.15 | 0.20 | 0.25 | 0.30 | 0.35 | 0.40 | 0.45 | 0.50 | 0.55 |
|---|---|---|---|---|---|---|---|---|---|---|---|---|
| $S_{L2}$ | 0.216 | 0.215 | 0.213 | 0.209 | 0.203 | 0.195 | 0.184 | 0.170 | 0.151 | 0.126 | 0.091 | 0.035 |
| μ | 34.02 | 33.86 | 33.55 | 32.92 | 31.97 | 30.71 | 28.98 | 26.78 | 23.78 | 19.84 | 14.32 | 5.12 |

The optically active L2' diameter is $1.139r_u$ (179.4μ). The L2' sag height is $0.216r_u$ (34.02μ).

The election of the L1' center-of-curvature for the vertex of L1' is a compromise; locating the vertex closer to L1' may generate better acuity, while locating L1' closer to the image plane may transmission to the image plane. The refractive convergence must also be intermodulated any diffractive surface features of the L2' surface, with the requisite phase delays based on the relative index of the polymers.

3) in the inner lens array, an inner microlens surface (L3') of predominantly convex geometry, but whose surface reflexed at near its perimeter. In designs using low-index fluoropolymers, L3' surfaces will usually be reflexed roughly in the manner of a Schmidt telescope corrector in order to supplement the corrective effect of the L2' hyperellipsoid. Higher order terms may be added to a spherical surface to create the desired reflexed L3' surface. Approximate sag heights are as follows:

where $r_u$ is the radius of curvature of L1' in the open-field array, where d is the horizontal distance from the optic axis as a function of $r_u$, and where SL3 is the internal sag height at that location as a function of $r_u$.

derived. The acuity of imaging lens systems is generally center-weighted. Because the eyes fall at separate locations on the focal surface, and because the image is viewed at a variety of angles, conventional center-weighting would provide little value.

In addition to the core optics, open-field arrays would commonly include diffusing elements in their interstices. The example shown illustrates a highly effective arrangement, in which high aspect-ratio annular ridges surround the L2' and L3' core optics. The steep slope of he ridges, typically 2:1, and the predicted angles of the convergent incident light combine to produce multiple reflections within and between the ridges, dispersing the light at shallow angles over a broad internal distribution field on the image plane,despite the relatively low relative index of refraction at the polycarbonate/fluoropolymer boundaries.

The pitch of the arrays may be electively reduced, for example, to 160 microns, in order to simplify fabrication of the inner surface by microlithographic processes.

In Discrete Devices

Figure 34:
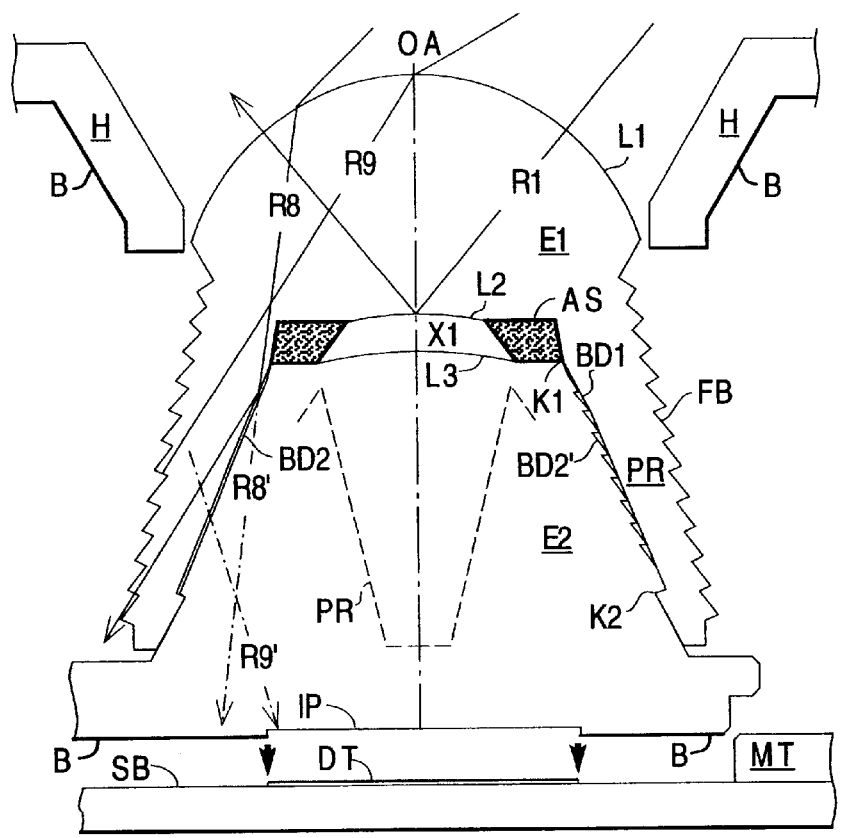
FIG. 34 shows a discrete imaging device in accordance with the invention.

A discrete imaging device is shown in FIG. 34. Because of the wide angular field and the simplicity of the optics, the designs might find applications as solitary systems. Either type of design, field-limited or open-field, may be used as a basis of a discrete design. A concern in such systems is the possibility of internally-reflected light from the side-walls reaching the detector surface. This may be disabled by a light-absorbing coating, sloping internal side-walls conically away from the lens, or dispersing stray light by the use of fresnel surfaces. A beveled washer is commonly expected to be used an aperture stop. The f2 system can produce a video-quality signal, while remaining under 3 mm in its longest dimension, and requiring only three fabricated parts. The design is therefore suitable for various portable electronic devices.

| d | OA | 0.05 | 0.10 | 0.15 | 0.20 | 0.25 | 0.30 | 0.35 | 0.40 | 0.45 | 0.50 | 0.55 | 0.60 | (0.625) |
|---|---|---|---|---|---|---|---|---|---|---|---|---|---|---|
| $S_{L3}$ | 0.112 | 0.111 | 0.109 | 0.105 | 0.098 | 0.089 | 0.078 | 0.066 | 0.050 | 0.033 | 0.016 | 0.002 | 0.007 | 0.034 |
| μ | 17.64 | 17.48 | 17.16 | 16.54 | 15.43 | 14.02 | 12.28 | 10.39 | 7.875 | 5.197 | 2.520 | 0.315 | 1.102 | 5.355 |

The optically active L3 lens diameter is $1.250r_u$ (196.9μ). The reflexed surface has a tangency to a plane perpendicular to the optic axis at a radius of approximately $0.571r_u$ (89.93μ) from the optic axis. The vertex of L3' is separated from the vertex of L2' (at C1') by a distance of $0.218r_u$ (34.33μ). The L3' sag height as shown is $0.112r_u$ (17.64μ).

4) in the inner array, a planar rear image surface IPM disposed at the focal length of the joined arrays. As above, the location of the focal plane would be adjusted for any increase in converging power due to the addition of an achromatizing diffractive relief element to the L2' surface.

Ideally, the integrated core optics would be optimized in consideration of all available degrees of freedom. The weighting of factors for a given optimization would depart from standard lens design practice. Distortion would generally be given zero weight since it has a null effect on a properly devised three-dimensional image, regardless of whether the image is directly captured or synthetically

Modifications for Field Focus

Despite its being intrinsic to visual perception, and to focal optics in general, the matter of array field focus has rarely been raised in the context of microlens displays. However, in the invention, the acuity can be sufficiently high that field focus is no longer made undifferentiable by random deviations. The microlenses will therefore be devised to produce a slightly divergent, rather than collimated, optical output.

Figure 28A:
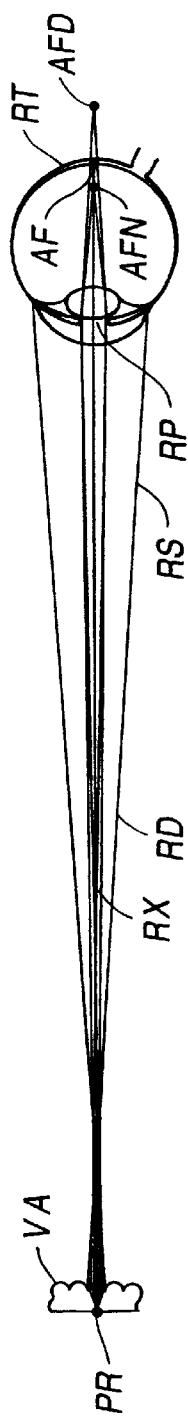
FIG. 28A is a schematic view of the emission of light from a conventional array of lenses.
Figure 28B:
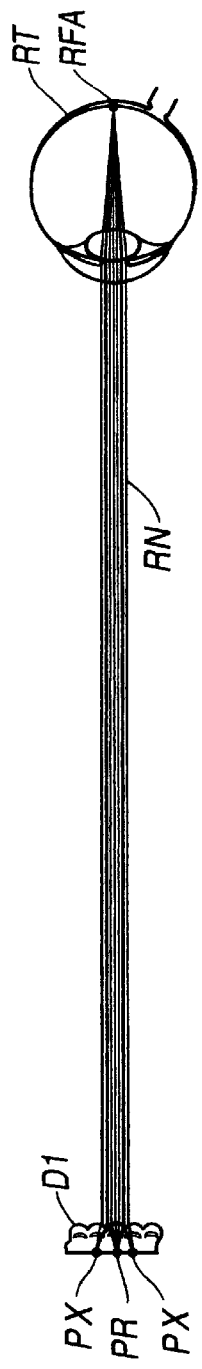
FIG. 28B is a schematic view of the emission of collimated light from a lens array according to the present invention.
Figure 28C:
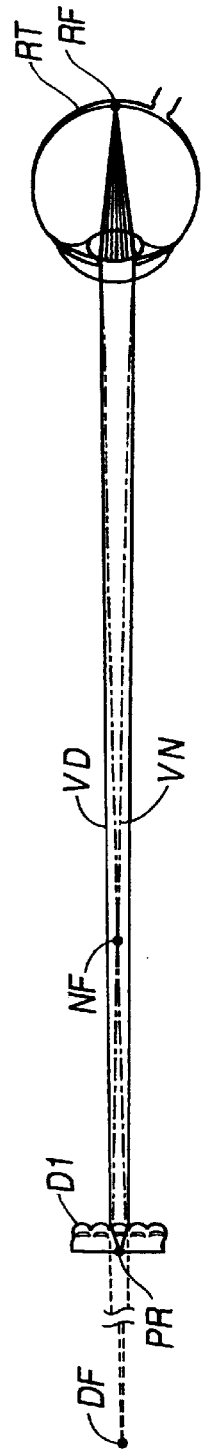
FIG. 28C is a schematic view of the emission of light at a predetermined vergence angle.

Schematic drawings of various viewing situations are shown FIGS. 28A through 28C. In a real scene, the lens of the eye accommodates to adjust to the focal geometry of subjects located at a particular distance. Because of the aberrant optics of arrays traditionally used for 3D imaging, the subject distance that the image could be said to emulate has been indeterminate. This circumstance is illustrated in FIG. 28A in which UA is an uncorrected array, PR is a radial point emission from the graphic surface. The resulting ray set produced by the lens includes diverging rays analogous to those produced by real subjects, but also includes cognitively inconsistent rays such as crossing ray RX and stray ray RS. The set of rays RP captured by the pupil cannot be converged at a point and instead produces an astigmatic focus at AF on retina RT, intermediate between the near focus AFN and the distant focus AFD. Stray rays fall into other viewing angles as ambiguous image data.

Radiation emission from real objects is often considered as the collective effect of an infinite number of radiating point sources located on the surface of the object. The radiating sources combine diffractively into a generally convex wavefront. As the distance between the object and the observer increases, the portion of the convex wavefront sampled by the iris decreases, and the wavefront's effective surface curvature also decreases accordingly, approaching planarity at an infinite viewing distance. The ciliary muscles which deform the eye's lens are relaxed at an optical circumstance coinciding with this infinite focus. Therefore, many optical systems, including spherical and cylindrical lens arrays used for three-dimensional imaging, have taken this "relaxed at infinity" as the premise of their design; arrays have thus been designed to collimate rays directed to the viewer.

This assumption essentially presumes the imprecise optical output shown in FIG. 28A, in which the pupil is overfilled by the output of the microlens. In a corrected optical system such as array D1 in FIG. 28B, collimation will generally cause the pupil to be underfilled. The eye is focused at infinity, but accepts rays RN produced from points PX in neighboring microimages, generating and ambiguous retinal focal spot at RFA.

A preferable condition is shown in FIG. 28C. If the lens width and the viewing distance are known, a vergence angle may be determined that produces an unambiguous focus at RF. The array optics are expressly devised to produce a divergent ray set that fills the no more and no less than the pupillary area. The optical situation emulates a condition to which the eye is well adapted, and all rays in the image may be brought in focus at the retina at RF without the ambiguities inherent in the stray light shown in FIG. 28A or the underfilling shown in FIG. 28B. Vergence angles, being the full angular difference between outermost divergent rays VD will typically be one degree or less. In the general case, the vergence angle may be said to be found by taking the pupil radius, dividing it by the viewing distance, taking the inverse sine of this quotient, and multiplying the result by two. For example, a 300 mm viewing distance, a 4 mm pupil, and a 250$\mu$ spherical lens will yield a vergence angle of 0.716°, and, since (0.25/tan 0.716°)+300 mm, an emulated focal distance of about 320 mm, shown in FIG. 28C as distant focus DF. An angle of 0.763$\mu$ is associated with a field focus at the actual image plane. The slightly divergent condition may be arrived at by various modifications of the design of array D1. The slope of the perimeter of L2 may be decreased, or the slope of L3 increased, to locally reduce the converging power of the system. The outer L1 surface may be assigned a slight prolate asphericity. The divergent ray set can also be produced by designing the system for collimated output, and then altering the focal length so that the system length is less than that specified for collimation.

Operation of Field-limited Arrays

The structure of the field-limited arrays allows them to be used either as a capture or display devices. A principal advantage in either case is the ability to regulate the angular field of light traversing the array. The design shown is proportioned to substantially eliminate light which would otherwise, in a capture or reproduction mode, contaminate microimages by passing through one lens cell and into the internal aperture of a neighboring cell. The unique geometric relationship of the features of the array shown, in combination with the inclusion of light-blocking material at the internal interstices, substantially precludes the passage of light via the planar regions between the lenses on the outer surface of the master array. The converged microimages are uncontaminated by stray light which would otherwise arrive on the microimage plane via these external interstices.

The field-limited array M1 was designed with particular attention to the critical angle θ. Arrays of the M1 type would commonly be used in electronic or emulsion capture devices, and as master images for graphic reproduction, or for backlit displays. In FIG. 19A, A1 and A2 are the two arrays joined to form the master array M1, X1 is an air gap and B is light-absorbent cement bonding the two. OA marks the optic axis of the lens cell. C is the center of curvature of L1. T1 is an image tile of irregular profile, which is described in detail in FIGS. 22 and 25. Points N represent the symmetrical limits of the tile. Letter F generally represents any graphic pattern within the tile, whether a projected real image or a developed photographic emulsion; at higher microimage resolutions, the pattern will be recognizable as a figural approximation of the scene to be represented.

Four specific circumstances in which the critical angle bears on array performance, characterized by rays R1, R2, R3, and R4, are shown in FIG. 19A.

First, a distinctive aspect of the array design is that, especially in arrays where air is the low-index material, the refractive optics of the concave L2 surface tend to generate an internal surface which becomes abruptly reflective at a given viewing angle. This result is due to the fact that, at a predetermined viewing angle, each ray in the caustic cone of rays converged by the outermost microlens L1 surface is in a substantially equiangular relationship with the L2 surface. This reflective effect is represented schematically by the ray R1; all rays arriving on L2 at angles greater than θ will be reflected away The total reflection will occur not just at the optic axis, but virtually simultaneously for all rays associated with that incident angle. The critical angle at $\eta=1.586$ is about 39°; the incident field angle (or the corollary viewing angle) that produces this condition at L2 is substantially the same (39°) for solutions which specify an L2 surface having its vertex at the geometrical center of the spherical L1 surface. All lenses are ultimately limited by internal reflection.

Referring again to FIG. 19A, it may be understood that, at a certain refractive index, the circular microimage will be contained within the mathematical projection of the hemispheric outer lens diameter P1 on the focal plane. The point at which this may be obtained is in a purely refractive system is in the vicinity of $\eta=1.7$. However, at such a high index, a considerable region at the periphery of the image would contain image data too reduced by reflection losses to be useful. To this unusable penumbral perimeter would be added any interstitial areas left by the imperfect tiling of the circular microimages. The graphic surface may be more efficiently employed if a somewhat lower-index material such as polycarbonate is used and microimages are allowed to overlap in a conscientiously arranged null zone (Z). Since two penumbras overlap in the same area, and since the blank microimage interstices are eliminated, this arrangement can essentially halve the inoperative area of the image field. The null zone in this application resembles a hexagonal lattice. Image tile T1 is electively limited at points N, so that all points in the image are unambiguously associated with the image formed by the primary lens cell.

Second, in order to guarantee uncorrupted microimages, light must also be prevented from passing to an adjacent lens cell through the optically open regions in the outer array. This exclusion of stray light is provided in the illustrated embodiment by a displaced relief boundary coated with light-absorbent adhesive. In FIGS. 19A and 19C, a circular line terminus represents a ray which is absorbed by light-absorbing material B. R2 is the outermost marginal ray that may be conveyed by the convex L1 surface. However, a few paraxial rays (typified by the line PA) surrounding the theoretical chief ray contained within the the half-caustic, and arriving on L1 at incident angles of less than 13° from the image plane, would be transmitted through the neighboring cell, were they not intercepted by the displaced, light-absorbing relief boundary at the the lens interstices. Therefore, it may be generally seen that all light falling outside the dedicated core angular region via L1 may be fully trapped by the light-blocking material at the internal interstices. Each minute optical system, consisting of a region of the planar rear surface and a coaxial L1, an L2, an L3 surface, is thus functionally isolated from each other lens cell.

Third, light arriving from the scene onto the planar interstices in the outer surface must also be discouraged from entering the inner optics. Ray R3 represents the theoretical extreme ray. In practice, surface reflection at the angle shown would be total and transmission at the refracted angle null. Furthermore, the situation if geometrically forbidden by the close spacing of the highly convex L2 lenses. However, it may be seen by this theoretical extreme case that all undesirable light is blocked by the material B, since any other ray will have a value smaller than θ, and will thus be trapped by light-absorbing material B at the internal interstices. As long as this angular relationship between the L1 and L2 apertures is fulfilled, no light-blocking means is required at the external interstices.

Fourth, a TIR effect is produced at the L3 surface with respect to any light emitted from the master microimage plane (EPM). Light reaching the internal surface of L3 from any point K beyond a certain radius from the point where the optic axis intersects the microimage plane is fully reflected back toward the image plane. This substantially equiangular state is characterized schematically by ray R4. That radius can be made to substantially correspond with the circular perimeter P1 of the converged real microimages. While the originating equiangular conditions differ, their angular effect can be made commensurate for both surfaces; this invisible barrier allows light or images to be both captured by and reproduced from the array from closely matched regions of the image plane, without any undesirable communication with neighboring image zones. The perimeter of the common circular region is indicated as P1 in FIG. 22.

Finally, the array is devised so that excess light-blocking material can flow into X1 during assembly without having a practical effect on the array optics. Cement bead BD entraps excess cement in an optically inactive area of the array. Tolerances for the precise metering of the light-blocking cement are therefore eased, and the constituent arrays may be assembled without degradation of the array optics.

The acuity of the array may be enhanced in some circumstances by providing a restrictive aperture. In arrays designed for use as masters, the location that yield the best results is at the L1 surface, as shown in array M1. This location deters light from spilling into adjacent lenses when the transmission is made to duplicate array D1. This generally requires that the full geometric surfaces of L1 and L2 be formed, and requires an aperture stop at the outer surface of the array. This aperture stop may be fluid light-absorbing material applied to the surface, may be sublimating dye which was printed on the sheet prior to thermoforming, or may be a discrete mesh. In applications in which the array is to be used for viewing, the location of the aperture stop is less consequential. FIG. 19B shows a field-limited array that may be used for high resolution display output. Case 2 of the examples considers a lens having an L1 having a radius of curvature of 80μ and being 140μ in diameter. The simpler structural arrangement shown in FIG. 19B is therefore preferred. The fact that L2 and L3 are essentialy the same diameter in FIG. 19B causes some vignetting of the cone of rays. The effect that causes the vignetting also eliminates some of the extreme rays in the full-field spot; in the version shown in FIG. 19B, the resolution can be diffraction-limited across the field. The Airy limit is unaltered on-axis, remaining at about 1°; the Airy limit at the full-field locations will be increased to about 1.3° by the vignetting. The residual field curvature that causes the elongation and enlargement of the full-field spot is reduced by restricting the aperture; this restriction in turn increases the size of the Airy spot. If each focal spot is construed as a potential discretely resolvable view, the lens cell could be understood, in theory, to include over 20,000 views. In practice, the array can readily resolve the 1600 pixels within tile T.

The modified optical geometry in array M2 requires some accommodations in the structure of the array. Rays R1 through R4 perform analogously to those in FIG. 19A. However, stray light can be refracted at sidewall SW. Lands LD1 and LD2 must therefore be arranged to intercept all rays that exceed the core optics. It may be understood by the circular terminus at the continuation of ray R5 that all stray rays are blocked by light-blocking material B. As noted, some vignetting of the transmission will occur, but this can be compensated for in the image formation phase by exposure adjustments or by computational filtering during image processing.

As noted earlier, images viewed in reflection would generally be encouraged to accept as much light as possible from the environment, and so would be designed to disable most internal reflection and interstitial light absorption. In backlit images, however, total internal reflection and light blocking interstices may be exploited to mask erroneous blurred or pseudoscopic versions of the scene. A viewer would see the proper illusion over the central orthoscopic viewing range. At angles approaching the limit of the viewing field, the scene would abruptly dim, and, beyond the field limit, only diffused ambient light would be observed. The L2 surfaces essentially become perfect convex micromirrors beyond that point. Therefore, when a field-limited array is used for viewing, the angular field beyond the central focal zone presents only diffuse reflection from the ambient scene. In a situation where the ambient environment is dimmed, the image appears substantially black when viewed from wider angles, since almost no light is produced by the dimmed ambient environment to be reflected from the mirroring surfaces.

Lens flare or ghost images in the captured record, and loss of contrast in the viewed images, are problems conventionally associated with surface reflection. Surface reflections may be addressed in a given design by various means. They may be addressed by one or more of the following methods:

1) antireflective (AR) coating(s), 2) AR subwavelength relief elements, 3) reconvergence, 4) the reduction of the relative refractive index at one or more optical boundaries.

Conformal monolayer AR coatings are ineffective near $\eta=1.5$, and in any case would involve at least one additional manufacturing step in a material where unit low cost is critical to commercial viability. However, a low-index quarter-wave monolayer has been effectively implemented on polyetherimide arrays ($\eta=1.65$). The practice of applying one or more transparent conformal layers to suppress surface reflection is well documented in the prior art. Two alternate methods may be usefully combined with the invention.

Figure 33:
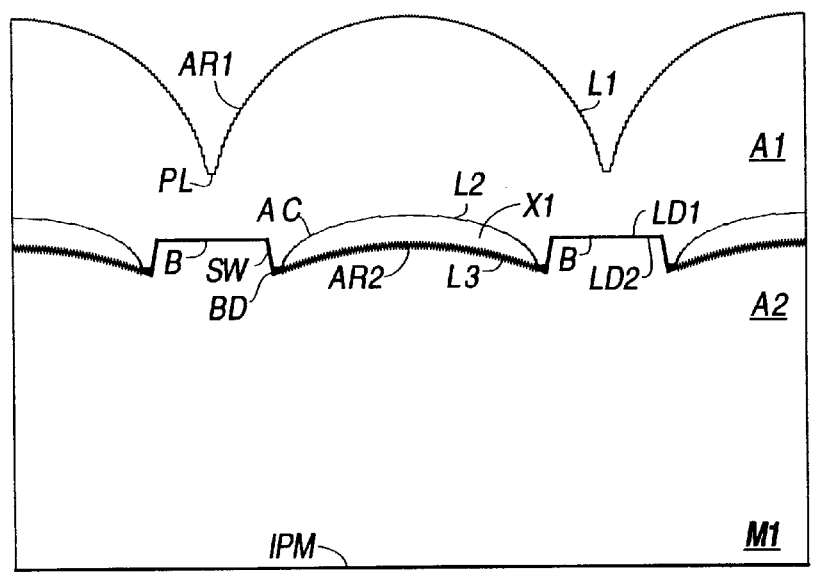
FIG. 33 shows an array having subwavelength antireflection relief elements.

First, surface reflection from the arrays is may be significantly reduced by the inclusion of subwavelength AR relief elements. Such structures are a well-known adaptation in nature, and may be industrially reproduced by methods such as holographic projection into a photosensitive polymer. Array M1 in FIG. 33 is shown having such structures at AR1 and AR2. The individual elements are generally conic in shape, and are disposed over the entire optical surface. Because the scale of the conic structures is significantly less than the period of the wavefronts, the structures are not resolved by the wavefronts. Therefore, instead of diffraction, the conic taper produces an emulation of a gradient in the refractive index. The gradient substantially undermines the boundary effect that produces surface reflection. Because the effect of a gradient can be produced using a monolithic material, the optical surface including the AR relief may be replicated to a mold, so that each part produced from that mold will emerge having non-reflective surfaces, without the need to resort to additional manufacturing processes. The AR relief features are generally prescribed to have a height and period equal to no more than half the wavelength of the shortest significant waves in the system. At air/polymer boundaries in visible-light systems, this commonly results in solutions in which the height and period of the AR elements are in the vicinity of 200–300 nm. As a general rule, the height of the AR structures is given so as not exceed 40% of the value of the longest significant wavelength in the system, and the period of the structures is given so as not to exceed the shortest wavelength divided by the effective refractive index. The visible spectrum lies between 400 and 700 nm. Taking 700 nm as the upper limit of the visible range yields a minimum feature height of 280 nm. Taking 400 nm as the lower limit and a refractive index of 1.586 yields a minimum spacing of about 250 nm. At polycarbonate/fluoropolymer boundaries, the scale of the elements may be modified in proportion to the effective wavelength in the materials.

AR structures may vary significantly in form and still be effective. They may be regular or irregular in height or or period, and can depart from strict conic geometry to satisfy other parameters. High aspect-ratio subwavelength structures AR2 might be used on the internal L2 and L3 surfaces, which will be permanently protected from abrasion and would tend to have lower rates of curvature. More robust, lower aspect-ratio structures AR1 might be formed on the hemispherical L1 external boundary, where the draft angle required for unmolding the surface, and exposure to surface wear, might preclude the use of fragile high aspect-ratio structures. In general, the elimination of a significant portion of boundary reflections would increase sharpness, contrast and luminosity in the viewed image. While technically feasible, AR structures at the polymer/fluoropolymer boundaries would be unnecessary, since reflection at most viewing angles would be less than 1%, compared to 5+% at a typical air/polymer interface.

In a second method of addressing the effects of surface reflection, the array may be designed to align a potential ghost image with the primary real image. In microlens systems that include an air-lens, light re-reflected between the L2 and L3 surfaces can become highly convergent, producing a potential ghost image at the focal plane. Because the array geometry causes the secondary image to closely overlay the primary real image, some solutions will allow re-reflected light to align with the primary convergent cone of rays, so that the two images are coincident on the focal plane. This geometry subverts the potential ghost image, which otherwise might be detectable at the perimeter of the microimages, and thereby reduces the need for antireflective structures. Generally, the acuity of the array is expected to be the foremost design goal, and antireflective relief features are expected to be the primary method used to reduce the significance of ghost images. However, other factors being equal, an array design with greater degree of reconvergence would be preferred.

Operation of Open-field Arrays

In FIGS. 18, 20A, 21 and 25, prime marks (') indicate features analogous to those in the field-limited array. The refractive indices which generate useful, angle-restricting internal reflection effects for wavelengths in the range of visible light typically fall between 1.55 and 1.70. The associated critical angles fall between 40° and 36°. In field-limited arrays, as the index increases and the critical angle decreases, images using only ambient light as a source of illumination become more limited in their angular light acceptance. Pragmatically, this means that the illumination situations at which the microlens image will appear to have a luminosity like that of a conventional photograph or printed image become increasingly limited. At higher indexes, intense light must be directed at a specific radial angles in order to produce an acceptable brightness in the image. It is therefore generally desirable to subvert the excessive reflective effect of the internal optical surfaces in images intended to be viewed under ambient lighting.

To that end, the low-index region X1' may be assigned a material having a higher index than air, such as a fluoropolymer, and the optics modified accordingly. The current lower limit of commercially available polymers is attained by Teflon AF (DuPont) at $\eta=1.29$; the current upper limit is $\eta=1.65$, attained with polyetherimide. Currently feasible embodiments using thermoplastic solid materials would therefore have a maximum relative index, at the L2 and L3 boundaries, in the vicinity of 1.3, and an associated critical angle of 51°. In the interest of maximizing transmission and minimizing internal reflection, the low-index material would commonly be selected to have an index in the vicinity of $\eta=1.34$ to $\eta=1.43$. The internal optical boundaries would typically have an effective relative index of 1.15–1.22, and associated critical angles between 60° and 55°. In this range, designs may be obtained that convey substantially all ambient light to the rear microimage surface. The version shown uses a low-viscosity UV-curable formulation of OPTICLAD fluoropolymer (Optical Polymer Research) having an index of 1.360, in combination with polycarbonate ($\eta=1.586$) array components, yielding a relative index of 1.166. At relative refractive indices less than 1.15, it becomes increasingly difficult to obtain a satisfactory corrective effect; furthermore, such designs can generate undercut geometries that are difficult to reliably unmold.

Triangular mating features TM1 and TM2 are formed in A1 and A2 respectively, such that A1 and A2 may be be approximately aligned, and then precisely self-align when brought into proximity. Because the region between the L2 and L3 surfaces is not fully immured by the triangular mating features, fluid fluoropolymer can pass freely between cells. This permissive flow prevents local fluid entrapment in the X1 regions, and avoids any inaccuracies in the seating of the arrays that might result. Once two arrays are properly disposed with respect to one another, polymerization of the fluid is be initiated by the application of UV radiation.

In an image intended for viewing under ambient illumination, internal microlens interstices would be made optically transparent rather than absorptive. Diffusion of the light beyond the precisely focused central zone would be desirable, since diffusion results in a more constant luminosity in the viewed image; the reciprocal effect is an advantageous blurring of erroneous pseudoscopic views. Three optical processes can be considered to contribute to to this diffusion: the aberrant L1' caustic, the optical geometry of the internal interstices, and the diffusing effects of light at more extreme angles traversing the L2' and L3' surfaces of neighboring microlens cells.

While the use of fluoropolymer rather than air effectively eliminates on-axis reflection, the relative index nevertheless produces a mirror at a critical angle of about 59°. Reflectance at angle approaching and surpassing this angle can diminish the brightness of the viewed image by deflecting a significant portion of light out of the array. Furthermore, even when light bypasses the corrective optics, it will still tend to be, to some extent, converged. When an image is illuminated with a single point source, this partial convergence can produce local spot illuminations of the microimages that may be perceived as disparities in image luminosity.

Therefore, the interstitial geometry will ideally be configured to optimize the transmittance of light from the ambient field to the microimage plane, while concurrently diffusing that light and maximizing its distribution by directing it at oblique angles toward the image plane. When a light source in the ambient field is located outside the central angular zone, the conscientious transmission and diffusion of ambient light will produce a constant light level in the viewed image that emulates the wash of ambient light seen in conventional 2D images.

The D1 array was designed based on an index of 1.586 for arrays A1' and A2', and an index of 1.36 for the filled intermediate regions. The filled region in this case would include high aspect ratio diffusers PD1, PD2, PD3 and PD4. The relative refractive index at the inner boundaries shown in FIGS. 20A and 20B would therefore be about 1.166, yielding a critical angle of 59°. It may be seen by reference to FIGS. 20A and 20B, as well as to FIGS. 26A through 26C, that, for the limited incident angles inherent in the caustic, both refraction and internal reflection would occur at the various prismatic interfaces. Many rays are divided by partial internal reflection, or are subject to multiple partial reflections. Rays are therefore dispersed into divergent pathways and are distributed widely over the graphic plane. Graphic elements G on image plane IPM are diffusely illuminated, while little of the light received from ambient sources is reflected back out of the array.

The exact structure of the diffusing interstices can be variable. Shallower prismatic surfaces may be employed where the fabrication process limits the practical aspect-ratio. The scale of the diffusive features could include elements on the scale of the wavelength of visible light, so that diffractive effects could further enhance diffusion by channeling light into pathways outside the 0th diffractive order. The optical geometry of the interstices can include a variety of features, including unitary refractive and/or diffractive relief structures, compound refractive and/or diffractive structures, hybrid or threshold refractive/diffractive reliefs, mixed-index diffusing media preapplied to raised array surfaces, prismatic features, etc. The general goal would be to maximize diffusion while minimizing reflection back into the ambient scene.

A set of alternate tilings devised for a square-lens array, canted to 45°, are shown in FIGS. 29A through 31. In some applications, such as printing devices, it is desireable to be able to freely orient graphic images. The canted square accommodates arbitrary changes in format. Images with differing axial biases may be laid out on the same document. Rectangle T2 in a 2:1 proportion will tile in either orientation. Hexagon T3, in which σ is 144° and τ is 108°, will also tile in a regular manner. FIG. 12C shows coarsely stepped tile T4 in the horizontal "landscape" orientation, while FIG. 12D shows coarsely stepped tile T4' in the vertical position. FIG. 32A is a plan view of a coarsely stepped rectangular tiling of microimages having a horizontal axial bias. Tiles may be stepped according to their pixel resolution, as indicated by moderately stepped tile T5 in FIG. 32B, and by finely stepped tile T6 in FIG. 32C, FIGS. 30A and 30B show the respective locations of the tiles and the lenses in vertical and horizontal positions. FIG. 31 is a tile with a bidirectional bias that eliminates some oblique views.

A Joint Application of the Arrays

In traditional practice, the graphic material has been independently produced hotographically and then bonded to the rear of an array, or, alternately, printed directly on an array's rear planar surface. While these processes would commonly be used in conjunction with the invention, the acuity of the system optics permit the consideration of alternate replication processes. As exemplified by the preceding description, the field-limited and open-field arrays may be used as independent optical systems. Two array systems may also be used conjointly in various reimaging and reproduction applications. Because each array can accurately collimate a radial emission from any given point in a microimage, and because each array can also implicitly converge an incident collimated ray set, a pair of arrays arranged in a lens-to-lens manner can produce light from a graphic surface, collimate it into a plurality of sets of parallel rays, and reconverge it into an inverted real image on the rear focal surface of the opposite array. In order for this process to be effective, certain correspondences between the arrays must be maintained. FIG. 22 shows a schematic representation of the lens-to lens reproduction process.

Figure 23:
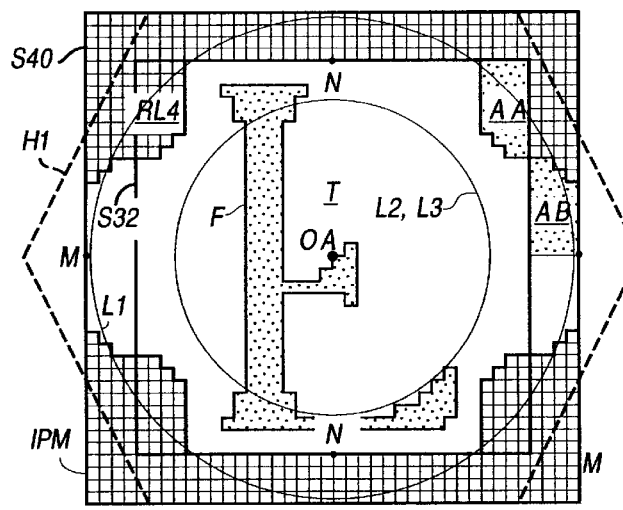
FIG. 23 is a schematic view of one cell of the image plane of the master array of a reproduction system according to the present invention.
Figure 24:
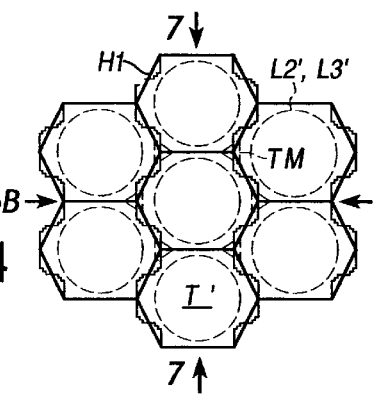
FIG. 24 is a schematic layout the microimage edge-to-edge tiling provided by the reproduction process, showing the relative location of the imbricated lenses in the open-field array.

The invention includes various tiling methods that reconcile a hexagonal lens layout with an orthogonal grid. Such a layout is shown having lens centers arranged on a hexagonal lattice, but in which the base hexagon is of unconventional proportion so that the microimages may be readily partitioned into equal units. Hexagon H1 in FIG. 25 has been derived from a square so that each side of the polygon is either oriented with an orthogonal axis of the array, or has slope that is a ratio of binary integers (1:2), rather than the irrational slope (1:1.73205 . . . ) associated with an equilateral hexagon. The hexagon has an area equal to the square of its smallest dimension, and is therefore equal in area to 40-pixel square S40. Each hexagon can then be associated with a square region on the graphic surface, with its two longest sides coincident with two parallel opposite sides of the generative square. These abstract squares can be imagined to tile in an aligned manner on one of the orthogonal axes, and in an offset manner in the other. In either case, the abstract squares are mathematically consistent so that there is no irrationality, deviation or accumulated error in the system. The master image may therefore be calibrated with a raster grid such as RL4 in FIG. 22. FIGS. 22 through 24 show a tiling based on a 32×32 square. The configuration based on a 48×48 square shown in FIG. 33 indicates a modification that may be use when higher graphic resolutions are desired. Since a $4\mu$ graphic dot pitch is preferred, the 32×32 pixel base would imply the use of $160\mu$ arrays, whereas the 48×48 pixel base would imply a pitch of $240\mu$.

An abstract square may be readily modified into various profiles which tile in a regular manner, as is well known to those familiar with mathematical tilings. The microimage tiles need not share either the square geometry of the underlying abstract tile, nor the parallel-sided hexagonal geometry inherent in some microlens grid layouts, as long as symmetrical areas are added and subtracted from the abstract square in an appropriate manner. The microimage tile pattern can therefore be square, hexagonal, stepped, or cruciform, and can include both straight and curved segments if desired. In the invention, the underlying square geometry will often be modified to subjectively accommodate human viewing preferences, while at the same time accounting for the technical requirements of image capture and reproduction.

In particular, the tile pattern can maximize the angular range of views available on the orthogonal axes. Animations may be extended by aligning the tiles' longer dimension with the vertical axis; three-dimensional images may compensate for binocular separation by assigning the wider field to the horizontal axis. The illustrated tilings are also formed in consideration of the penumbral peripheries of the microimages; the dim perimeters of the real microimages projected on the planar rear surface of the master array. These largely unusable image areas are allowed to overlap in designated null zones Z, which may be wholly eliminated in a lens-to-lens reproduction process.

This cropping of the null zones is obtained by having those designated areas emit no light during the process of reproduction. Furthermore, the arrays can be conscientiously designed so that the homographically conveyed microimages are slightly magnified in the process, while maintaining the same pitch between microlens centers. Essentially, the optics of the master are reiterated, with some modification, in the duplicate, but at a slightly different scale. For convenience and ease of computation, the ratio of master to duplicate in the example shown is given as 4:5. In a perfect optical system, a 4 micron dot in the master would appear as a 5 micron dot in the duplicate. The lens radii and focal lengths would also roughly accord with this ratio, while, in contrast, the linear pitch of the array would be invariable.

Having the two arrays share a common pitch allows the optic axis of each microlens in the master to be aligned with a corresponding lens in the duplicate. The differing focal lengths of the two arrays first allows the microimages in the master to be independently captured, and then, in duplication, allows the undesirable areas to be eliminated. The difference in scale also allows the lenses of the master to be formed discretely on a planar surface, without contact between their perimeters; this increases the variety of processes by which the master array may be originated, since some techniques, such as photoresist reflow, forbid edge contact.

In the illustrated embodiment, the duplicate array has been devised to have slightly greater (5% typ.) converging power than the master array. A hemispherical diameter of about 105% of the longest dimension of the hexagon can then be used. At the coincident corners of the outer hexagonal lenses, where three neighboring microlens hexagons tile at a common point, the slope can then be considerably less than 0°. Since $\cos^{-1}(1/1.05) \approx 18°$, vertices having sides sloped at that angle fall into the feasible range for mold manufacture. Fill rates approaching 100% can thus be obtained, as it would be unnecessary to significantly truncate high aspect-ratio peaks in the negative mold.

In order to illustrate this compatibility with binary systems, the following discussion proposes a regular orthogonal rasterization using discrete graphic units by such device such as electronic detectors, film recorders, scanners, printers, and luminous displays. It should nevertheless be understood that the system applies equally to continuous-tone images such as those captured directly on photographic emulsion, and that the descriptions potentially refer to arbitrarily generated graphic data as well as real, optically detectable image elements. It should also be understood that such digital and analog devices are compatible and readily integrated in a diversity of well-known interconnected processes.

Because of the proportion of the hexagon shown, a perfectly square region of the graphic surface of the master can be identified with a given lens. The region may then be freely subdivided to accord with the line resolution of standard optical, mechanical, and computational systems. In the version shown, each square microimage region in the master has been subdivided into a 40×40 pixel array. A smaller, 32×32 pixel square has been defined within the larger square. It will be noted that the two squares are selected to have the 4:5 determining ratio mentioned previously. An irregular microimage tile has been derived from the 32×32 square occupies a region on the microimage image plane which is substantially free of image overlap. This overlap is equally significant in capture and reproduction, as geometrical overlap of the significant circular zones generates ambiguous image data in either case. It may be seen in FIG. 24 that the lozenge-shaped intersections of the overlapping microimages all fall within the gridded null zones, while the open, unpatterned microimage area will receive or generate only unambiguous image data.

FIG. 23 shows a plan view of a mapping of a single microimage cell on the master image plane. An electron-beam film recorder such as the EBIR 5241F manufactured by Image Graphics (Shelton, Conn.) can produce a $4\mu$ 8-bit grayscale spot, and would thus be able to generate separations having 32 graphically distinct, 8-bit grayscale tones within a $128\mu$ square. Such an arrangement is shown in FIG. 23, except that the generative square S32 has been modified by the displacement of area AA to AB. The irregular tile T remains within the confines of the larger generative square S40. Points M and N represent the dimensional maxima of tile T. Circles cast from center C1 include the circumferences of optical surfaces L1, L2 and L3. D1 represents the complete theoretical spheric diameter of the surface defining L1. Gridded areas indicate null zones Z, which would generally not capture or reproduce light.

A plurality of such rasterized microimage tiles are shown in FIG. 22. The tiled image blocks form a pattern which creates a continuous null region Z surrounding the image tiles T on the master image plane IPM. It may be seen that the lozenge-shaped arcuate intersections of the overlapped microimages fall entirely within the null zone Z. No ambiguous image data will become a part of the image-capture or reproduction. The figure F' in the microimage cell is shown as it would be seen in a pseudoscopic master if it were viewable from the lenticulated side of the array. A similar situation would be arrived at if the upright correct letter "F" were imaged from a real scene. Restoring the figure to its proper orientation would indicate an orthoscopic, parallax-correct image.

If the optically conveyed image data converged on the microimage plane of the duplicate has been computationally or optically modified to equalize relative irradiation, no dimming would be observed over the angular viewing range of the three-dimensional illusion. Because these calculations would be based on an subjectively elected point near the absolute perimeter of the field, e.g. where accumulated light losses might total 80% of the irradiation at the optic axis, the irradiation profile can not be made entirely flat unless some part of the extreme perimeter is disabled. This is done in the examples shown by using a wider-angle array for the master and ensuring that no light is emitted from within the the null region Z of the master image.

The compensatory gradient may be based on the cumulative losses, and the image file processed accordingly. The perimeter will use the full tonal or color depth available to the film recorder, while the center of the image will be confined to a narrower gamut. When reproduced to an array having a narrower viewing range, microimage overlap will be completely eliminated and the observed image will have a continuous luminosity across the viewing range. The compression of the gamut would typically be undetectable, as the 8-bit separations which would typically be used to master the image have a tonal resolution far beyond what most observers can independently distinguish. When applied to photographic materials, algorithms compensating for reflection losses would commonly accommodate the thresholds, contrast parameters, and chromatic characteristics of specific emulsions and development processes.

Commonly, null zones will coincide with black image data, either in computational form, or in actual ink, dye, or developed emulsion. A compensatory photographic filter may be formed by the exposure of negative film through the array to a target in the actual image field having an inverse of the compensatory gradient and of a single null zone pattern. The latent image may then be separated from the image plane of the array used repeatedly in the reproduction process. An advantage of using a discrete compensatory filter is that a high-resolution monochrome emulsion may be used for the filter, while color emulsions, which typically have a lower potential resolution, may be used in the actual images. The discrete filter could therefore exceed the resolving ability of the color film, and no artifacts from the filter would be introduced in the reproduced color images.

Photic elements PH, indicated in FIG. 22, can be photodiodes, phototransistors, LEDs, liquid crystals, plasma cells, film recorder dots, ink dye, or toner dots, CRT triads, etc. Because of rejection rates due to the increased likelihood of flaws, high resolution photonic devices using a great number of pixels are associated with high costs. A single row is shown which can be scanned across the width of a single microlens to produce high resolution images without the expense of a continuous field of elements, increasing production yields. Color data may be obtained by providing three color-filtered parallel rows. More commonly, the single-line scan would be retained, adjacent lens cells separately color-filtered, and subject color interpolated based on that image data. Manufacturing costs might be further reduced by the elimination of null elements PN associated only with null zone Z, leaving gaps PZ in the rows of photonic elements. Single line segments may be oriented on the opposite axis and staggered in order to allow for surface wiring and in order permit the capture of time sequences without binocular conflict.

Figure 25:
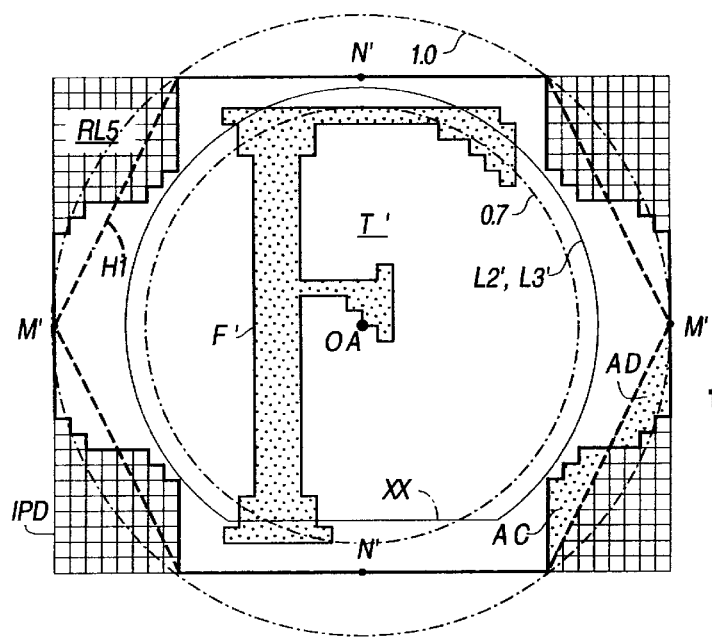
FIG. 25 is a schematic view of one cell of the image plane of a duplicate array within a reproduction system according to the present invention, showing the microimage as it appears when reproduced to the open-field array being used as a recipient material.

FIG. 25 shows the figure F' representing the appearance of the letter "F" after reproduction. The figure has the proper orientation and chirality when viewed from the lenticulated side, indicating that the resulting image will be orthoscopic.

It will be seen by seen by reference to FIGS. 24 and 25 that the microimage tile T, when projected into the lens cell of a duplicate array image plane IPD, will tile on duplicate image plane IPD with no null areas. Areas AC and AD are reflected about hexagon H1 so that areas within and without the H1 profile area equal and properly located. This process necessarily induces a slight magnification of the pixels; in this application, a $4\mu$ pixel in the master would have a surface dimension of $5\mu$ when reproduced in the duplicate array. Image elements may be envisioned as having been mapped onto a raster lattice RL5 of 1.25 times the pitch of the master grid RL5. The differential scaling allows the duplicate to have an outer surface lens fill rate approaching 100%, since the optics of the cell are essentially scaled up by the same factor (125%) without changing the lens pitch.

These arrays may be arranged to use mathematically similar scalings of the same optical geometries. The resolution range defined by these three arrays cover the range of what is currently considered fine to coarse line resolutions for hand-held lenticular images. Signage and other large-dimension applications can have lenses 1 mm in diameter or more; for convenience, a series of nominal gauges directly related the lens pitch can be devised; i.e., $80\mu/\#1$, $160\mu/\#2$, $240\mu/\#3$, $320\mu/\#4$, $400\mu/\#5$, $480\mu/\#6$, $640\mu/\#8$, $800\mu/\#10$, $960\mu/\#12$, $1280\mu/\#16$, $1600\mu/\#20$, etc. All these gauges are readily rasterized for the 4:5 homographic reproduction.

Corresponding lens measures ($D_{max}$) in the field-limited master arrays would be $75\mu/\#1$, $150\mu/\#2$, $225\mu/\#3$, $300\mu/\#4$, $375\mu/\#5$, $450\mu/\#6$, $600\mu/\#8$, $750\mu/\#10$, $900\mu/\#12$, $1200\mu/\#16$, $1500\mu/\#20$, etc.; these dimensions can readily be subdivided into either 4 or 5 micron graphic units. The geometrical diameter of the lenses would commonly represent 105% of $D_{max}$, providing abstract diameters of $105\mu$, $210\mu$, $315\mu$, $420\mu$, . . . respectively. Exact dimensions and focal lengths of the two arrays would typically be reconciled to optimize microimage tiling. In general, it may be seen that the system as described provides an ideal reconciliation of binary and decimal systems, and generates pixel counts and line resolutions which are consistent with existing electronic devices.

Within each gauge, a diversity of resolutions is available, including both full-parallax and horizontal-parallax-only (HPO) formats. The series is therefore highly backwards-compatible with historical 3D capture devices having 2, 3, 4, 5, 6, 8, 10 . . . source images captured in a linear arrangement. Various graphic sources, including stereopticon pairs, integral photographs, video clips, computer animations, etc., could all readily be integrated on a single sheet of the material.

Once the graphic material was processed and produced to the focal plane of M1 as a transparency, the microimages could be conveyed to the D1 array photographically. The unique correspondence of two conjugate points in an optical system has sometimes been called a homography. When a pseudoscopic master image is reproduced homographically, each point in the master is effectively conveyed to a reciprocal conjugate location in a second array. An impediment to accurate reproduction is the displacement of some rays into neighboring lens cells, as indicated at RX in FIG. 22. One solution is to treat the outer surface of M1 so that light blocking material B reduces the apertures of the L1 lenses to about 50% of the maximum diameter ($D_{max}$) of L1', as shown in FIG. 20B. A complete homographic arrangement is shown in the schematic sectional view of FIG. 21. A homography is represented by points N and N'. In fact, this correspondence is preserved regardless of the shape of the wavefront produced through the array.

The affiliation of a ray with a location corresponding to its angular identity is largely independent of the shape of the wavefront at the graphic surface, i.e., the illumination need not be produced by diffuse, radially distributed light at the graphic surface. An alternate process therefore can be understood as a means to reproduce graphic data from IPD to IPM. Rather than by the transfer of a collimated and reconverged set of microimages, the latent duplicate image may be produced by a succession of superimposed intensity distributions which are communicated in succession to the photosensitive image plane of a duplicate array. The resulting wavefront curvatures may in some cases diminish diffractive effects at the image plane IPD of the photographic duplicate. The arrangement can also allow the angular distribution of the light to be controlled at the source, so that no light-blocking material need be applied to the exterior of M1.

A comparison of the two approaches may be seen in FIG. 21, in which a source's angular output is predetermined by using collimated beam LS that is subsequently modified by convex axiconic lens array A3 oscillated in the plane of the array during exposure. Angle θ is given here as η32°. Assuming an A3 having an index of η=1.59, light is allowed to pass through the A2 portion of the M1 array only at angles between 12.7° and 25.4°. The restricted field provides equalized transmission across the field, and excludes stray rays such as ray RX. No light is conveyed from null zones Z, except in the case of a negative master photographic transparency. Alternately, a master of the M2 type may be used with conventional sources.

In the first case, homographic reproduction, graphic material G located on the microimage plane of the master (IPM), i.e., microimages each having varied intensity and chromatic characteristics, are illuminated. The emission may be produced by an electronic device such as an CRT, LCD or LED display, or may be produced by the illumination of a developed, selectively transparent photographic emulsion. For each emission from a given point on the master, a predetermined portion of that emission is captured by the associated microlens optics, collimated, and reconverged on the rear surface of the duplicate (IPD), where it may be captured as a latent image by a second emulsion, or captured, communicated, stored, or otherwise manipulated optically or electronically as an orthoscopic image.

The scaling of the two arrays allows the null zones, which produce no light during the reproduction process, to be eliminated. The angular emission of the source illumination can be adapted to exclude rays which might otherwise enter inappropriate cells and diminish the accuracy of the homographic transfer. In an LCD system, the angular emission is a well-known electable feature of the design.

Because of the high aspect-ratio of the nearly-hemispheric lenses, and because of their unrestricted apertures, a portion of the transmitted light would tend to fall on neighboring lenses. Placing an aperture screen at an intermediate location between the arrays can block these errant rays, but this arrangement inherently increases diffractive effects and limits the theoretical acuity of the arrays.

Figure 21:
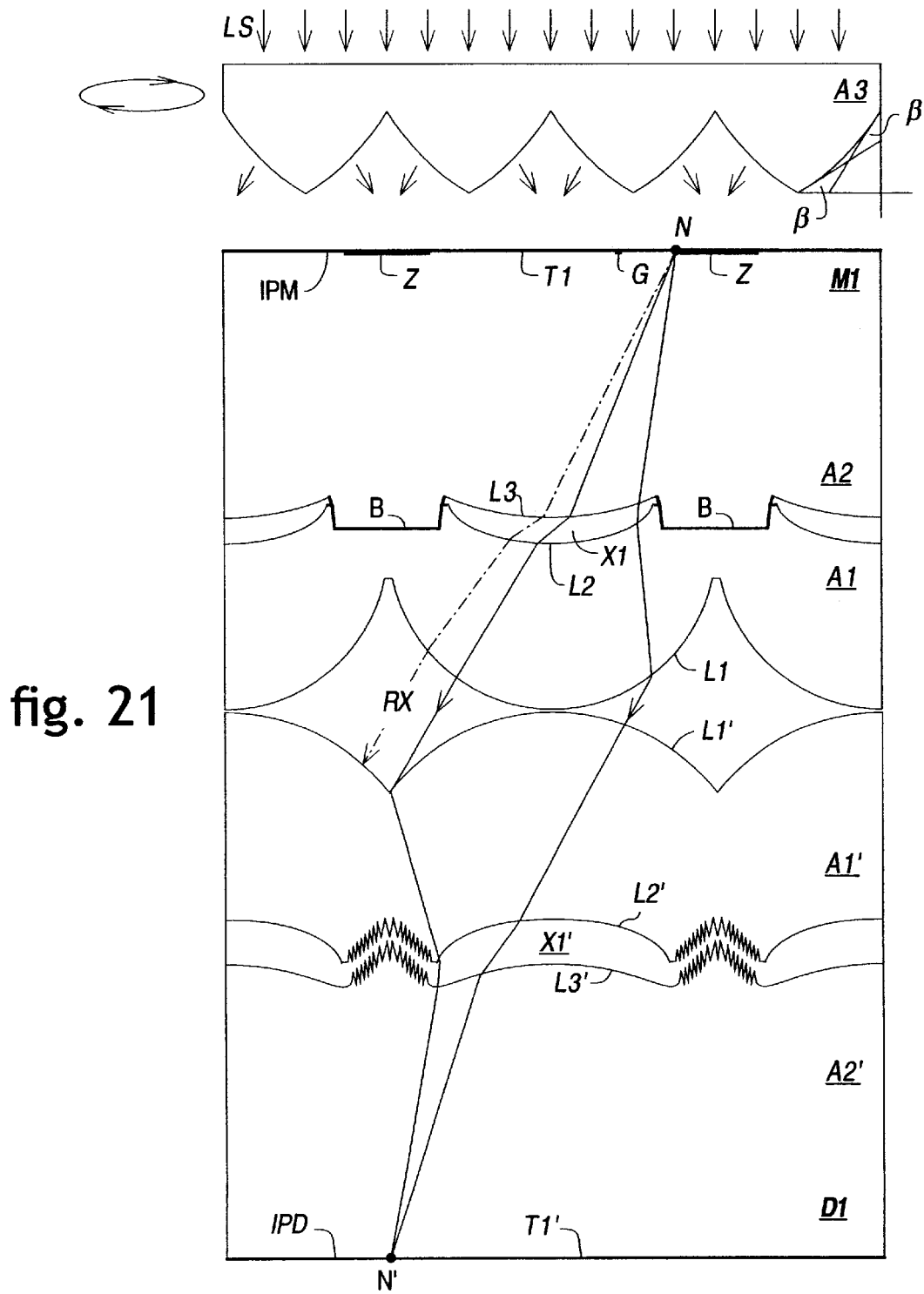
FIG. 21 is a cross side view of a reproduction system according to the present invention.

In this intensity-distribution mode of reproduction, extraneous rays may be eliminated by the modification of a collimated light source (LS) by a refractive array of convex axiconic lens elements, shown schematically in FIG. 21. The array would typically be oscillated on the plane of the array to generalize the angular effect, as indicated by the revolving arrows. Piezoelectric resonant frequencies, for example, can be made to exceed common exposure times by a factor of a hundred or more. The array can be arranged at a distance so as not to act as a restrictive aperture, which might reduce resolution by clipping the expanding wavefronts. When the illumination source is located at a remove from the mated image arrays, a reflective corridor may be arranged about the illumination pathway to direct light toward the image plane of the master array.

Angle β is given 32°, but may be adapted to any desired situation, and need not be the same for both indicated vertices. Assuming a polycarbonate A3 and ignoring any diffusion by the master emulsion, light is allowed to pass through the A2 portion of the M1 array only at angles between 12.7° and 25.4°. This arrangement eliminates both stray marginal rays, like that indicated by the arrow at RX, and a central cone of rays as well. The exclusion of rays in the central cone helps equalize the exposure by diminishing light available in the vicinity of the microimage center, and reduces demands on other equalization processes. While this alternate system can reduce diffraction losses, it may in some cases be preferable to accept an increased degree of diffraction and introduce an aperture mask between the two arrays.

Implementations of the invention are expected to be diverse; a common adaptation might include a plurality of lenses of equal size in the 2 mm to 5 mm range, from which an electronic record is derived. Intermediate views would then be algorithmically rendered, and the pixel counts of all the images selectively reduced. The relatively large lens elements would provide the angular resolution needed to distinguish discrete views of the scene, and the image interpolation and reduction of the pixel count would provide a finite set of views with great angular specificity. Such a system would subvert the current resolution limits of digital image capture, and would reduce the volume of the captured or stored information.

Figure 26A:
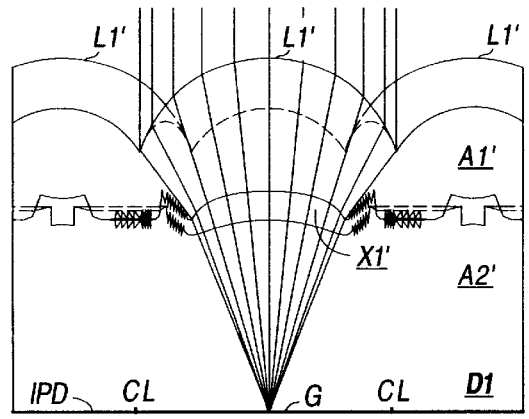
FIG. 26A is a sectional side view of a three element lens illustrating on-axis performance of a lens system according to the present invention.
Figure 26B:
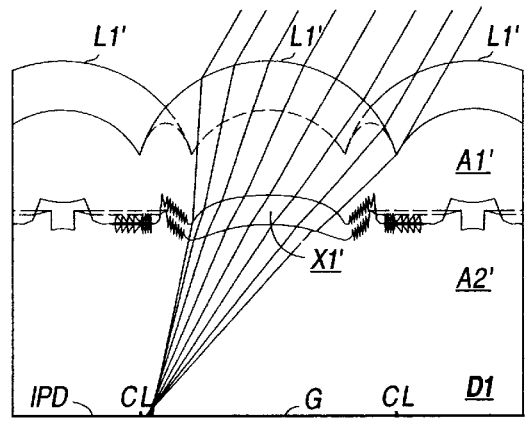
FIG. 26B is a sectional side view of a three element lens illustrating off-axis performance of a lens system according to the present invention.
Figure 26C:
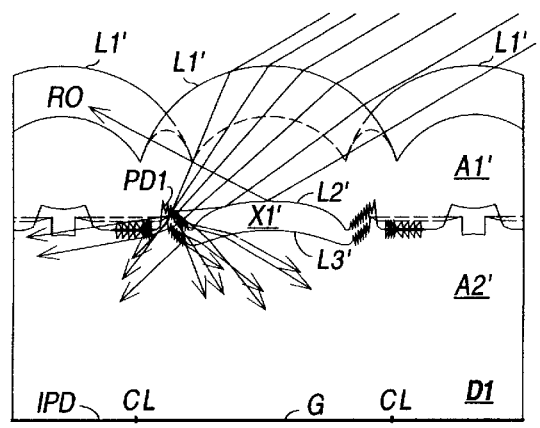
FIG. 26C is a sectional side view of a three element lens illustrating diffuse illumination of the image plane from prismatic diffusers.

FIGS. 26A, 26B, and 26C describe the general process of viewing and illuminating a D1 image. FIG. 29A shows the lens cell focused on a central point. FIG. 29B shows a lens cell focused on a peripheral point associated with a viewing angle of 30° from the optic axis. All intermediate points will accurately magnify and collimate graphic elements from image plane IPD. The corollary effect is the convergence of a real image on IPD. The conjugate relationship results in the observer's lines of sight inescapably being aligned with the projected images of his or her own eyes. Significant illumination must generally arrive at oblique angles outside the focal zone. This situation is shown in FIG. 29C, where ambient light arriving at 60° is conveyed to the image plane. The caustic surface is inherently diffuse, but is diffusion may be enhanced introducing high aspect-ratio diffusers.

In essence the situation shown in FIG. 29C represents a visualization of the "worst case" of image illumination for the type of image shown: a single source of negligible spatial extent. The structures shown provides nearly a high degree of diffusion for such a source over about 75% of the angles in the ambient field. The highly convergent central field would largely be occupied by the observer's image, obscuring any possible illumination. When an observer is viewing a normal 2D image, this region is commonly obscured by the observer's shadow; although the process is different, the effect is similar. The collective consequence of the optical processes shown is therefore to functionally emulate the wash of ambient light that illuminates common 2D imagery.

The reciprocal effect of the pathways shown in the FIG. 29C will be the perception of a field of neutral tone at most angles beyond the central focal zone; because light would not be limited to the angles contained in the half-caustic, an even more generalized diffusion would be produced by light emanating from the image plane.

In both these cases the conveyance is based on angular rather than Cartesian dimensions. Monochromatic color separations are sometimes used in high-resolution imaging to maximize resolution. In these embodiments, the registration of such separate color channels would have the advantage of being to some extent automatic. The angular identity of conjugate points is preserved despite slight misalignments of individual lens axes, and microimages are therefore reproduced to the second focal surface with little error despite this degree of decentration. The difficulty of registration of plural, high-resolution channels at micron scale has been an impediment to such high resolution graphic reproduction. A misregistration of similar dimension on a photosensitive emulsion would cause the latent image to be irretrievably corrupted.

Figure 27A:
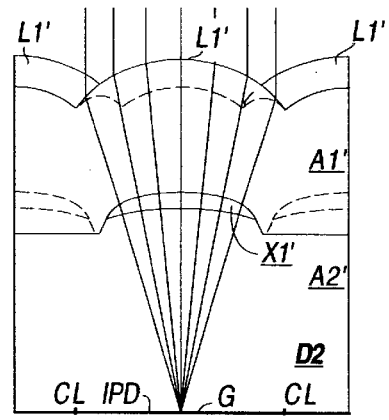
FIG. 27A is a sectional side view of a two element lens illustrating on axis performance of a lens system according to the present invention.
Figure 27B:
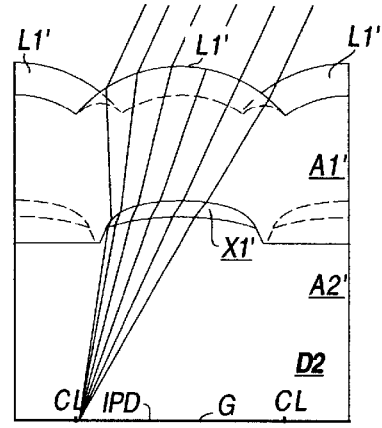
FIG. 27B is a sectional side view of a two element lens illustrating off axis performance of a lens system according to the present invention.
Figure 27C:
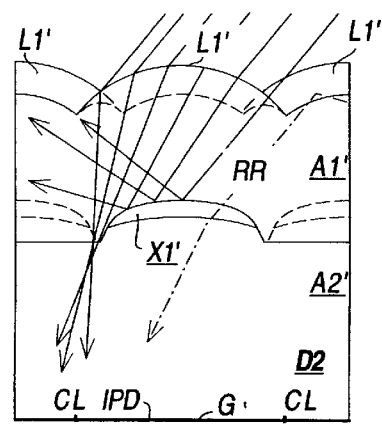
FIG. 27C is a sectional side view of a two-element lens illustrating diffuse illumination of the image plane from prismatic diffusers.

In display arrays having air inclusions, loss of reflected ambient light through L1 can be significant. FIGS. 27A, 27B, and 27C schematically describe the general process of simultaneously illuminating and viewing display having air inclusions D2, which has been devised according to the earlier general discussion. The ratio of the sag height to the greatest clear aperture is approximately 1:4.2, and provides a viewing field of 50°. FIG. 27A shows the on-axis performance, and 27B the array's performance near cell limits CL. FIG. 27C shows that at a field angle of 40°, no light is conveyed directly through the internal optics, but instead is either reflected by TIR or transmitted through internal interstices. Interstices generally transmit only the most aberrant marginal rays. Rays rereflected off L1 surfaces return to the image plane, as indicated by ray RR. In either case, the distribution of passive illumination at the image plane is highly diffuse. The design shown in 27A through 27C accords with the optical geometry of Case 5 in the above tabular data.

Cylindrical Arrays

In a cylindrical array, an analysis of the performance of the array must include two optically differing axes. A graphic element on the image plane may be imagined as radiating point PR emitting in all directions. A ray trace along the longitudinal axis of the lens, as shown at the left of FIG. 1B reveals the behavior of the emitted radiation. Part of the light is redirected toward the image plane by internal reflection. Another part is transmitted into the ambient field radially. To the eye, the radial pattern on this axis essentially emulates the emission of a point VP located within the thickness of the array.

When the same circumstance is considered from in the transverse case, shown at the left of FIG. 1B, it may be seen that, when the array is designed to be focused at infinity, the projected sight-lines are parallel and nonconvergent. The wavefront produced by a point emission will therefore be cylindrical, having a longitudinal axis perpendicular to the axis of the lenses, as shown in FIG. 1B. Because a normal eye can only accurately converge wavefronts of substantially constant curvature, the spot converged on the retina will be astigmatic.

The introduction of a vergence angle ameliorates the astigmatism by generating an ellipsoidal wavefront, but a point on the graphic image plane IPD still cannot be mapped to a point on the retina. Convergence would require a spherical wavefront. The eye therefore interacts with the graphic data to arrive at the best astigmatic compromise.

The eye generally equates contrast with optimal accommodative focus. The astigmatic optics of a cylinder lens allow the eye to adapt to produce focal spots anywhere between the transverse focus and the longitudinal focus. The eye will normally elect the focus that presents the best contrast. The appearance of the image may be understood by extending a plurality of sightlines to their imaginary intersections. Lenticular images are commonly devised to have the appearance of symmetrical pixel counts on the vertical and horizontal axes. This requires pixels on the actual graphic surface elongated to a height equal to the lens width. As the eye adapts, seeking a closer focal point and thereby increasing the vertical resolution, the vertical linear area on the graphic surface that corresponds to a point focus becomes shorter and increasingly ellipsoidal. It may be understood that the best contrast in the viewed image will be obtained when the area so defined corresponds to the proportions of the elongate pixel. In order to represent unambiguous views, the elliptical area must be smaller than the pixel. The scale and shape of the pixels at the focal plane of the array may therefore be employed to induce a particular accommodative focus. In practice the graphic image may be continuous-tone rather than rasterized, in which case the edges of objects and transitions between views will be more blended. Changing the proportions of the pixels can alter the focus.

Description of a Discrete Device

Three-dimensional image capture devices may be obtained by the use of a plurality of discrete capture devices. Generally the output graphic image is the result of interpolation and integration of these source images. FIG. 34 shows an application in which the optics described are employed in such a discrete optical imaging lens system. The device includes an electronic detector DT located on a substrate SB and reinforced by a mount MT. The transparent optical elements E1 and E2 are designed to mechanically engage without the application of adhesive. Centration is provided by contact at D1 and D2, while intimate contact between the sidewalls at other locations is physically discouraged. Because of the air gap so provided, internal reflection shunts stray light away from the detector. Light-blocking annular aperture stop AS of predetermined thickness in inserted within the system the washer-like annular stop may be resilient to exert upward force on E1 so that prongs PR lock firmly at D2.

Element E2 would commonly be bonded directly to the electronic component using an index-matched nonconductive optical cement. The region corresponding to the detector area would normally be essentially optically flat; index-matched direct mounting allows the cement, once cured, to become optically continuous with the E1 element. IP represents the image plane of the array, which would normally correspond to the detector surface. Electively, the IP surface could be located in front of the detector and equipped with microoptical elements such as diffractive or refractive lenses, color-separation gratings, etc. In these cases, a space may be left between the detector and surface IP in order to allow a distance over which the desired optical effect might be obtained. The space may be filled with air or a cement having a differing refractive index from that of the E2 element. In this way, the requisite refractive effect or diffractive phase delays may be introduced at that interface.

Installation of outer element E1 over E2 could be performed either before or after the installation of E2 on the electronic materials. The components would be formed of a material having sufficient elasticity that prongs PR of element E1 could be made to momentarily expand to an increased diameter. Upon the application of a predetermined degree of force in alignment with the optic axis, the prongs would, upon contact with the conical exterior of E2, expand and then contract to form an accurate mechanical connection with E2. The mechanical extraction resistance could be varied to make the connection either permanent or reversible; while four prongs are indicated, the conical shell of E1 could be divided into any number of individual sections.

Housing H would typically be devised of an impact-resistant thermoplastic such as polycarbonate. The material would typically be specified to be substantially opaque. Lighter colors of housing material or highly specular surfaces might benefit from the application of matte, light-absorbent material to the internal surface of the housing. The housing would typically be formed so as to recess the L1 surface relative to the outer surface of the housing. The conical chamfer surrounding the opening in the housing would typically be sloped as shown in order not to intrude on light acceptance within the targeted angular range. The array design shown was intended to accommodate a degree of manufacturing and operational inconsistency in the alignment of the optical elements and the housing aperture. The recessing of the lens and its structural isolation from the housing, allow the housing to act as a resilient shock-absorbing device, reducing the risk of displacement of or damage to the optical components during an accidental impact.

The optics in this case were devised in accordance with Example 3 of the cases included. The lens design is more center-weighted than the prior examples. At f2, the performance is near-diffraction limited over the center 50% of the image field. Lateral color is well corrected, as may be seen by reference to the graphic data.

Operation of a Discrete Device

The capture of three-dimensional images may be obtained by direct capture using a contiguous microlens array, effectively sampling the scene at every point of its surface. Three-dimensional data can also be captured by a more limited set of spatially displaced image sources, and additional views interpolated and composited from this finite set. Using a finite set of discrete image sources can have significant advantages, especially in larger images. First, as the dimension of the image increases, the volume of data increases with the square of the image area. This volume can place great demands on the storage and processing capacity of digital devices. Second, yield rates for large area semiconductors are currently low relative to smaller discrete devices. Third, while a contiguous lens array would tend to be rigid, and array of physically discrete lens systems could be mounted in a folding housing or a collapsible lattice. Using discrete devices can therefore increase the number of images that can be stored in a portable device, and can also reduce its cost and its physical dimension.

FIG. 34 shows such an envisioned application, in which the lens system of the invention is used as a discrete surface-mount fixed-focus lens. The opening in Housing H would typically act as an optical aperture stop. As in normal optical systems, the scale of the aperture may be varied to intermodulate the speed of the lens with its acuity. Also, in security applications, it may be desirable to minimize the visible surface dimension of the lens. Light from a scene is captured by the L1 surface and directed through the core optics of the array, within the predetermined angular a range, to detector DT. As the reflection of light from L2 roughly follows the transmittance curve, a relatively small amount of light will pass at extreme angles whose luminous flux is too diminished to be useful to image capture. Light passing through L3 at extreme angles would be directed by internal reflection at optical boundary BD at the conic side-walls to regions of the substrate beyond the detector. It may readily be seen that a cylindrical housing would tend to reflect this light toward the detector. The detector may be of any desired practical dimension, and need not occupy the wide field illustrated.

An alternate element boundary surface is shown at BD2'. While detectors typically are by definition light-absorbing surfaces, and therefore produce only a small amount of reflection, it is imaginable that some detector surfaces may produce a limited degree of reflected stray light from the converged real image. In this case, a fresnel surface BD2' at the outer boundary of E2 can better deflect such reflected light. Light deflected by internal reflection at L2 is either reflected through the L1 surface, as typified by ray R1, or directed through the fresnel boundary FB in outer element E1. Light bypassing the core optics entirely is either deflected by TIR at the internal surface of the conic interior of E2, as shown by ray R2, or is passed through the fresnel surface, as shown by ray R3, to a region outside the photosensitive detector. Light-blocking material B covering the substrate SB may also prevent undesired optoelectronic interaction with exposed semiconductor elements. Any "pin-cushion" distortion in the real image would typically be compensated for when the image data was resampled; resampling is a common image-processing step in color digital image capture.

The device shown therefore directs light only from the desired angular range toward the detector. A wide angle of view may thus be produced with a minimal number of optical surfaces. Furthermore, the high degree of correction allows the numerical aperture to be relatively high. The high numerical aperture implies a small Airy disc, which in turn implies that both the lens and the detector array can be very small and still produce a useful image. This small dimension size implies a reduced focal sensitivity to the subject distance, and a fixed-focus lens system can therefore be fabricated which produces a useful depth of field from a few centimeters to infinity. In addition to applications calling for dimensional data, this optical arrangement can provide a cost-effective solution for security applications and in personal electronic devices. In electronic devices aimed at telepresence applications, the image subject is commonly expected to be the human device operator; the small potential scale of the optical device shown, its wide angular capture, and the deep focal field, and the high speed of the lens allow an operator to be accurately imaged at close range in ambient light. The intrinsic impact-resistance of the design allows it to be advantageously employed in imagers, laptop computers, cellular phones, pagers, personal digital assistants, and other portable electronics that are commonly exposed to the possibility of accidental impact. At higher detector resolutions, an aperture stop may be located at L1 to eliminate marginal rays and to further increase lens acuity.

Outer element E1 is potentially replaceable, so damage or wear to L1 does not automatically compromise the entire device. E1 may also be removed for cleaning or repair. The imaging lens may also be readily fitted to a mosaic transmission device such as fused fiberoptic image conduit. The elements may be produced in a prealigned manner on injection molding runners, and assembled in bulk automatically. Extreme environments may use the solid D1 geometry for additional heat-, shock-, pressure-, chemical- or vibration-resistance. High-temperature materials such as glasses, polyetherimide, Teflon AF, or thermoset fluoropolymers may be employed in such circumstances. It should be noted again that the materials and geometries illustrated permit achromatizing and antireflective microstructures to be formed on otherwise refractive surfaces. Microstructures would be scaled to the actual wavelength at the active optical boundary.

Mastering and Manufacturing

While the microlenses may imaginably be formed according to the invention in vitreous materials such as glass or fused silica, it is anticipated that the preponderance of applications will call for polymeric materials. Processes employed may be understood by reference to the teachings of the prior art, and are well known and widely implemented in the field of the invention. Generally, the development of a plastic optical part may be conceptually divided into a mastering phase and a replication phase, although mastering processes are also commonly used for prototyping and short-run production.

The particular manufacturing process chosen can depend on the scale of the lenses, complexity of the design, and the desired precision. Mastering and replication processes are commonly restricted by physical factors to a finite dimensional range; one commonly-encountered restriction is the sagitta height. Arrays formed according to the invention will often have near-hemicylindrical or near-hemispherical outer surfaces accompanying inner surfaces having much smaller sagitta heights. Therefore, one process may be used for mastering the L1 surface, and a differing process for the L2 and L3 surfaces, even when these elements are being formed for the same final array. Of particular interest in the invention are processes which can produce continuous-relief diffractive zone plates on curved surfaces. Such processes may be used in the invention to achromatize microlenses. In particular, the high diffraction efficiency provided by the continuous annular facets can substantially eliminate stray light that would otherwise occur due to the diffractive dissemination of light into of superfluous diffractive orders (−2, 0, +1).

Molds for microoptics may be mastered by mechanical means. Typically, hard copper die material is used in combination with a diamond cutting tool. In linear optics such as cylindrical-lens arrays, a precise ruling engine is commonly used in combination with a single-point diamond tool shaped to the desired finished profile of the lens. The scribing of the surface is repeated until the entire surface is covered with the inverse topology of the desired finished surface.

Similarly, rotationally-symmetrical lenses can be milled or ground in hard copper, and can be replicated so as to tile in an edge-to-edge manner. Single-point diamond turning may be used to master diverse optics, including hybrid refractive/diffractive lenses, on a wide range of scales. Provided the material of which the final article is formed possesses a degree of elasticity, undercuts may be produced, for example, to provide for the mechanical interlocking of two arrays with mating features. Turned features are generally limited to rotationally-symmetrical surfaces, so some useful periodic structures, such as conic subwavelength antireflective nodes, are precluded. However, nonrotational features may be added to a diamond-turned master in a post-production process such as holographic exposure and subsequent development of a thin coating of polymeric photoresist. In theory, such antireflective structures may even be formed on hybrid surfaces refractive/diffractive surfaces, as the subwavelength structures are not resolved by the impinging wavefront and so do not subvert the phase delay introduced by the annular facets in the zone plate.

Mechanical processes may thus be used to originate any of the optical surfaces in the invention. A copper master may itself be used as a production die for the molding of plastic arrays, or it may be electroformed and replicated in nickel to produce a more durable mold. The long life of such nickel shims has been well demonstrated in the production of optical discs, in which millions of duplicates having submicron-scale features have been produced in acrylic and polycarbonate.

Because of the time involved in the individual mechanical fabrication of microlens arrays, various processes have been derived for the simultaneous development of a plurality of optical surfaces on a single substrate. Examples of such processes include: 1) fluid self-assembly, 2) droplet deposition, 3) selective curing in photopolymer by laser beam energy distribution, 4) photoresist reflow, 5) direct writing in photoresist, 6) grayscale photolithography, and 7) modified milling.

In fluid self assembly, an optically flat substrate is imprinted with a pattern that locally alters the wetting characteristics of the substrate. A common process employs an elastomeric polydimethylsiloxane mold with alkenothiol ink on a gold surface. The inked areas may be made relatively attractive to a fluid polymer or prepolymer. The substrate is then immersed in the polymeric material, or exposed to vaporized polymeric fluid, so that a pattern of convex features develops in the receptive inked areas. If the pattern is configured of round dots, the fluid will tend to self-assemble according to surface tension, developing an array of convex, substantially spherical surfaces. The polymeric material may then be cured, typically by exposure to ultra-violet (UV) or electron beam (EB) radiation.

Droplet deposition is conceptually similar to self-assembly, but involves the delivery of minute metered amounts of polymeric fluid to regular locations on a flat substrate. Examples of delivery systems include capillary arrays and drop-on-demand ink jet devices. The convex droplets may be cured by UV radiation. The surface tension of such fluids may be modified electrostatically to provide a desired contour. The viscosity of the fluid may also be integrated in the characterization of the process. Selective curing in photopolymer by beam distribution uses a UV laser directed at a layer of uncured polymeric resin. The beam is pulsed at a plurality of locations. The higher energy regions penetrate more deeply. On development, microlens surfaces are produced which correspond to the energy distribution in the cross-section of the beam.

Photoresist reflow is well documented in the technical literature and prior art which uses photolithographic processes adapted from the electronics industry. Typically, it involves the use of a chrome mask and the formation of raised photoresist cylinders of a predetermined volume on an optically flat vitreous substrate. The cylinders are reheated and allowed to flow into a convex three-dimensional relief. Such features are most commonly spherical, but may also be made ellipsoidal or hyperellipsoidal by conscientiously modulating the intensity and duration of the heating process. Once removed from the heat, the reflowed photoresist forms a hardened array of microlenses. While photoresist reflow has been used primarily for free-standing microlenses, which have a maximum fill-rate of about 80% in a square layout and about 90% in a hexagonal layout, the process has also been adapted for the fabrication of imbricated surfaces. One such process is detailed in U.S. Pat. No. 5,536,455 by Aoyama. A first set of lenses is formed in a more or less conventional manner by reflowing photoresist on a planar substrate. A second layer of photoresist, having a lower melting point than the first, is exposed and developed into a second pattern of cylinders. The array is again exposed to thermal energy, but at a temperature high enough to melt the second photoresist but low enough to avoid deforming the first set of microlenses. An imbricated array having an effective fill rate of 100% is thus formed. Polygonal microlenses having fill rates approaching 100% may also be obtained from the microoptics division of Adaptive Optics Associates (Cambridge, Mass., USA).

In direct writing in photoresist, a laser, typically of the UV HeCd type, or electron beam is used as a stylus to locally expose a pattern in a calibrated photoresist. The photoresist is typically carried on an optically flat vitreous substrate. When the resist is developed, the pattern traced by the stylus is produced in relief in the polymeric photoresist. Arbitrary profiles can be written from polynomial data or displacement maps in the form of height-encoded bitmap patterns.

In grayscale photolithography, a grayscale data file, having a plurality of gray levels, is computationally derived for an anticipated continuous optical relief. The grayscale data file essentially acts as a displacement map of the desired surfaces, having its light and dark areas encoding the relative height of relief features. The data file is converted by an electron beam to a pattern in sheet of high electron beam sensitive (HEBS) glass. Using current technology, the data file may have a resolution as fine as 100 nm. The resultant HEBS master will typically show a continuum of light-transmissive and light-absorbent areas having an optical density of approximately 1 in the most absorbent areas. Exposure of photoresist to UV light via the HEBS mask allows light to selectively pass through the grayscale reticle so that photoresist is selectively hardened depending on the degree of transmission. Upon development, the anticipated surface will have been produced in the photoresist. Thus, a plurality of optical devices may be produced concurrently in the prepared layer of resist. Furthermore, the features need not be restricted to geometrical revolutions and can be continuously variable across the optical surface. This feature could be useful in a system which optimizes viewing by the use of idiosyncratically formed microlens optics based on a presumed viewer position. An alternate grayscale method to HEBS glass uses minute openings in a binary mask to emulate grayscale performance. A version of this binary process is described in U.S. Pat. No. 5,310,623 (5/94) to Gal.

In general, systems which produce relief features in polymeric photoresist on a vitreous substrate may convey those features to the vitreous substrate by anisotropic differential ion milling. The photoresist relief is anisotropically etched in the presence of a reactive agent such as oxygen so that the resist is progressively removed in a calibrated manner. The vitreous substrate is generally removed concurrently, in proportion to the thickness of the overlying photoresist. At the termination of the process, if properly regulated, the photoresist will have been fully depleted and the relief that had been generated originally in the photoresist layer will have been reproduced monolithically in the vitreous substrate.

Sagitta heights exceeding $20\mu$ are currently difficult to reproduce in photoresist processes, and accurate relief features over 30A are largely precluded. Such processes would therefore typically be used in the present invention to master the internal L2 and L3 surfaces in microlenses having pitches under $250\mu$, or for complete arrays having lens pitches under $50\mu$. Internal surfaces for larger lenses would currently be initiated by fluid processes or by single-point diamond turning. The nearly-hemispherical, imbricated array surface in the D1 type array may be produced mechanically, by the dual photoresist method described by Aoyama, or by a hybrid mechanical process such as that detailed in U.S. Pat. No. 5,300,263 (5/94) by Hoopman et al. According to the teaching of Hoopman, an imbricated microlens array may be mastered by 1) grooving a substrate in alternating directions, producing a plurality of pyramids or frusta; 2) electroforming a replica having the reverse contour of the frusta; 3) modifying the upper edges of the partitions between the recesses so that they correspond to a plurality of elliptical arcs rather than a coplanar polygons; 4) filling the resulting recesses with a fluid polymer; and 5) curing the polymer. The negative menisci so formed may be used to master positive microlenses of rectilinear outline.

In general, it will be understood that the process of electroforming metal copies from a master is well-known and commonly practiced in the art, and that the process may be implemented once, or more than once, to produce either a negative or positive mold, as desired, from a given master. It is also generally known that such replication can allow a plurality of durable masters to be reproduced for sequential or concurrent use in high-volume production of optical replication. It should also be understood that certain relief features, such as noncircular cavities, can be produced by inversion of a diamond-turned relief, but cannot be produced as the in the opposite original. By extension, certain structural functions, such as noncircular mating plugs and cavities, can therefore only be provided by conscientious replication of the masters. In the current practice, nickel is the material generally preferred for such electroformed shims, stampers, molds, or dies.

The discrete or continuous production of optical sheet products such as display screens, microlens arrays, corner-cube retroreflectors, and fresnel optics is well known in the trade and in the prior art. Broadly speaking, optical sheeting is now produced by two fundamental processes: thermoplastic molding and radiation-induced polymerization. Initially, optical sheet products were produced by compression molding in a heated platen press. First, a sheet of flat transparent thermoplastic material was fabricated. A platen carrying the inverse of the desired surface is heated above the glass-transition point of the material. The sheet is introduced in the press, the platen closed on the material and then allowed to cool. The finished part is then removed from the press. Most subsequently derived thermoplastic processes may be envisioned as attempts to improve the speed and precision of this process. While new processes are emerging, the predominant historical practice for the high-volume production of cylindrical arrays has been extrusion; the predominant historical practices for the making of spherical arrays have been either injection or compression molding.

In the extrusion process, a thermoplastic polymer is raised above its melting point in a reservoir and extruded in a fluid sheet between two rotating rollers, at least one of which carries the inverse pattern of an optical device. As the fluid comes in contact with the rollers, it is cooled and solidified, and therefore retains the impression of the roller pattern. Because the molten material tends to be somewhat elastic even after it has been separated from the mold, and therefore tends to revert to a less than ideal optical contour, diverse processes have been introduced to improve the precision of the molding process specifically for the production of microoptics. Molten thermoplastic material also tends to shrink and distort during the cooling process. In the interest of increased productivity, numerous improvements and modifications have been introduced in the extrusion process. For example, the low-viscosity, high-temperature moldable material may be limited to the actual sagitta heights of the features being formed. This bulk of the array is provided by the coextrusion of a more viscous, lower-temperature core. A similar effect may also be obtained by extrusion embossing; in this method, the transparent thermoplastic extrudate is applied in a fluid state to a solid carrier film having a higher melting point than the extrudate. The extrudate is formed by patterned rollers into the desired relief, and then separated from them once the extrudate has cooled to produce a permanent copy of the optical pattern. Thermoformable optical plastics include acrylic (polymethylmethacrylate/PMMA), polycarbonate, polystyrene, polyolefin, polyetherimide, polyvinyl chloride, and cellulose acetate butyrate.

In lens arrays formed according to the invention, an outer sheet having positive-meniscus optical elements is typically be bonded to a second sheet having nominally plano-convex elements. When the low-index between the two component arrays is air, the bonding between the concave side of the positive-meniscus sheet and the convex side of the plano-convex sheet may be achieved by flash-heating the entire surface, or spot-heating the lens interstices, of one or more of the facing surfaces. The surfaces may then be placed in contact and allowed to cool to form a permanent thermoplastic weld. More commonly, the arrays would be bonded using a low-viscosity optical cement, as previously noted.

Preexisting specialized extrusion processes can be adapted for use with the invention. For example, in the practice of fiber extrusion, methods for forming hollow fibers of predetermined internal and external contour are well known. The coextrusion of two thermoplastic materials of differing refractive indices is also well known from the industrial practice of fiber optics production. Cylindrical arrays having internal reservoirs of air or low index material may therefore be formed by analogous processes. For example, a flow of thermoplastic extrudate may be made to pass through and around a spider having a plurality of apertures. The lower-index material, be it air, fluoropolymer, or some other material, may expressed through a plurality of shaped apertures at a metered rate commensurate with the flow-rate of the extrusion.

The sectional profile of the low-index optics may be modified by subsequent process. For example, where the low-index material is air, the voids tend toward a cylindrical shape. The shape may be subsequently modified by calendering the material between smooth rollers to produce a void of flat, elliptical cross-section. The profile of convex outer lenses can then be embossed in the outer surface of the material, deforming the elliptical shape into an approximation of the ideal optical surface. While such practices would be intrinsically less precise than molding, it has been found in the practice of the invention that even a modest approximation of the characteristic optics can provide a significant improvement in optical resolution.

It has been found in the practice injection molding that the process is limited in the thinness of the wall that can be practically produced. If the injection is not made at a sufficiently high temperature, premature cooling of the optical material can produce blockage in the mold. Local variations in mold pressure, which may not obstruct the injection, can nevertheless produce birefringence and abrupt variations in refraction. The variations in refraction can act as mirrors and can disrupt the optical function of the device. These effects are most likely to occur in high aspect-ratio, i.e., thin-walled, injections. Because optical discs such as CDs and DVDs are formed of such injections, modified injection processes have been developed in order to produce maximum optical accuracy in the least time. For example, in the variation known as injection-coining, the two halves of the mold are briefly blown apart by the ejection of molten plastic into the mold. Permitting the mold to separate reduces local mold pressures and allows the injected material to be carried deep in the mold. The mold is then closed under pressure until the molten material has solidified. The part is then ejected and the process repeated. This process produces thin, highly conformal microoptical parts at high production rates and therefore can be adapted to the production of microlens arrays.

The radiation-induced polymerization of curable materials represents the second major class of production microoptics. Originally used in optics to adhere glass optical elements, this process has more recently been used to fabricate large recording discs, projection screens, retroreflectors and other substantially flat optical devices of relatively large area. Resins which have been made suitable for radiation curing have included acrylates, methacrylates, urethane acrylates, polyester acrylates, epoxy acrylates, epoxies and esters. Examples include NOA-61, NOA-63, and NOA-65 (NORLAND); UV-1003 (SONY CHEMICAL), 3Bond 3001, AVR-100 and TB-3003 (3BOND), Hercules UV (HERCULES), Photoglaze UV (LORD), and SOMOS 3100 (DSMSOMOS).

The resins typically include a catalyst or initiator that induces formation of polymer chains upon exposure to actinic radiation such as UV light. UV light may be produced by fluorescent or incandescent curing lamps, or by a scanned UV Ar+, or UV HeCd laser. Resins such as the Somos 3100 attain high photocuring speeds by absorption of nearly 100% of the produced radiation within a predetermined finite depth. The highly local absorption also prevents the propagation of actinic radiation to non-targeted areas. Somos acrylate resin is suitable for the formation of layers having specifically targeted thicknesses; the Somos 3100 series produces a cured layer between $75\mu$ and $400\mu$ in thickness, which is highly coincident with the scale of common anticipated embodiments of the invention. Threshold exposure rates depend on the source and the associated polymer formulation. Somos 3100 may be cured to depth of $254\mu$ (10 mils) by an exposure from a UV HeCd laser of 15 mj/cm$^2$. Somos 3110 may be cured to the same depth by an exposure from a UV Ar+ laser of 18 mj/cm$^2$. Absolute part thicknesses can be doubled by making both molds of transparent material and effecting the cure from both sides of the mold. Post-cure of the parts may be obtained by longer-term exposure to UV by banks of fluorescent UV lamps.

As oxygen inhibits radiation-induced polymerization, the reaction is commonly induced in and oxygen-depleted environment; this may be obtained by the physical exclusion of air from the mold, by a reduction of the local atmospheric pressure, by the exposure of the material to nitrogen, or by a combination of these processes. A polymer precursor will typically be retained in a degassed vessel as long as possible to promote rapid polymerization. The fluid material may then be introduced onto the mold surface by a hose or applicator, and leveled by a blade. The two halves of the mold may then be brought together and exposed to UV light.

At least one of the molds must be transparent to the actinic radiation, and will commonly be composed of UV-transparent polymer. Advantages of radiation-curing processes include the typically low viscosity of the polymeric fluid, its 100% solids content, and its minimal thermal deformation. The reproduced part therefore will often display a higher conformity to the mold geometry than a thermoformed part. Micron- or submicron-scale features such as diffractive zone-plates and conic antireflective microstructures may be more accurately reproduced.

While, in the preferred embodiment of the invention, the constituent arrays are fabricated independently and then subsequently bonded, it is recognized that certain applications, such as those in which an array is fabricated in situ on an electronic display component, might require the development of the array system in progressive layers rather than discrete assemblies. Typically, UV-curable resins of differing refractive indices would be used. A layer consisting of a fluid precursor to the higher-index polymer would first be applied to the electronic surface. A first UV-transparent die, formed so as to have an inverse relief of the L3 optics, would be engaged with this fluid layer and cured by the application of actinic radiation. A lower-index polymer precursor would then be flowed onto the die or onto the existing optical relief, and a second die, this time having the inverse geometry of the L2 structures, applied, and the material cured with the second die in place. A third layer of fluid would then be applied, this time consisting again of the higher-index material. The third and final UV-transparent die would be formed having the inverse relief of the L1 microlenses. Upon curing, the array so formed would have the corrected optics of the invention.

The application of the invention is not intended to be restricted to any of the above-described fabrication practices, but instead is foreseen to be implemented by any currently known, envisioned or subsequently developed production process.

A person of ordinary skill in the art will understand that applications of aspects of this invention are not limited to the recited embodiments. Further embodiment include, but are not limited to, the embodiments described below. Color filtering may be introduced by dyes dissipated throughout the array material, or locally by printing, dye sublimation transfer, or droplet deposition. For example, differing dyes may be introduced into separate reservoirs of the fluid UV-curing fluoropolymer. Metered amounts can then be delivered in a RGB or CMY pattern to the concave second surface before the arrays are bonded, creating an internal mosaic filter for color imaging applications.

A high-resolution monochromatic image may be obtained, and color subsequently interpolated from a single discrete polychromatic image. In general, the optical geometry may be used in monochromatic, quasimonochromatic, or polychromatic systems, and may include radiation from beyond the visible spectrum.

Image processing can include retrospective focal correction, color and contrast adjustments, compression and decompression, edge enhancement, pseudoscopy rectification, microimage displacement based on a presumed viewing distance, view interpolation, view integration and synthesis, or transposition of the apparent location or orientation of subjects.

Spectral bandwidth is also a design consideration when separate color channels are used in the reproduction process. Color photographic images may often be produced at higher resolutions by successive exposure light of differing wavelengths through grayscale spatial light modulators. The succession may be temporally or spatially sequential. In either case, as the optimal focal length is somewhat wavelength-dependent, some benefit can be obtained by matching the focal plane to the target band. In a spatial reproduction sequence, for example a system using three separate arrays equipped with LCD modulators and discrete red, green, and blue light sources, optimization may be obtained by providing relatively a greater overall thickness to arrays that transmit the relatively longer wavelengths. Alternately, a single array and modulator can be employed using time-sequential RGB illumination, and the focal situation modified in situ. This adaptation can be made by, for example, mechanically shifting the focal plane through the use of a piezoelectric actuator and an optical coupling fluid, or by a varifocal effect introduced in an index-variable liquid crystal planar reservoir under the influence of an electrical field. For ease of maintenance and extended durability, master arrays would commonly be formed of glass rather than plastic.

Arrays used as masters for face-to-face reproduction are generally optimized by restricted apertures to produce spots at, or just under, the Rayleigh limit. Except at fine lens pitches, this would permit the use of aperture plates to improve accurate alignment and image transfer. The aperture plate may be a discrete device installed between the arrays during reproduction, but would more often be permanently integrated into the master array. Methods of forming an aperture plate include perforation, etching, boring, molding, tampo printing, or dye transfer.

Regions not part of the optical corridor are generally assigned a secondary use, such as light absorption, diffusion, or structural support. In the systems shown, any portion of any internal aperture that is not accessed by rays in the active optical pathways may be electively and usefully abbreviated. For example, rays converged by the aperture provided by a hexagonal first-surface aperture, and intersecting the second refractive surface sweep out a delimitation on the second surface that defines a irregular rounded polygon having, having, due to its rotational asymmetry, a slight third-dimensional elevation. The intersection of the same rays set with the third surface identifies a similar but slightly larger clear aperture. In some manufacturing processes where nonrotational surfaces are allowed, such as reactive ion etching, these irregular geometries may electively be implemented to optimize the transmission characteristics of the interstices and the array's mechanical structure. A similar benefit may often be obtained using a best-fit elliptical outline.

A display may include two or more planes of graphic material at differing focal lengths, so that an array can produce a focal output in some areas or at some angles, and an afocal output at others. This focal shift can produce a varied focal condition that activates the accommodative focusing ability of the eye. The focal planes may be in discrete layers, or in a monolayer that has been selectively displaced.

In further anticipated embodiments, internal lands in lens arrays may be made slightly concave, rather than flat, so that the region is not starved of the cement or light-blocking material during pick-up from a roller applicator. In the case of the fluoropolymer-filled lenses, volumetric calculations may be performed and the surface geometry derived, allowing an applicator in contact with the raised lands or with the lens vertices to deposit metered volumes of fluid material, so that no extraneous material is expressed when the arrays are brought in contact.

It is well known that an optical correction may invariably be distributed over a larger number of surfaces. Arrays may therefore include divided layers of lenses that mimic the effect of the illustrated designs, without departing with the invention's envisioned scope. The two constituent arrays need not be monolithic to conform to the invention. For example, it is common practice to fabricate microlenses in thermosetting epoxies or acrylates upon planar substrates such as prefabricated plastic sheets or glass windows. The degree of freedom allowed by differing indices my be implemented without departing from the invention's intended scope.

Lithographic processes do not require all lenses in an array to be identical. Locally varied, idiosyncratically formed lenses might be used, for example, to extend the viewing field of a dimensional image by altering the optics of the lenses in a progressive manner about a given locus in order to target a presumed viewing position. In a spherical lens system, the center point of the image would typically include the only lens system that was showed true rotational symmetry.

Microlenses may include one or more conformal antireflective, antiabrasion, or heat-resistant coatings. An array may be made so as to be displaceable in a plane parallel the graphic material, so that the image may be manually or automatically scrolled to provide an animated appearance. The graphic variability may be used for naturalistic, textural, decorative or ornamental devices or surfaces as well as imagery. Views may be distinguished as separate pages of text.

In addition to their embodiments as planar graphic materials, the imaging arrays may be mounted upon or within a functional or ornamental device such as a watch, watchband, bracelet, brooch, pendant, purse, belt, compact, writing instrument, drafting tool, lunchbox, restaurant menu, placemat, mousepad, license plate, lampshade, nightlight, optical data disc, drinking cup, credit card, identification card, gamepiece, toy, sticker, clothing accessory, or souvenir. Lens arrays may be formed as concave, convex, or complex surfaces; angular image data and microimage tiles may be adapted according to the precepts herein described.

Digital source images may include translated computational holograms. The image plane may be a hologram or include holographic regions. Visible data may be derived from invisible processes, as in radar, sonography, X-rays, electron microscopy, nucleomagnetic resonance (NMR), PET or CT scanning, or magnetometry. Disciplines such as statistics, industrial diagnostics, engineering optimizations, product design, cartography, seismography, meteorology, remote sensing, astronomy, medical imaging, and molecular modeling may generate data which is most readily appraised as a three-dimensional or animated representation. By enabling only on-axis viewing, arrays using the recited equiangular TIR geometry may be employed as privacy screens.

In general, it should be understood that it is the intent of the invention that its various embodiments might be implemented independently or collectively without departing from its intended scope and spirit. It is also understood that, because of the dual roles that are assigned to some surfaces, e.g., refraction/reflection, refraction/diffraction, diffraction/antireflection, diffusion/adhesion, diffusion/alignment, alignment/fluid pickup, that various factors will be intermodulated to produce the best empirical result, and that some attributes will necessarily depart from their ideal individuated embodiments. It should be further understood that it is the intent of the invention that the microlenses herein described be incorporated broadly as components in larger systems. The core optical geometry might also be applied to discrete devices as well as lens arrays, and may generally be used as a compact means to provide a high degree of focus to any planar image field, or, conversely, to provide precise, efficient collimation or convergence from a point source.

In the case of the field-limited arrays, lands may be made slightly concave rather than flat so that the region is not starved of the fluid light-blocking material during pick-up from an applicator. In the case of the fluoropolymer-filled lenses, volumetric calculations may be performed and the surface geometry derived, so that an applicator in contact with the raised lands or with the lens veritices will deposit a metered volume of fluid material so that no extraneous material is expressed when the arrays are brought in contact.

An array of the microlenses described herein may be aligned coaxially with an array of radial graded-index lenses of equal lenticular pitch, each radial graded-index lens having an axial pitch of 0.50, to provide a direct orthoscopic signal output in analog pickup devices such as integral-3D television cameras. The specified systems may be modified to include additional optical surfaces, for example, to increase the viewing field or to reduce distortion in the image. Microlenses may include conformal antireflective, antiabrasion, or heat-resistant coatings. An array may be made so as to be displaceable in a plane parallel the graphic material, so that the image may be manually or automatically scrolled to provide an animated appearance. The graphic variability may be used for decorative or ornamental devices or surfaces as well as imagery. Views may include pages of text. In addition to their embodiments as planar graphic materials, the imaging arrays may be mounted upon or within a functional or ornamental device such as a watch, watchband, bracelet, brooch, pendant, purse, belt, compact, writing instrument, drafting tool, lunchbox, restaurant menu, placemat, mousepad, license plate, lampshade, nightlight, optical data disc, drinking cup, credit card, identification card, gamepiece, toy, sticker, clothing accessory, or souvenir. Lens arrays may be formed on concave, convex, or complex surfaces; angular image data may be devised accordingly.

Arrays may also include diverse color-filtering structures; for example, droplets of tinted low-index polymer may be locally deposited in place of the continuous coat of fluid transparent fluoropolymer to produce a mosaic color-separation filter within the array. Alternately, diffraction gratings in the vicinity of the focal plane may be used to separate wavelengths. Temporally or spatially separate images may be obtained via wavelength-selective lenses or arrays, either to increase acuity or derive a polychromatic record from monochromatic detectors, or both. A high-resolution monochromatic image may be obtained, and color subsequently interpolated from discrete polychromatic image. In general, the optical geometry may be used in monochromatic, quasimonochromatic, or polychromatic systems, and may include radiation from beyond the visible spectrum.

Digital source images may include translated computational holograms. Holographic virtual images in general may be captured, and electively reproduced, by lens arrays formed according to the invention. Plural exposures of an emulsion located on the rear of a lens array may be made by such holographic virtual images through the array, as, for example, when natural color rendition requires the successive use of coherent sources of differing wavelengths. Visible data may be derived from invisible processes, as in radar, sonography, X-rays, electron microscopy, nucleomagnetic resonance (NMR), PET or CT scanning, or magnetometry. Disciplines such as statistics, industrial diagnostics, engineering optimizations, product design, cartography, seismography, meteorology, remote sensing, astronomy, medical imaging, and molecular modeling may generate data which is most readily appraised as a three-dimensional or animated representation.

While the microlenses described are particularly adapted to three-dimensional imaging using lens arrays, microlenses may also be used autonomously or in various combinations for purposes other than three-dimensional imaging. Reimaging, as in scanning in duplicating devices, often requires that graphic attributes of an original be reproduced to a second surface, but in optical cells in which the orientation of the reimaged data is inverted. Two linear arrays of equal pitch, placed in a lens-to-lens correspondence, could be employed to reiterate an original planar document to a second planar surface with little loss of graphic data. The focal field of a microlens may be equipped with an intermittent, rather than continuous, field of detectors; such an arrangement might be used when a predetermined resolution was sought in an imaging device, or in industrial, photometric, or astronomical displacement detectors or wavefront correctors. The lenses can produce polychromatic structured light patterns that can capture both the color and the relief of a scanned object. By enabling only on-axis viewing, the arrays may be employed as a privacy screen. The lens may also be used within an optical data system to provide multichannel pickup capabilities from a storage disc, or in fiberoptic or optoelectronic systems to separate or multiplex multiple channels.

The wide acceptance angle, the minimal number of surfaces used to obtain a flat image field, and the field-limiting aspects of the invention are adaptable to highly diverse optical applications. The scope of the invention should not therefore be construed to be limited to the description of the specific applications specified in this document, but should instead be understood to be defined by the broadest claims permitted by the substance of the information herein recited.

The scope of the invention should not therefore be construed to be limited to the description of the specific applications specified in this document, but should instead be understood to be defined by the broadest understanding permitted by the substance of the information recited herein, and by the fullest legal scope of the appended claims, in which.

What is claimed is:

1. A reproduction system comprising:
    a first array of lenses each having an optical axis, the first array of lenses having an image plane; and
    a second array of lenses each having an optical axis, the second array of lenses having an image plane,
    wherein the first and second arrays are optically aligned such that microimages tiled on the first-array image plane, when projected into the second array, will tile on the second-array image plane.

2. The reproduction system of claim 1 wherein the optical axis of each lens of the first array is aligned with the optical axis of a corresponding lens of the second array.

3. The reproduction system of claim 1 further comprising a plurality of microimages associated with the first-array image plane, the lens arrays, when viewed through the second-array image plane, facilitating combined presentation of all of the microimages to create a three-dimensional view of a single image.

4. The reproduction system of claim 1 wherein total internal reflection restricts angular emission during reproduction of the microimages.

5. The reproduction system of claim 1 wherein the lens elements and the microimages are tiled in different patterns.

6. The lens array of claim 1 wherein the lens elements are tiled hexagonally.

7. The reproduction system of claim 6 wherein the lenses are arranged in a hexagonal layout aligned with an orthogonal grid on the image plane.

8. The reproduction system of claimed 7 wherein each lens has a center aligned with a hexagon of a hexagonal lattice, each hexagon being associated with a square region on the image plane.

9. The reproduction system of claim 1 wherein the microimages are tiled irregularly with a bias to a horizontal axis.

10. The reproduction system of claim 1 wherein the microimages are tiled in an irregular hexagonal pattern.

11. The reproduction system of claim 1 wherein the microimages are tiled in a 2:1 rectangular pattern.

12. The reproduction system of claim 1 wherein the lens elements have associated image center points, the microimages being displaced from the center points of the lens elements.

13. The reproduction system of claim 12 wherein the microimages are radially shifted inwardly relative to the image center points.

14. The reproduction system of claim 1 wherein the microimages contain null zones not enabled to capture or reproduce light.

15. The reproduction system of claim 1 wherein the microimages define a time-distorted image set.

16. The reproduction system of claim 1 wherein the microimages define at least two planes of graphic material at differing focal lengths.

17. The reproduction system of claim 16 wherein the microimages are displaceable from the first array, permitting relative motion therebetween.

18. The reproduction system of claim 17 wherein the lens elements cause the microimages to undergo an optical magnification of about 1.25 during reproduction.

19. The reproduction system of claim 1 wherein the first and second arrays are mechanically engageable, engagement of the first and second arrays enforcing optical alignment therebetween.

* * * * *